United States Patent
Nam et al.

(10) Patent No.: US 9,851,912 B2
(45) Date of Patent: Dec. 26, 2017

(54) MEMORY DEVICE, MEMORY SYSTEM AND METHOD OF OPERATING MEMORY DEVICE

(71) Applicants: Sang-Wan Nam, Hwaseong-si (KR);
Doo-Hyun Kim, Ansan-si (KR);
Dae-Seok Byeon, Seongnam-si (KR);
Chi-Weon Yoon, Seoul (KR)

(72) Inventors: Sang-Wan Nam, Hwaseong-si (KR);
Doo-Hyun Kim, Ansan-si (KR);
Dae-Seok Byeon, Seongnam-si (KR);
Chi-Weon Yoon, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/443,647

(22) Filed: Feb. 27, 2017

(65) Prior Publication Data
US 2017/0168742 A1    Jun. 15, 2017

Related U.S. Application Data

(63) Continuation of application No. 15/357,291, filed on Nov. 21, 2016, which is a continuation of application
(Continued)

(30) Foreign Application Priority Data

Jul. 2, 2015    (KR) .................. 10-2015-0094938

(51) Int. Cl.
*G11C 11/34* (2006.01)
*G11C 16/04* (2006.01)
*G06F 3/06* (2006.01)

(52) U.S. Cl.
CPC ............ *G06F 3/0619* (2013.01); *G06F 3/061* (2013.01); *G06F 3/0644* (2013.01); *G06F 3/0655* (2013.01); *G06F 3/0688* (2013.01)

(58) Field of Classification Search
CPC ...... G06F 3/0619; G06F 3/061; G06F 3/0644; G06F 3/0655; G06F 3/0688
See application file for complete search history.

(56) References Cited

U.S. PATENT DOCUMENTS 9,514,827 B1    12/2016  Nam et al.
2013/0336061 A1*  12/2013  Kim .................. G11C 16/0483
                                                      365/185.11
(Continued)

OTHER PUBLICATIONS

Office Action dated Mar. 3, 2017 in Co-Pending U.S. Appl. No. 15/357,291.
(Continued)

*Primary Examiner* — Toan Le
(74) *Attorney, Agent, or Firm* — F. Chau & Associates, LLC

(57) ABSTRACT

A memory device is provided as follows. A memory cell region includes a plurality of blocks, each block including a plurality of NAND strings. A control logic divides the plurality of blocks into a plurality of block regions based on a smaller distance of a first distance with respect to a first edge of the memory cell region and a second distance with respect to a second edge of the memory cell region and controls an operation performed on the memory cell region using a plurality of bias sets of operation parameters for the operation. Each bias set is associated with one of the block regions.

26 Claims, 81 Drawing Sheets

Related U.S. Application Data

No. 15/018,925, filed on Feb. 9, 2016, now Pat. No. 9,514,827.

(56) References Cited

U.S. PATENT DOCUMENTS

| | | | |
|---|---|---|---|
| 2014/0160846 A1* | 6/2014 | Lee | G11C 16/24 365/185.11 |
| 2016/0035429 A1* | 2/2016 | Kim | G11C 16/26 365/185.11 |
| 2016/0180946 A1 | 6/2016 | Hong | |

OTHER PUBLICATIONS

Co-Pending U.S. Appl. No. 15/357,291, filed Nov. 21, 2016 (Not Published).

* cited by examiner

FIG. 16

REG_TABLE1

| BLOCK | BLOCK REGION |
|---|---|
| BLK1 | REG1 |
| BLK2 | |
| BLK3 | REG2 |
| BLK4 | |
| ... | ... |
| BLK5 | REG_N |
| BLK6 | |
| ... | ... |
| BLK7 | REG2 |
| BLK8 | |
| BLK9 | REG1 |
| BLK10 | |

FIG. 18

REG_TABLE2

| BLOCK | BLOCK REGION |
|---|---|
| BLK1 | REG1 |
| BLK2 | |
| BLK3 | REG2 |
| BLK4 | |
| ... | ... |
| BLK7 | REG_M-1 |
| BLK8 | |
| BLK9 | REG_M |
| BLK10 | |

FIG. 20

REG_TABLE3

| BLOCK | BLOCK REGION |
|---|---|
| BLK1 | REG1 |
| BLK2 | |
| BLK3 | |
| BLK4 | REG2 |
| ... | ... |
| BLK5 | REG_L |
| BLK6 | |
| ... | ... |
| BLK7 | REG3 |
| BLK8 | REG2 |
| BLK9 | |
| BLK10 | |

FIG. 23

REG_TABLE4

| BLOCK | BLOCK REGION | BLOCK | BLOCK REGION |
|---|---|---|---|
| BLKb1 | REG1 | BLKu1 | REG1 |
| BLKb2 | | BLKu2 | |
| BLKb3 | REG2 | BLKu3 | REG2 |
| BLKb4 | | BLKu4 | |
| ... | ... | ... | ... |
| BLKb7 | REG_M-1 | BLKu7 | REG_M-1 |
| BLKb8 | | BLKu8 | |
| BLKb9 | REG_M | BLKu9 | REG_M |
| BLKb10 | | BLKu10 | |

FIG. 25

REG_TABLE5

| BLOCK | BLOCK REGION | BLOCK | BLOCK REGION |
|---|---|---|---|
| BLKb1 | REG1 | BLKu1 | REG1 |
| BLKb2 | | BLKu2 | |
| BLKb3 | REG2 | BLKu3 | |
| BLKb4 | | BLKu4 | REG2 |
| ... | ... | ... | ... |
| BLKb7 | REG_M-1 | BLKu7 | REG_L-1 |
| BLKb8 | | BLKu8 | REG_L |
| BLKb9 | REG_M | BLKu9 | |
| BLKb10 | | BLKu10 | |

FIG. 28

REG_TABLE6

| | PROGRAM | ERASE | READ | READ RECOVERY |
|---|---|---|---|---|
| BLK1 | REG1 | REG1 | REG1 | REG1 |
| BLK2 | | | | |
| BLK3 | REG2 | REG2 | | |
| BLK4 | | | | |
| BLK5 | REG3 | | REG2 | REG2 |
| BLK6 | | | | |
| BLK7 | REG4 | | REG3 | REG3 |
| BLK8 | | | | |
| BLK9 | REG5 | REG3 | | |
| BLK10 | | | | |

FIG. 29

PAR_TABLE1

|  | REG1 | REG_N |
|---|---|---|
| WL_sel | Vpgm1 | Vpgm2 (>Vpgm1) |
| WL_unsel | Vinhp1 | Vinhp2 (>Vinhp1) |
| PGM VERIFY VOLTAGE | Vpvrf1 | Vpvrf2 (> Vpvrf1) |
| PGM DURATION | Tpgm1 | Tpgm2 (> Tpgm1) |
| PGM DURATION TIME INCREMENT OF EACH LOOP | Tinc1 | Tinc2 (> Tinc1) |
| PGM VOLTAGE INCREMENT OF EACH LOOP | Vinc1 | Vinc2 (> Vinc1) |
| verify skip loop | Ls1 | Ls2 (> Ls1) |
| MAXIMUM LOOP | Lm1 | Lm2 (> Lm1) |

OPERATION PARAMETERS

BIAS SET

FIG. 36

PAR_TABLE2

|  | REG1 | REG_N |
|---|---|---|
| BL | Float | Float |
| SSL | Float | Float |
| WL | Vwe1 | Vwe2 (< Vwe1) |
| GSL | Float | Float |
| SUB | Vers1 | Vers2 (> Vers1) |
| ERASE DURATION | Ters1 | Ters2 (> Ters1) |
| ERASE VERIFY VOLTAGE | Vevrf1 | Vevrf2 (> Vevrf1) |

FIG. 40

PAR_TABLE3

|  | REG1 | REG_N |
|---|---|---|
| SSL | Vcc | Vcc |
| WL_sel | Vrd1 | Vrd2 (> Vrd1) |
| WL_unsel | Vinhr1 | Vinhr2 (> Vinhr1) |
| GSL | Vcc | Vcc |
| SUB | Vss | Vss |

FIG. 47

PAR_TABLE4

|  | REFERENCE BIAS CONDITION | FIRST BIAS CONDITION | | SECOND BIAS CONDITION | |
|---|---|---|---|---|---|
|  | REG1 및 REG_N | REG1 | REG_N | REG1 | REG_N |
| WL_sel | Vpgm | Vpgm1 | Vpgm2 (>Vpgm1) | Vpgm1' (<Vpgm1) | Vpgm2 |
| WL_unsel | Vinhp | Vinhp1 | Vinhp2 (>Vinhp1) | Vinhp1' (<Vinhp1) | Vinhp2 |
| PGM VERIFY VOLTAGE | Vpvrf | Vpvrf1 | Vpvrf2 (>Vpvrf1) | Vpvrf1' (>Vpvrf1) | Vpvrf2 |
| PGM DURATION | Tpgm | Tpgm1 | Tpgm2 (>Tpgm1) | Tpgm1' (<Tpgm1) | Tpgm2 |
| PGM DURATION TIME INCREMENT OF EACH LOOP | Tinc | Tinc1 | Tinc2 (>Tinc1) | Tinc1' (<Tinc1) | Tinc2 |
| PGM VOLTAGE INCREMENT OF EACH LOOP | Vinc | Vinc1 | Vinc2 (>Vinc1) | Vinc1' (<Vinc1) | Vinc2 |
| verify skip loop | Ls | Ls1 | Ls2 (>Ls1) | Ls1' (≤Ls1) | Ls2 |
| MAXIMUM LOOP | Lm | Lm1 | Lm2 (>Lm1) | Lm1' (≤Lm1) | Lm2 |

FIG. 48

PAR_TABLE5

|  | REFERENCE BIAS CONDITION | FIRST BIAS CONDITION | | SECOND BIAS CONDITION | |
| --- | --- | --- | --- | --- | --- |
|  | REG1 및 REG_N | REG1 | REG_N | REG1 | REG_N |
| BL | Float | Float | Float | Float | Float |
| SSL | Float | Float | Float | Float | Float |
| WL | Vwe | Vwe1 | Vwe2 (< Vwe1) | Vwe1' (< Vwe1) | Vwe2 |
| GSL | Float | Float | Float | Float | Float |
| SUB | Vers | Vers1 | Vers2 (> Vers1) | Vers1' (> Vers1) | Vers2 |
| ERASE DURATION | Ters | Ters1 | Ters2 (> Ters1) | Ters1' (> Ters1) | Ters2 |
| ERASE VERIFY VOLTAGE | Vevrf | Vevrf1 | Vevrf2 (>Vevrf1) | Vevrf1' (>Vevrf1) | Vevrf2 |

FIG. 49

PAR_TABLE6

| | REFERENCE BIAS CONDITION | FIRST BIAS CONDITION | | SECOND BIAS CONDITION | |
|---|---|---|---|---|---|
| | REG1 및 REG_N | REG1 | REG_N | REG1 | REG_N |
| SSL | Vcc | Vcc | Vcc | Vcc | Vcc |
| WL_sel | Vrd | Vrd1 | Vrd2 (> Vrd1) | Vrd1' (> Vrd1) | Vrd2 |
| WL_unsel | Vinhr | Vinhr1 | Vinhr2 (> Vinhr1) | Vinhr1' (> Vinhr1) | Vinhr2 |
| GSL | Vcc | Vcc | Vcc | Vcc | Vcc |
| SUB | Vss | Vss | Vss | Vss | Vss |

FIG. 52
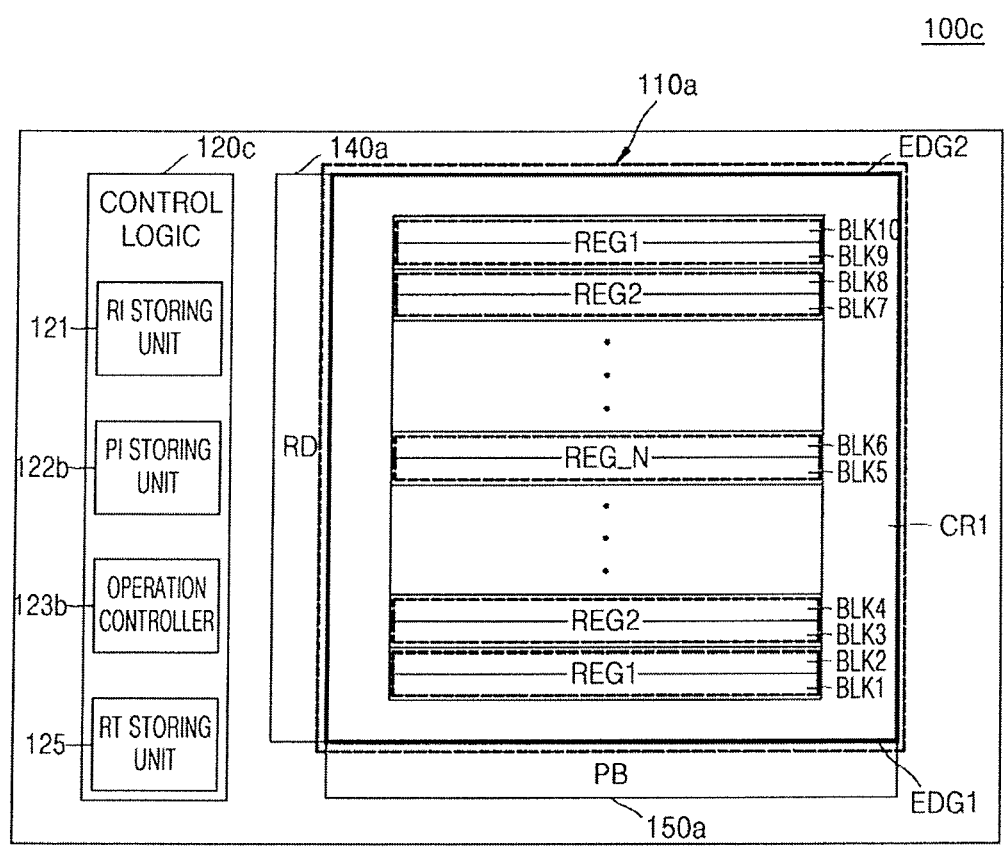
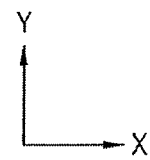

FIG. 59

ALG_TABLE1

|  | REG1 | REG_N |
|---|---|---|
| PRE PROGRAM | O | X |
| POST PROGRAM | O | X |
| SUB-BLOCK | X | O |
| COUNT PULSE PROGRAM | O | X |
| SOFT PROGRAM | O | X |
| OFF STRING SEARCH | O | X |
| RETENTION PDT | O | X |
| ENDURANCE PDT | X | O |

FIG. 62

ALG_TABLE2

|  | FIRST ALGORITHM TABLE | | SECOND ALGORITHM TABLE | |
| --- | --- | --- | --- | --- |
|  | REG1 | REG_N | REG1 | REG_N |
| PRE PROGRAM | O | X | O | O |
| POST PROGRAM | O | X | O | O |
| SUB-BLOCK | X | O | X | O |
| COUNT PULSE PROGRAM | O | X | O | O |
| SOFT PROGRAM | O | X | O | O |
| OFF STRING SEARCH | O | X | O | O |
| RETENTION PDT | O | X | O | X |
| ENDURANCE PDT | X | O | X | O |

MEMORY DEVICE, MEMORY SYSTEM AND METHOD OF OPERATING MEMORY DEVICE

CROSS-REFERENCE TO RELATED APPLICATION

This application is a continuation of U.S. application Ser. No. 15/357,291, which is a continuation of U.S. application Ser. No. 15/018,925 filed on Feb. 9, 2016, which claims priority under 35 U.S.C. 119 to Korean Patent Application No. 10-2015-0094938, filed on Jul. 2, 2015, in the Korean Intellectual Property Office, the disclosure of which is incorporated by reference herein in its entirety.

TECHNICAL FIELD

The present inventive concept relates to a memory device and a memory system including the memory device.

DISCUSSION OF RELATED ART

A memory device is used to store data, and is classified as a volatile memory device and a non-volatile memory device. A flash memory device is an example of the non-volatile memory device and may be used in portable phones, digital cameras, portable digital assistants (PDA), mobile computing devices, fixed computing devices, and other devices.

SUMMARY

According to an exemplary embodiment of the present inventive concept, a memory device is provided as follows. A memory cell region includes a plurality of blocks, each block including a plurality of NAND strings. A control logic divides the plurality of blocks into a plurality of block regions based on a smaller distance of a first distance with respect to a first edge of the memory cell region and a second distance with respect to a second edge of the memory cell region and controls an operation performed on the memory cell region using a plurality of bias sets of operation parameters for the operation. Each bias set is associated with one of the block regions.

According to an exemplary embodiment of the present inventive concept, a memory system is provided as follows. A memory device includes a memory cell region including a plurality of blocks, each block including a plurality of NAND strings. A memory controller divides the plurality of blocks into a plurality of block regions based on a distance with respect to a smaller distance with respect to a first edge and a second edge of the memory cell region, determines a plurality of bias sets of operation parameters, and transmits the operation parameters to the memory device. Each bias set is associated with one of the block regions.

A method of operating a memory device is provided as follows. The memory device has a memory cell region including a plurality of blocks, each block including a plurality of channel holes in which a plurality of NAND strings are formed. The blocks are set to a plurality of block regions. A plurality of bias sets is applied to the memory cell region to perform an operation. A first bias set of the bias sets is applied to a first block region of the block regions, and a second bias set of the bias sets is applied to a second block region of the block regions. The first block region includes at least one block positioned within a first distance from an edge of the memory cell region. The second block region includes at least one block positioned between the first distance and a second distance from the edge of the memory cell region, the second distance being greater than the first distance. The second bias set is different from the first bias set.

BRIEF DESCRIPTION OF DRAWINGS

These and other features of the inventive concept will become more apparent by describing in detail exemplary embodiments thereof with reference to the accompanying drawings of which:

FIG. 16 is a table showing an example of block region information stored in a block region storing unit of FIG. 15;

FIG. 17 is a flowchart of a method of operating a memory device according to an exemplary embodiment of the present inventive concept;

FIG. 18 is a table showing an example of block region information stored in a block region storing unit of FIG. 17;

FIG. 20 is a table showing an example of block region information stored in a block region storing unit of FIG. 19;

FIG. 23 is a table showing an example of block region information stored in a block region storing unit of FIG. 21;

FIG. 25 is a table showing an example of block region information stored in a block region storing unit of FIG. 24;

FIG. 28 is a table showing an example of block region information stored in a block region storing unit according to an exemplary embodiment of the present inventive concept;

FIG. 29 is a table showing bias conditions of a program operation according to an exemplary embodiment of the present inventive concept;

FIG. 36 is a table showing bias conditions of an erase operation according to an exemplary embodiment of the present inventive concept;

FIG. 40 is a table showing bias conditions of a read operation according to an exemplary embodiment of the present inventive concept;

FIG. 47 is a table showing bias conditions of a program operation according to an exemplary embodiment of the present inventive concept;

FIG. 48 is a table showing bias conditions of an erase operation according to an exemplary embodiment of the present inventive concept;

FIG. 49 is a table showing bias conditions of an erase operation according to an exemplary embodiment of the present inventive concept;

FIG. 52 illustrates a memory device according to an exemplary embodiment of the present inventive concept;

FIG. 59 illustrates an example of a table stored in an algorithm table storing unit of FIG. 58;

FIG. 62 illustrates an example of a table stored in the algorithm table storing unit of FIG. 58;

DETAILED DESCRIPTION OF EXEMPLARY EMBODIMENTS

Figure 1:
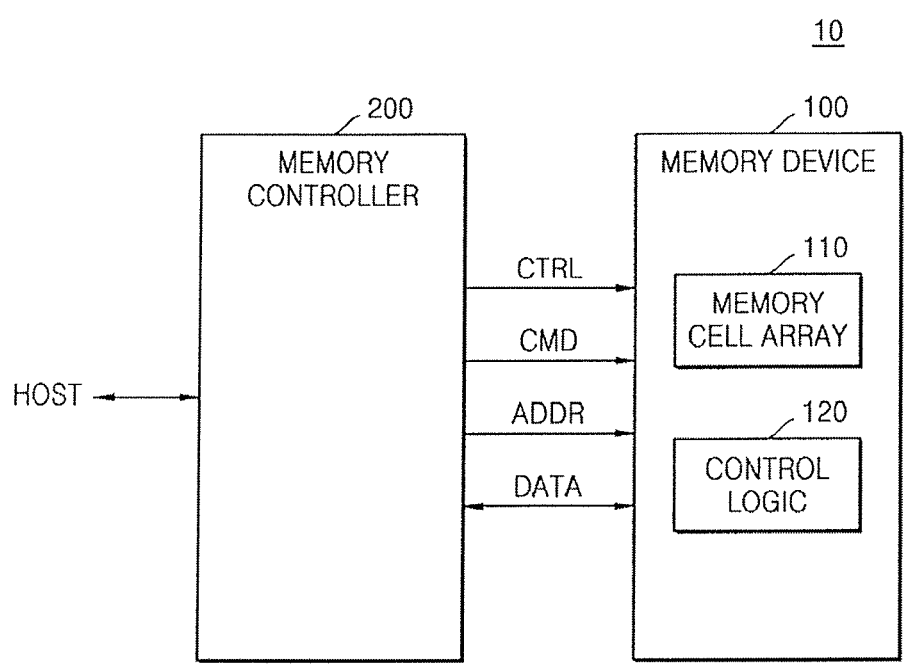
FIG. 1 is a schematic block diagram illustrating a memory system according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIG. 1 is a schematic block diagram of a memory system 10 according to an exemplary embodiment of the present inventive concept.

Referring to FIG. 1, the memory system 10 may include a memory device 100 and a memory controller 200, and the memory device 100 may include a memory cell array 110 and a control logic 120.

The memory cell array 110 may include a plurality of memory cells, which may be, for example, flash memory cells. Hereinafter, for the convenience of description, it is assumed that the memory cells are NAND flash memory cells. However, the present inventive concept is not limited thereto. For example, the plurality of memory cells may be resistive memory cells such as a resistive RAM (RRAM), a phase change RAM (PRAM) or a magnetic RAM (MRAM).

The memory cell array 100 may be a three-dimensional (3D) memory array. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

The 3D memory array includes vertical NAND strings that are vertically oriented such that at least one memory cell is located over another memory cell. In an exemplary embodiment, the memory cell may include a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

The memory cell array 110 may include at least one cell region, and each cell region may include a plurality of blocks. Each block may include a plurality of NAND strings, and each NAND string may include a plurality of memory cells that are vertically stacked on a substrate. In an exemplary embodiment, the plurality of blocks of each cell region may be divided into at least two block regions based on a distance of the blocks with respect to edges of the cell region.

Here, a cell region may be referred to as a MAT or a bank. A cell region may be a unit in terms of the manufacturing process. For example, a cell region may be defined as a well region formed in a substrate. In this case, different cell regions may be formed in different well regions. In an exemplary embodiment, at least one cell regions may be formed in the same well region. The cell region may be referred to as a "memory cell region".

The control logic 120 may control an operation performed on each block region of the memory cell array 110 using bias conditions (which may be referred to as bias sets) respectively corresponding to the at least two block regions. The control logic 120 may control an operation performed on the memory cell array for each block region by using block region information and parameter information. Block region information refers to information about a plurality of block regions each including at least one block. The block region information may be information about block regions corresponding to a plurality of blocks disposed in a cell region. Edges of a cell region may be parallel to an extension direction of a word line. Parameter information may be information about operation parameters indicating bias conditions according to respective block regions.

In response to a write/read request from a host, the memory controller 200 may read data stored in the memory device 100 or may control the memory device 100 to write data to the memory device 100. For example, the memory controller 200 may provide an address ADDR, a command CMD, and a control signal CTRL to the memory device 100 and thus may control a program (or write) operation, a read operation, and an erase operation with respect to the memory device 100. Also, write-target data DATA and read data DATA may be transmitted or received between the memory controller 200 and the memory device 100.

Although not illustrated, the memory controller 200 may include a Random Access Memory (RAM), a processing unit, a host interface, and a memory interface. The RAM may be used as an operation memory of the processing unit. The processing unit may control operations of the memory controller 200. The host interface may include a protocol for exchanging data between the host and the memory controller 200. For example, the memory controller 200 may communicate with an external source (i.e., the host) by using at least one of various interface protocols including USB, MMC, PCI-E, ATA (Advanced Technology Attachment), Serial-ATA, Parallel-ATA, SCSI, ESDI, and Integrated Drive Electronics (IDE).

Figure 2:
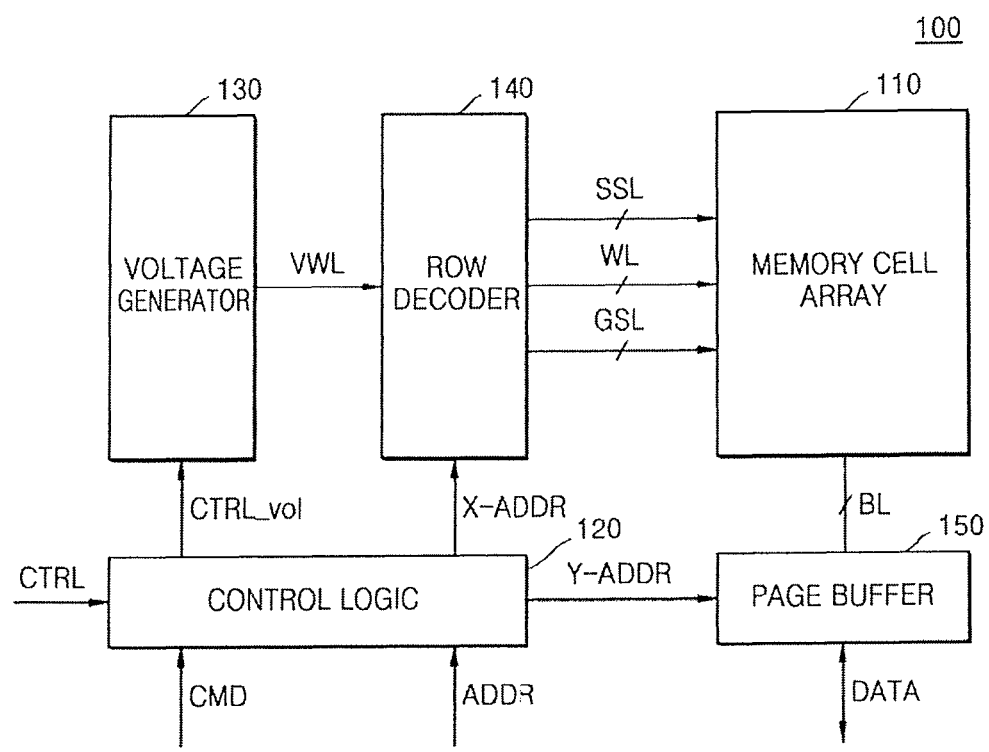
FIG. 2 is a detailed block diagram illustrating a memory device of FIG. 1.

FIG. 2 is a detailed block diagram illustrating the memory device 100 of FIG. 1.

Referring to FIG. 2, the memory device 100 may include a memory cell array 110, a control logic 120, a voltage generator 130, a row decoder 140, and a page buffer 150. Although not illustrated, the memory device 100 may further include a data input/output circuit or an input/output interface.

The memory cell array 110 may include a plurality of memory cells, and may be connected to word lines WL, string selection lines SSL, ground selection lines GSL, and bit lines BL. For example, the memory cell array 110 may be connected to the row decoder 140 via the word lines WL, the string selection lines SSL, and the ground selection lines GSL, and may be connected to the page buffer 150 via the bit lines BL.

The memory cell array 110 may include at least one of a single-level cell block including single-level cells, a multi-level cell block including multi-level cells, and a triple-level cell block including triple level cells. In an exemplary embodiment, all blocks of the memory cell array 110 may be the same level cell blocks. For example, all blocks of the memory cell array 110 may be multi-level cell blocks. In an exemplary embodiment, the blocks may be different level cell blocks. For example, some of the blocks of the memory cell array 110 may be single-level cell blocks, and the other blocks may be multi-level cell blocks or triple-level cell blocks.

The control logic 120 may output various control signals to write data to the memory cell array 110 or read data from the memory cell array 110 based on a command CMD, an address ADDR, and a control signal CTRL received from the memory controller 200. Accordingly, the control logic 120 may control various operations in the memory device 100 overall.

Various control signals generated from the control logic 120 may be provided to the voltage generator 130, the row decoder 140, and the page buffer 150. For example, the control logic 120 may provide a voltage control signal CTRL_vol to the voltage generator 130, may provide a row address X-ADDR to the row decoder 140, and may provide a column address Y-ADDR to the page buffer 150. However, the present inventive concept is not limited thereto, and the control logic 120 may further provide other control signals to the voltage generator 130, the row decoder 140, and the page buffer 150.

The voltage generator 130 may generate various types of voltages for performing program, read, and erase operations on the memory cell array 110 based on a voltage control signal CTRL_vol. For example, the voltage generator 130 may generate a word line driving voltage for driving word lines WL, for example, a program voltage (or a write voltage), a read voltage, a program inhibit voltage, an erase verify voltage, or a program verify voltage. Also, the voltage generator 130 may further generate a string selection line driving voltage for driving string selection lines SSL and a ground selection line driving voltage for driving ground selection lines GSL. Also, the voltage generator 130 may further generate an erase voltage to be provided to the memory cell array 110.

The row decoder 140 may select some word lines WL from among the word lines WL in response to the row address X-ADDR received from the control logic 120. For example, during a read operation, the row decoder 140 may apply a read voltage to the selected word line and apply a read inhibit voltage to unselected word lines. Also, during a program operation, the row decoder 140 may apply a program voltage to the selected word line and apply a program inhibit voltage to the unselected word lines. Furthermore, the row decoder 140 may select some string selection lines SSL from among the string selection lines SSL or select some ground selection lines GSL from among the ground selection lines GSL in response to the row address X-ADDR received from the control logic 120.

The page buffer 150 may be connected to the memory cell array 110 via the bit lines BL, and select some bit lines among the bit lines BL in response to the column address Y-ADDR received from the control logic 120. For example, during the read operation, the page buffer 150 may operate as a sense amplifier and sense data DATA stored in the memory cell array 110. Meanwhile, during a program operation, the page buffer 150 may operate as a write driver and input desired data DATA in the memory cell array 110.

Figure 3:
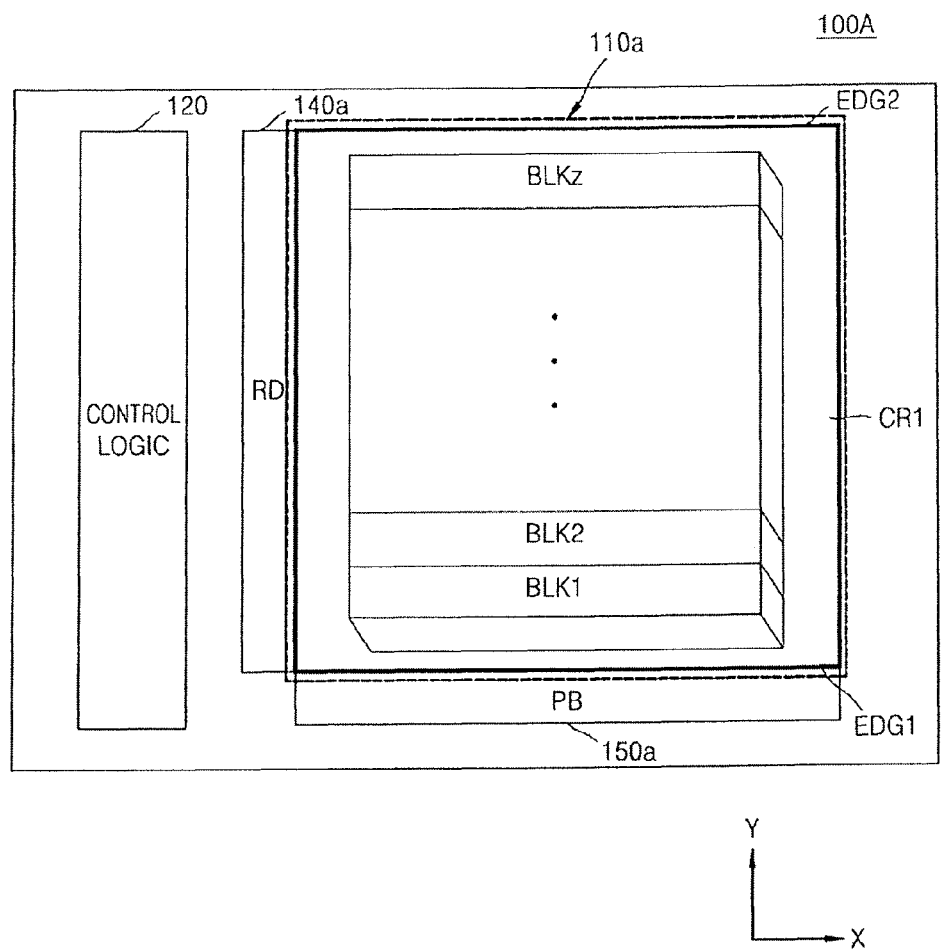
FIG. 3 illustrates an example of the memory device of FIG. 2.

FIG. 3 illustrates a memory device 100A which is an exemplary embodiment of the memory device 100 of FIG. 2 according to the present inventive concept.

Referring to FIG. 3, the memory device 100A may include a memory cell array 110a, a control logic 120, a row decoder 140a, and a page buffer 150a. The memory cell array 110a may include a cell region CR1, and the cell region CR1 may be connected to the row decoder 140a and the page buffer 150a.

The cell region CR1 may include a plurality of blocks BLK1 through BLKz, and each block may have a three-dimensional structure (or a vertical structure). For example, each block includes structures extending in first through third directions. For example, each block includes a plurality of strings or NAND strings extending in the third direction (e.g., a Z direction). The plurality of strings may be spaced apart from one another by a predetermined distance in the first and second directions (e.g., an X direction and a Y direction).

The blocks BLK1 through BLKz may be selected by the row decoder 140a. For example, the row decoder 140a may select a block corresponding to a block address from among the blocks BLK1 through BLKz. Each block is connected to a plurality of bit lines BL, a plurality of string selection lines SSL, a plurality of word lines WL, a ground selection line GSL, and a common source line CSL. The blocks BLK1 through BLKz will be described in detail later with reference to FIG. 5.

Figure 4:
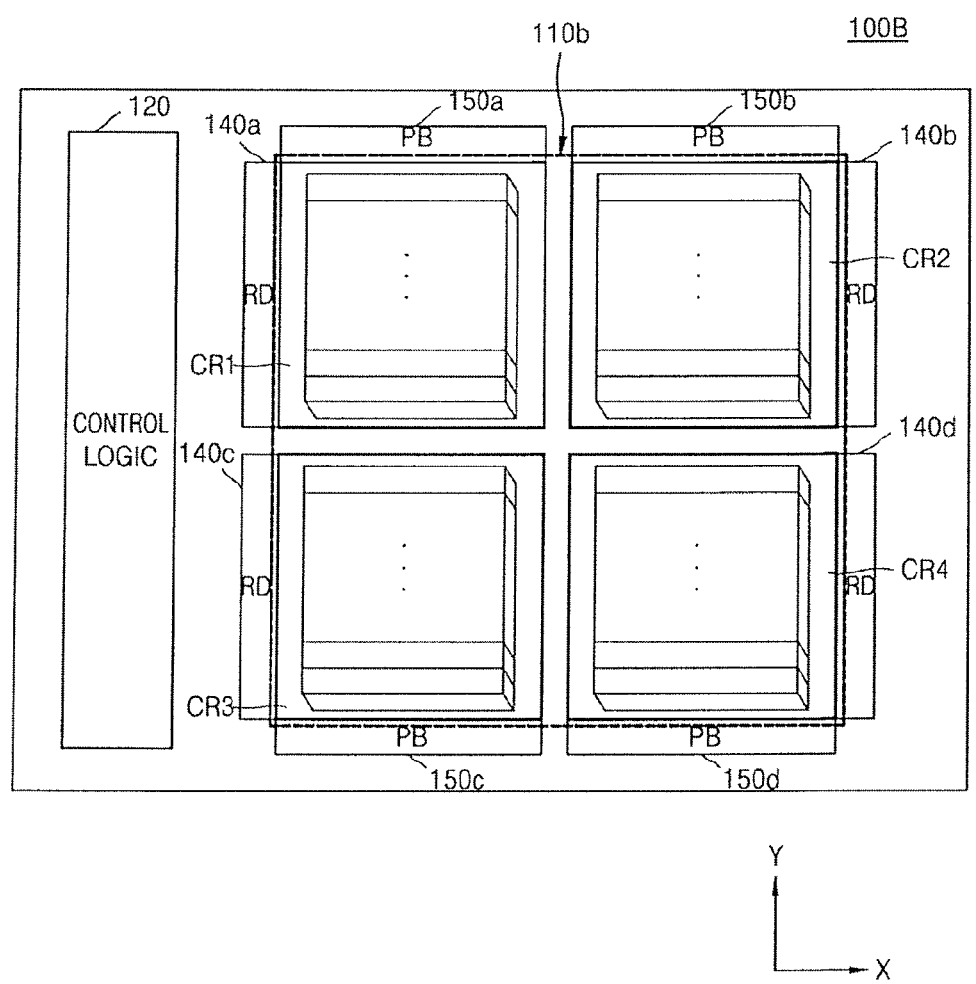
FIG. 4 illustrates an example of the memory device of FIG. 2.

FIG. 4 illustrates an exemplary memory device 100B of the memory device 100 of FIG. 2 according to the present inventive concept.

Referring to FIG. 4, the memory device 100B may include a memory cell array 110b, a control logic 120, first through fourth row decoders 140a through 140d, and first through fourth page buffers 150a and 150d. The memory cell array 110b may include four cell regions CR1 through CR4. Each cell region has substantially the same structure as the cell region CR1 of FIG. 3, and detailed descriptions provided with reference to FIG. 3 may also be applied to the present exemplary embodiment, and thus repeated description will be omitted.

The first cell region CR1 may be connected to the first row decoder 140a and the first page buffer 150a. The second cell region CR2 may be connected to the second row decoder 140b and the second page buffer 150b. The third cell region CR3 may be connected to the third row decoder 140c and the third page buffer 150c. The fourth cell region CR4 may be connected to the fourth row decoder 140d and the fourth page buffer 150d.

The first through fourth row decoders 140a through 140d may operate independently of each other, and the first through fourth page buffers 150a through 150d may also operate independently of each other. Thus, operations for the first through fourth cell regions CR1 through CR4 may be performed independently of each other. Accordingly, a cell region may be an independently operable unit, and a program, read, or erase operation may be simultaneously performed on at least one cell regions.

Figure 5:
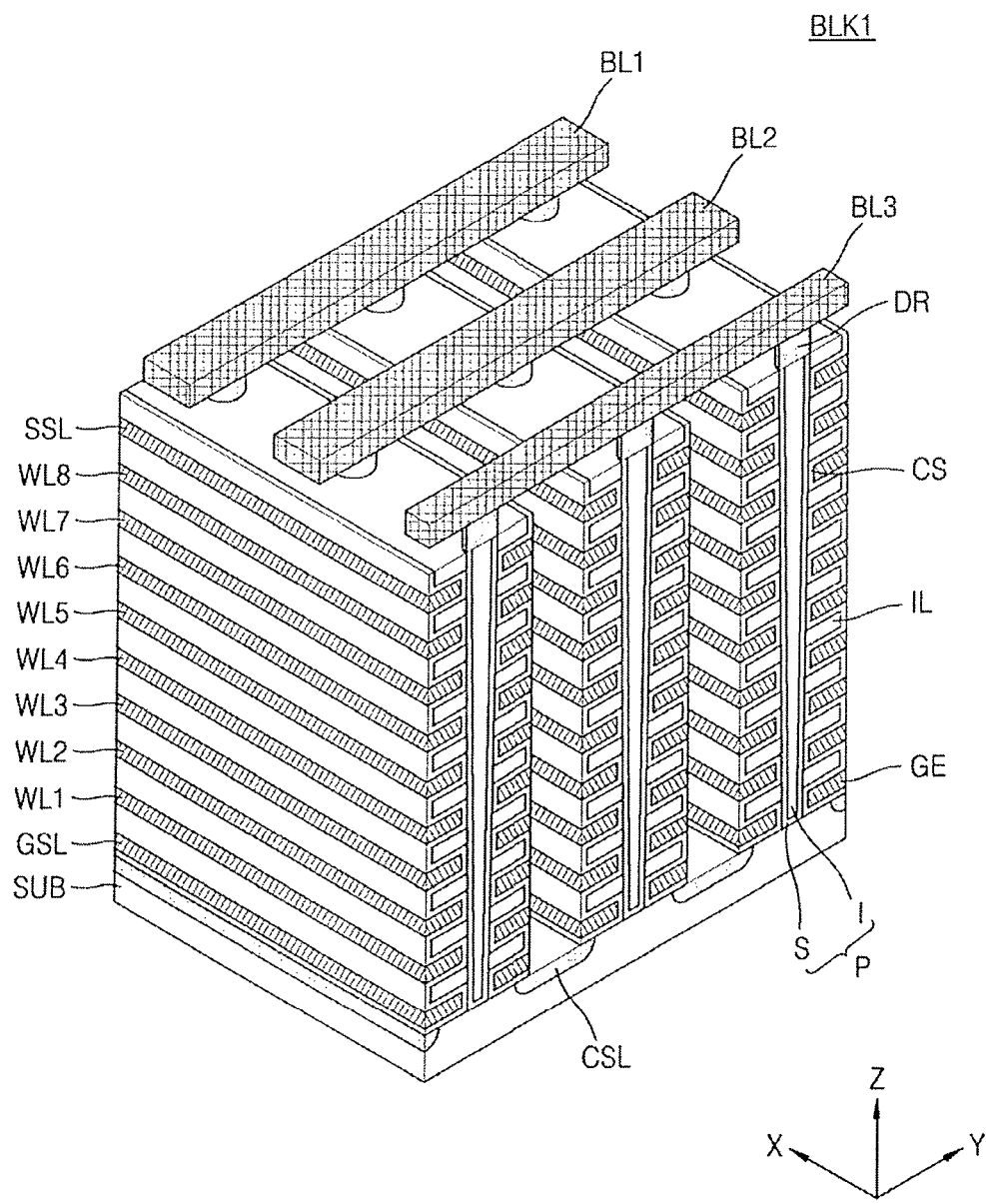
FIG. 5 is a perspective view of a first block, which is one of blocks of FIG. 3, according to an exemplary embodiment.

FIG. 5 is a perspective view of the first block BLK1 in FIG. 3, according to an exemplary embodiment.

Referring to FIG. 5, the first block BLK1 may be formed in a vertical direction to a substrate SUB. Although FIG. 5 illustrates a case in which the first block BLK1 includes two selection lines GSL and SSL, eight word lines WL1 to WL8, and three bit lines BL1 to BL3, the first block BLK1 is not limited thereto and may include more or fewer lines.

The substrate SUB may be doped with impurities having a first conductivity type (e.g., p type) and extend in a first direction on the substrate SUB, and a common source line CSL doped with impurities of a second conductivity type (e.g., n type) may be provided. A plurality of insulating layers IL may be provided on a region of the substrate SUB between two adjacent common source lines CSL. The plurality of insulating layers IL may extend in the first direction (e.g., X direction) and be sequentially disposed in a third direction (e.g., Z direction). The plurality of insulating layers IL may be spaced apart from one another in a predetermined distance in the third direction. For example, the plurality of insulating layers IL may include an insulating material such as silicon oxide.

A plurality of pillars P may be provided on a region of the substrate SUB between two adjacent common source lines CSL. The plurality of pillars P may be sequentially arranged in the first direction and penetrate the plurality of insulating layers IL in the third direction. For example, the plurality of pillars P may penetrate the plurality of insulating layers IL and contact the substrate SUB. For example, a surface layer S of each of the pillars P may include silicon and be doped with impurities having a first conductivity type. The surface layer S may function as a channel region. Meanwhile, an internal layer I of each of the pillars P may include an insulating material such as silicon oxide, or an air gap.

A charge storage layer CS may be provided on a region between two adjacent common source lines CSL along exposed surfaces of the insulating layers IL, the pillars P, and the substrate SUB. For example, the charge storage layer CS may have an oxide-nitride-oxide (ONO) structure. Also, a gate electrode GE may be provided on an exposed surface of the charge storage layer CS in the region between the two adjacent common source lines CSL.

Drains or drain contacts DR may be respectively provided on the plurality of pillars P. For example, the drains or drain contacts DR may include a silicon material doped with impurities having a second conductivity type. Bit lines BL may be provided on the drains DR. The bit lines BL may extend in a second direction (e.g., Y direction) and be spaced apart from one another by a predetermined distance in the first direction.

Figure 6:
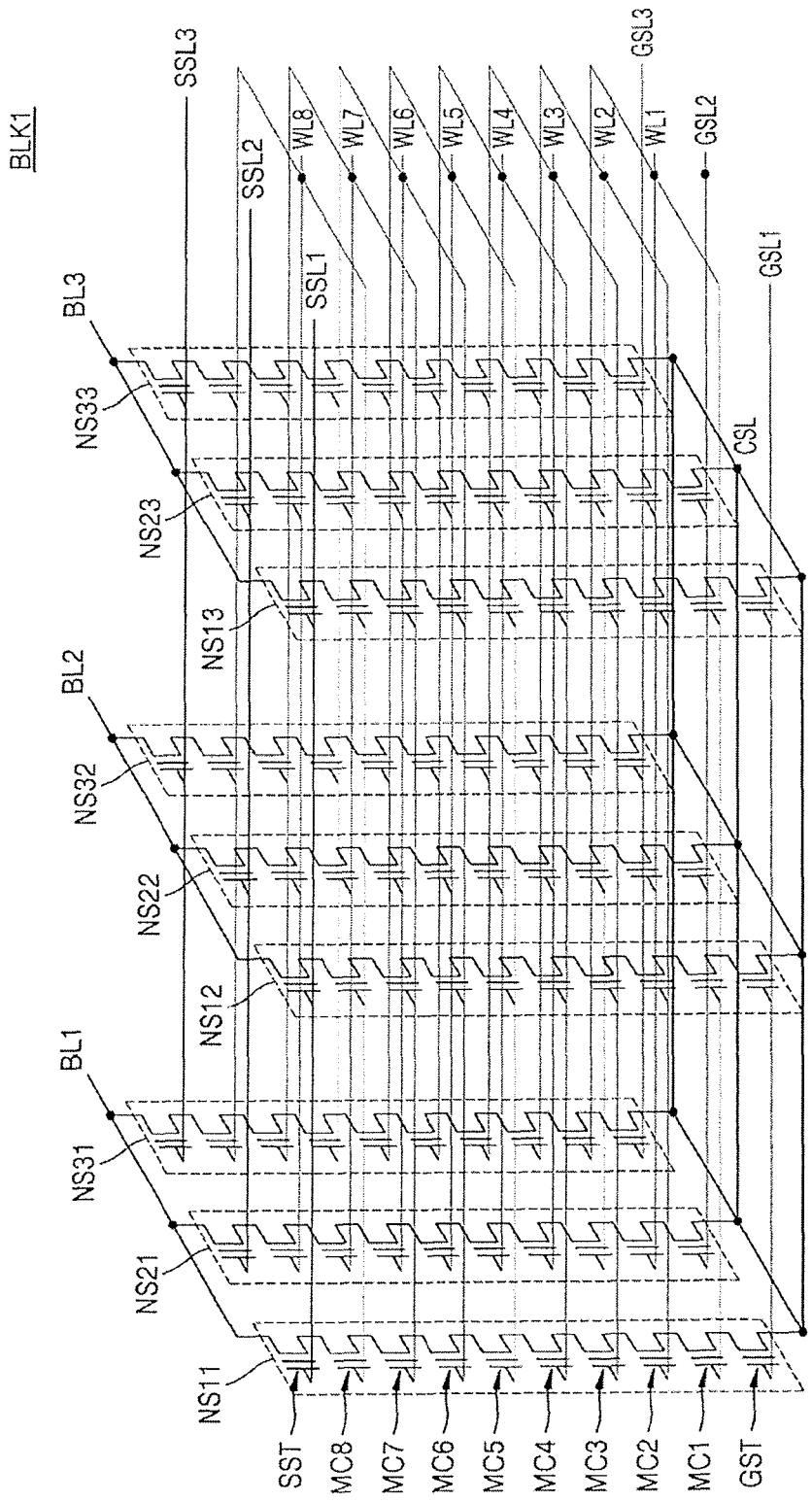
FIG. 6 is a circuit diagram illustrating an equivalent circuit of the first block of FIG. 5.

FIG. 6 is a circuit diagram of the first block BLK1 of FIG. 5 according to an exemplary embodiment.

Referring to FIG. 6, the first block BLK1 may be a vertical NAND flash memory, and each of the blocks BLK1 to BLKz shown in FIG. 3 may be embodied as in FIG. 6. The first block BLK1 may include a plurality of NAND strings NS11 to NS33, a plurality of word lines WL1 to WL8, a plurality of bit lines BL1 to BL3, a plurality of ground selection lines GSL1 to GSL3, a plurality of string selection lines SSL1 to SSL3, and a common source line CSL. The present inventive concept is not limited thereto. For example, the number of NAND strings, the number of word lines, the number of bit lines, the number of ground selection lines, and the number of string selection lines may be variously changed according to an exemplary embodiment.

NAND strings NS11, NS21, and NS31 may be provided between a first bit line BL1 and the common source line CSL, NAND strings NS12, NS22, and NS32 may be provided between a second bit line BL2 and the common source line CSL, and NAND strings NS13, NS23, and NS33 may be provided between a third bit line BL3 and the common source line CSL. Each of the NAND strings (e.g., NS11) may include a string selection transistor SST, a plurality of memory cells MC1 to MC8, and a ground selection transistor GST, which are connected in series. Hereinafter, the NAND string will be referred to as a string for the convenience of description.

Strings that are connected in common to one bit line may constitute one column. For example, the strings NS11, NS21, and NS31 commonly connected to the first bit line BL1 may correspond to a first column, and the strings NS12, NS22, and NS32 commonly connected to the second bit line BL2 may correspond to a second column. The strings NS13, NS23, and NS33 commonly connected to the third bit line BL3 may correspond to a third column.

Strings connected to one string selection line may constitute one row. For example, the strings NS11, NS12, and NS13 connected to a first string selection line SSL1 may correspond to a first row, and the strings NS21, NS22, and NS23 connected to a second string selection line SSL2 may correspond to a second row. The strings NS31, NS32, and NS33 connected to a third string selection line SSL3 may correspond to a third row.

The string selection transistor SST may be connected to the string selection lines SSL1 to SSL3. The plurality of memory cells MC1 to MC8 may be respectively connected to the word lines WL1 to WL8. The ground selection transistor GST may be connected to the ground selection line GSL. The string selection transistor SST may be connected to the corresponding bit line BL, and the ground selection transistor GST may be connected to the common source line CSL.

Word lines (e.g., WL1) disposed at the same level may be commonly connected, and the string selection lines SSL1 to SSL3 may be separated from one another. The ground selection lines GSL1 to GSL3 may be separated from one another. For example, when memory cells that are connected to the first word line WL1 and belong to the strings NS11, NS12, and NS13 are programmed, the first word line WL1 and the first string selection line SSL1 may be selected.

Figure 7:
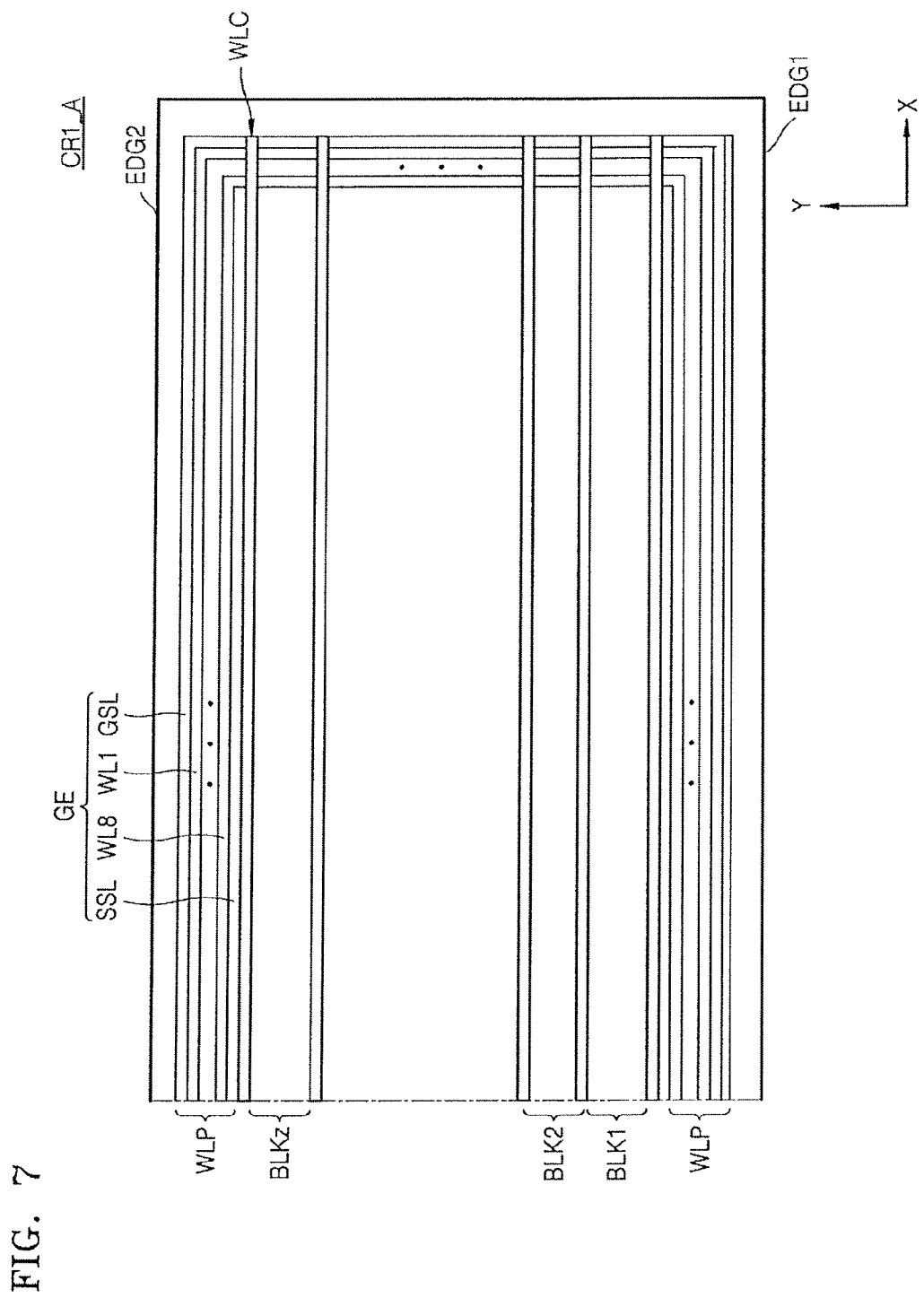
FIG. 7 illustrates an example of a cell region according to an exemplary embodiment of the present inventive concept.

FIG. 7 illustrates a cell region CR1_A according to an exemplary embodiment of the present inventive concept.

Referring to FIG. 7, the cell region CR1_A may be defined by a well region formed on a substrate (for example, the substrate SUB of FIG. 5) and may be defined by four edges. Hereinafter, edges that are in a first direction (e.g., X direction) from among the four edges will be referred to as first and second edges EDG1 and EDG2. The first and second edges EDG1 and EDG2 may be parallel to an extension direction of the word lines WL1 and WL8. Also, the first and second edges may be a boundary of a P well region including the cell region CR1_A on the substrate.

The cell region CR1_A may include a plurality of gate electrodes GE that are vertically stacked on the substrate, and the plurality of gate conductive layers may include a ground selection line GSL, a plurality of word lines WL1 and WL8, and a string selection line SSL. An insulation layer may be disposed under or on each of the gate electrodes GE. Meanwhile, the word lines WL1 and WL8, the string selection line SSL, and the ground selection line GSL may be separated by a word line cut WLC.

A surface of the gate electrodes GE may be reduced away from the substrate, and thus, the gate electrodes GE may be stacked in a step manner. A step-shaped pad structure as above may be referred to as a word line pad WLP. A contact may be formed on the word line pad WLP, and as the word line pad WLP is connected to a wiring line via the contact, the word line pad WLP may receive an electric signal from a peripheral circuit. In an exemplary embodiment, the cell region CR1_A may include the word line pad WLP.

In an embodiment, the word lines WL1 and WL8 may extend in the first direction, and accordingly, a length of the word lines WL1 and WL8 in the first direction may be longer than a length thereof in the second direction (e.g., Y direction). Likewise, a length of each of the blocks BLK1 through BLKz in the first direction may be longer than a length thereof in the second direction. An exemplary embodiment in which a length of the cell region CR1_A in the first direction is longer than a length thereof in the second direction will be described below. However, the present inventive concept is not limited thereto, and the length of the cell region CR1_A in the second direction may be varied based on the number of blocks needed according to memory capacity. Thus, in an exemplary embodiment, the length of the cell region CR1_A in the first direction may be shorter than the length thereof in the second direction.

Figure 8:
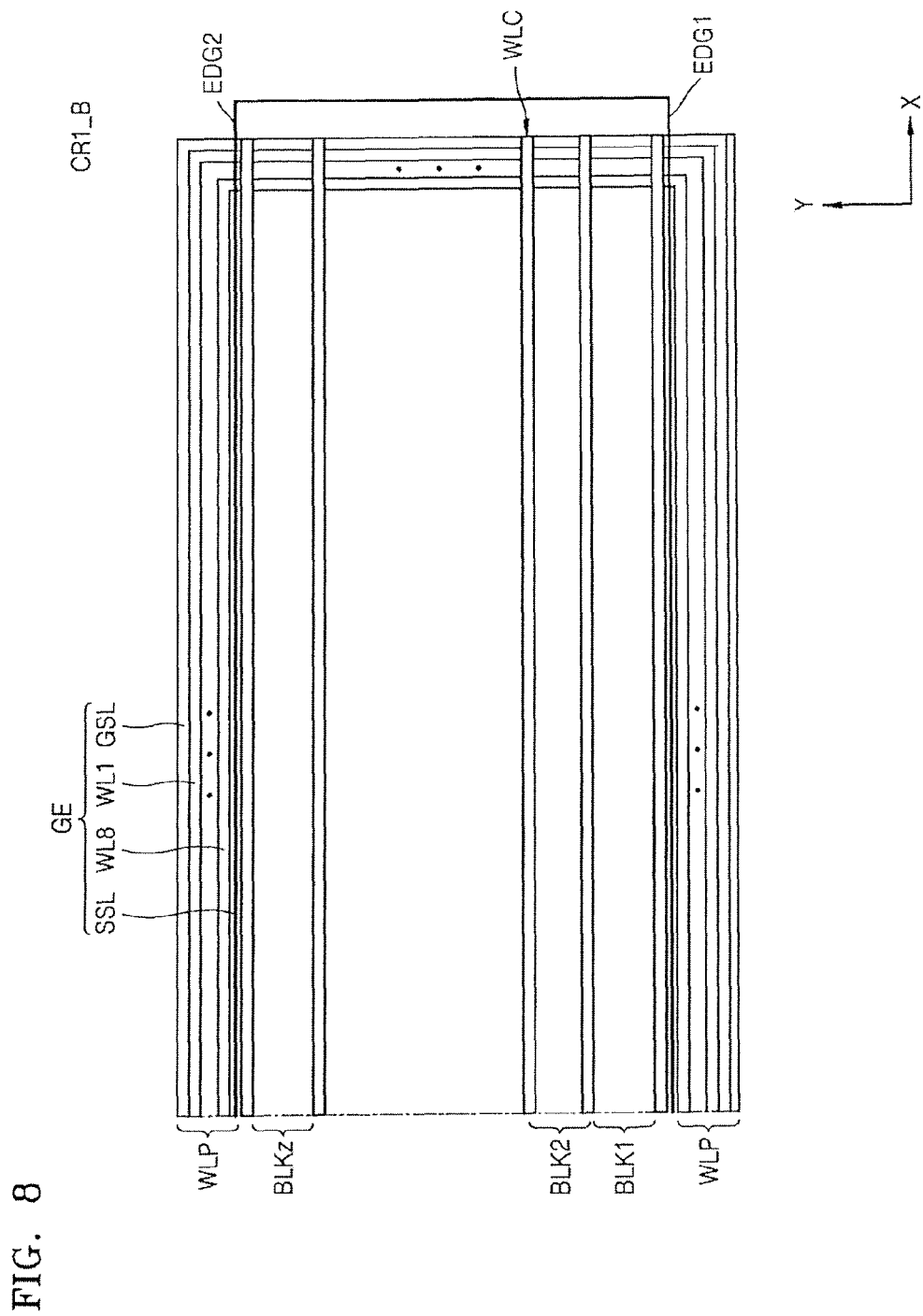
FIG. 8 illustrates an example of a cell region according to an exemplary embodiment of the present inventive concept.

FIG. 8 illustrates a cell region CR1_B which is an example of a cell region according to an exemplary embodiment of the present inventive concept.

Referring to FIG. 8, the cell region CR1_B may be defined by a well region formed on a substrate (for example, the substrate SUB of FIG. 5) and may be defined by four edges. Unlike the cell region CR1_A of FIG. 7, the cell region CR1_B need not include a word line pad. The present inventive concept is not limited to those illustrated in FIG. 7 or FIG. 8. For example, a cell region may be defined in various manners.

Figure 9:
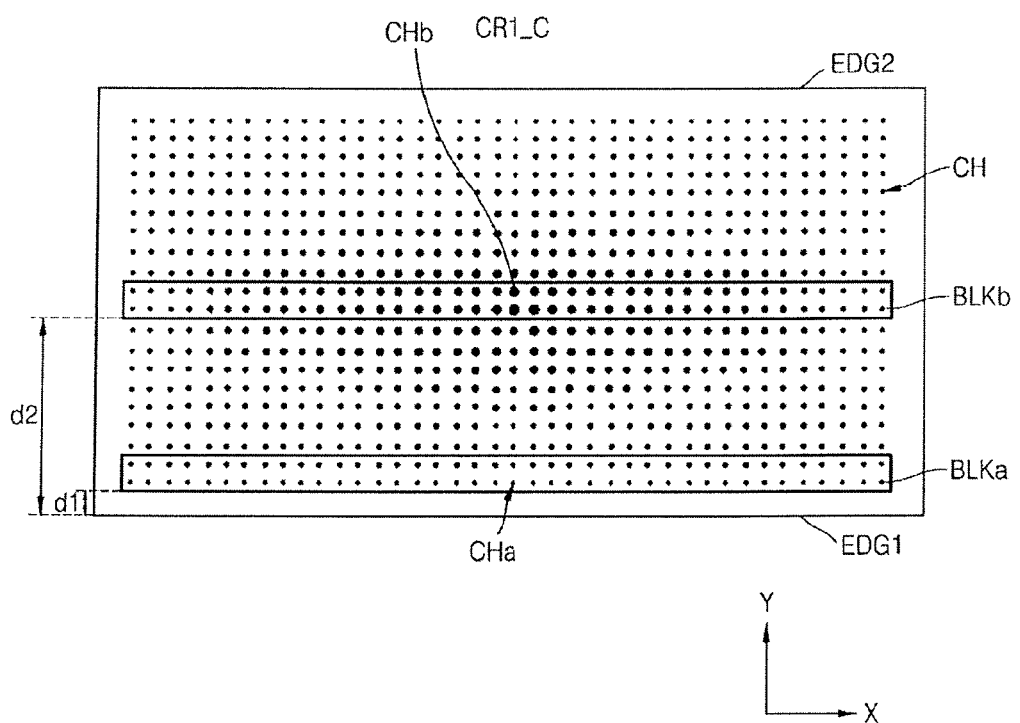
FIG. 9 illustrates an example of a cell region according to an exemplary embodiment of the present inventive concept.

FIG. 9 illustrates a cell region CR1_C according to an exemplary embodiment of the present inventive concept.

Referring to FIG. 9, the cell region CR1_C further includes a plurality of channel holes CH compared to the cell regions CR1_A illustrated in FIG. 7 or the CR1_B illustrated in FIG. 8. Pillars (e.g., the pillars P of FIG. 5) may be respectively formed in the plurality of channel holes. The gate electrodes GE illustrated in FIGS. 7 and 8 are not illustrated for the convenience of description.

In the present exemplary embodiment, a channel hole size, for example, a channel hole diameter, may be varied according to positions within the cell region CR1_C. For example, channel holes CH adjacent to the first and second edges EDG1 and EDG2 have a low peripheral density, and thus may have a different diameter from those of other channel holes CH. Hereinafter, a channel hole diameter will be described as an example of a channel hole size. However, the channel hole size is not limited to the channel hole diameter.

In an exemplary embodiment, a diameter of channel holes CH in a center region of the cell region CR1_C may be greater than a diameter of the channel holes CH adjacent to the first and second edges EDG1 and EDG2. An exemplary embodiment in which the diameter of the channel holes CH in the center region of the cell region CR1_C is greater than the diameter of the channel holes CH adjacent to the first and second edges EDG1 and EDG2 will be described below.

However, the present inventive concept is not limited thereto. For example, the diameter of the channel holes CH in the center region of the cell region CR1_C may be smaller than the diameter of the channel holes CH adjacent to the first and second edges EDG1 and EDG2. In this case, operation parameter conditions which will be described below may be reversely applied to compensate for a difference in terms of operating characteristics of a memory device due to a difference in channel hole sizes.

A memory device may be manufactured by performing a process such as a molding process and an etching process. Channel holes CH may be formed by performing an etching process on the gate electrodes GE and the insulation layers illustrated in FIG. 7 or FIG. 8 to thereby remove a portion of each of the gate electrode layers GE and the insulation layers. For example, the channel holes CH may be formed using a plasma etching process. Here, a center portion of the cell region CR1_C may be etched more than an edge portion thereof, and thus, a diameter D1 of the channel holes CH in the edge portion of the cell region CR1_C may be smaller than a diameter D2 of the channel holes CH in the center portion of the cell region CR1_C.

In the present exemplary embodiment, a first block BLKa may be adjacent to the second edge EDG2, and may be spaced apart from the second edge EDG2 by a first distance d1. A second block BLKb may not be adjacent to the first and second edges EDG1 and EDG2, and be in a center of the cell region CR1_C, and may be spaced apart from the second edge EDG2 by a second distance d2. The second distance d2 may be greater than the first distance d1. A first diameter D1 of a first channel hole CHa included in the first block BLKa may be smaller than a second diameter D2 of a second channel hole CHb included in the second block BLKb.

Figure 10A:
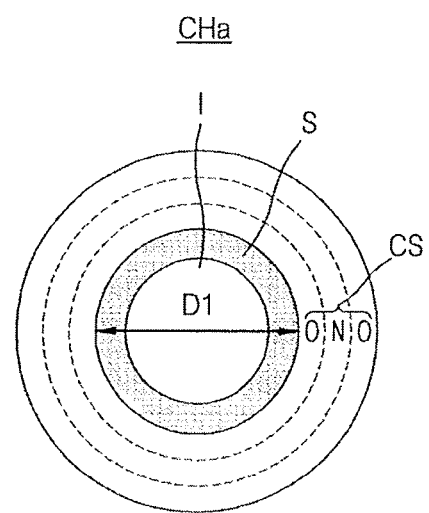
FIGS. 10A and 10B illustrate cross-sections of strings respectively included in first and second blocks of FIG. 9.
Figure 10B:
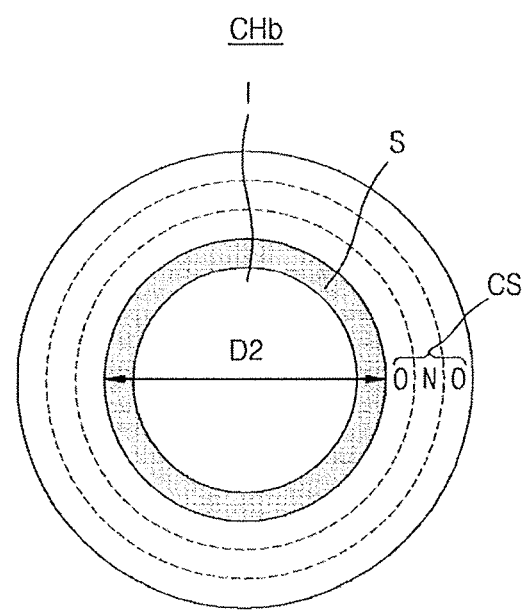

FIGS. 10A and 10B illustrate cross-sections of strings of the first and the second blocks BLKa and BLKb of FIG. 9, respectively.

Referring to FIG. 10A, a pillar including a surface layer S and an internal layer I may be formed in the first channel hole CHa included in the first block BLKa, and a charge storage layer CS may be formed around the first channel hole CHa, and the charge storage layer CS may have an (oxide-nitride-oxide) ONO structure.

Referring to FIG. 10A, a pillar including a surface layer S and an internal layer I may be formed in the second channel hole CHb included in the second block BLKb, and a charge storage layer CS may be formed around the second channel hole CHb, and the charge storage layer CS may have an ONO structure. In an exemplary embodiment, a thickness of the charge storage layer CS included in the second block BLKb may be different from a thickness of the charge storage layer CS included in the first block BLKa.

Characteristics of memory cells may vary due to the difference in the channel hole diameters. For example, in a 3D memory device having a gate all around structure in which a gate electrode is disposed around a circumference of a channel hole, if a channel hole diameter is reduced, the magnitude of an electric field formed between a gate electrode (e.g., the gate electrode GE of FIG. 5) and a channel region S is increased. Thus, program and erase speeds of a memory cell having a relatively small channel hole diameter like the first channel hole CHa may be higher than those of a memory cell having a relatively large channel hole diameter like the second channel hole CHb.

The difference in operating characteristics of memory cells as above is not caused just due to the difference in the channel hole diameters. For example, a difference in operating characteristics of memory cells may be generated by a channel hole shape or a thickness of a charge storage layer or the like. In an exemplary embodiment, a difference in channel hole shapes or a difference in thicknesses of charge storage layers may vary according to respective blocks.

For example, thicknesses and composition ratios of respective layers that constitute a charge storage layer disposed between a gate electrode and a channel region may be different according to channel hole diameters. For example, when depositing a charge storage layer having an ONO structure into a channel hole, deposition areas and deposition surface roughness of respective channel holes may be different according to channel hole diameters, and accordingly, a speed at which a deposition gas contacts a deposition surface to be deposited may vary. A difference in geometrical shapes such as a thickness of an ONO layer may cause a difference in operating characteristics of memory cells.

Thus, characteristics of memory cells according to block positions may have characteristics to be described below, based on a channel hole size, but characteristics thereof after a predetermined number of programming or after a predetermined number of operations may be changed and the changed different characteristics may include opposite characteristics to previous characteristics. Change in characteristics of memory cells will be described below with respect to geometrical shapes of memory cells including, but is not limited thereto, a channel hole size, channel hole shapes, or a thickness of a charge storage layer. For the convenience of description, it will be described about change in characteristics of memory cells with respect to channel hole sizes.

Referring back to FIG. 9, a block is formed in the cell region CR1_C to include all memory cells corresponding to one page in the first direction, that is, in a word line direction, and to include some strings in the second direction, that is, in a bit line direction. Thus, each block extends in the first direction, and channel hole sizes, that is, channel hole diameters may differ in units of blocks.

In the present exemplary embodiment, diameters of channel holes included in blocks adjacent to the first edge EDG1 of the cell region CR1_C and blocks adjacent to the second edge EDG2 of the cell region CR1_C may be regarded as being smaller than diameters of channel holes included in blocks in a center of the cell region CR1_C. Thus, program and erase speeds with respect to the blocks adjacent to the first edge EDG1 and the blocks adjacent to the second edge EDG2 of the cell region CR1_C may be higher than program and erase speeds with respect to the blocks in the center of the cell region CR1_C. For example, program and erase speeds of memory cells included in the first block BLKa may be higher than program and erase speeds of memory cells included in the second block BLKb.

Figure 11:
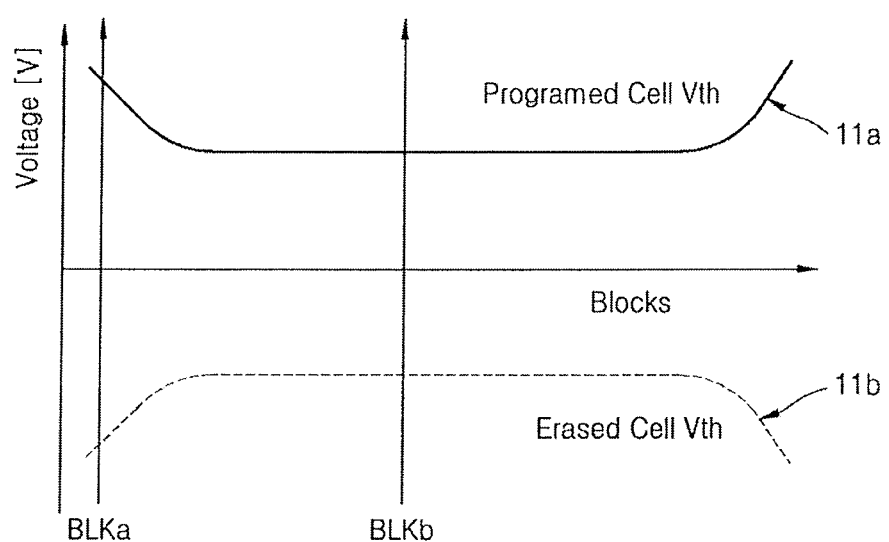
FIG. 11 is a graph showing a result of performing a program operation and an erase operation on the first and second blocks of FIG. 9.

FIG. 11 is a graph showing a result of performing a program operation and an erase operation on the first and second blocks BLKa and BLKb of FIG. 9.

Referring to FIG. 11, a horizontal axis denotes positions of blocks in the second direction, that is, a bit line direction, and a vertical axis denotes a threshold voltage. For example, a solid line 11a denotes a central value of threshold voltages according to block positions of a programmed memory cell, and a dotted line 11b denotes a central value of threshold voltages according to block positions of an erased memory cell.

As described above with reference to FIG. 9, the memory cells adjacent to the first and the second edges EDG1 and EDG2 of the cell region CR1_C have a smaller channel hole diameter than the memory cells in the center of the cell region CR1_C. Thus, when a program operation is performed according to a single well bias condition, a program speed of the memory cells adjacent to the first and the second edges EDG1 and EDG2 of the cell region CR1_C is faster than a program speed of the memory cells disposed in the center of the cell region CR1_C. Accordingly, if all memory cells within the cell region CR1_C are subject to the same program operation, threshold voltages of memory cells adjacent to edges EDG1 and EGD2, after the program operation, are higher than threshold voltages of memory cells at the center region of the cell region CR1_C. Accordingly, the threshold voltage distribution, solid line 11a, of programmed memory cells may have a U shape.

Also, when an erase operation is performed on all memory cells within the cell region CR1_C which has a single well bias condition, an erase speed of the memory cells adjacent to the first and second edges EDG1 and EDG2 is higher than the memory cells at the center region of the cell region CR1_C. Accordingly, the threshold voltage distribution, dotted line 11b, of erased memory cells may have an inverted U.

Figure 12:
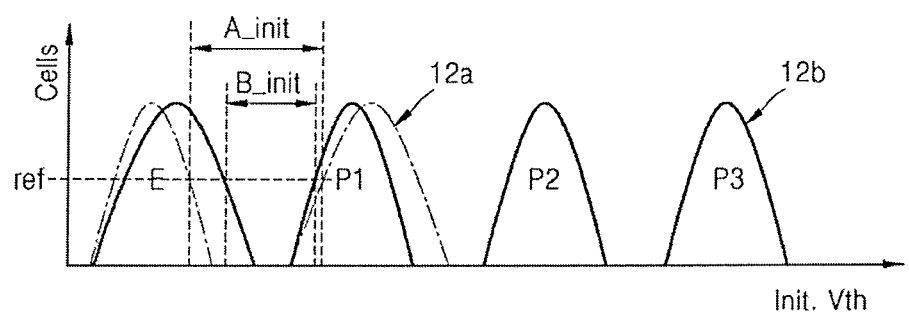
FIG. 12 is a graph showing a first distribution of the first and second blocks of FIG. 9 according to a threshold voltage.

FIG. 12 is a graph showing a first distribution of the first and second blocks BLKa and BLKb of FIG. 9 according to programmed states.

Referring to FIG. 12, a horizontal axis denotes a threshold voltage Vth, and a vertical axis denotes the number of memory cells. For example, if a memory cell is a multi-level cell programmed to two bits, the memory cell may have one of an erase state E, a first program state P1, a second program state P2, and a third program state P3.

The first distribution refers to an initial distribution of a program operation and an erase operation on the first and second blocks BLKa and BLKb. For example, the first distribution denotes a distribution of the first and second blocks BLKa and BLKb when a program/erase (P/E) cycle with respect to the first and second blocks BLKa and BLKb is equal to or less than a threshold value. Here, a dotted line 12a denotes a distribution with respect to the first block BLKa, and a solid line 12b denotes a distribution with respect to the second block BLKb.

As described above with reference to FIG. 9, since the channel hole diameter D1 of the memory cells included in the first block BLKa is smaller than the channel hole diameter D2 of the memory cells of the memory cells included in the second block BLKb, an erase speed with respect to the memory cells included in the first block BLKa is higher than an erase speed of the second block BLKb. Thus, a threshold voltage of the erase state E of the first block BLKa may be lower than a threshold voltage of the erase state E of the second block BLKb. Accordingly, an EP1 valley (A_init) between the erase state E and the first program state P1 with respect to the first block BLKa may be greater than an EP1 valley (B_init) of the second block BLKb (i.e., A_init>B_init). In this case, the EP1 valley may refer to a threshold difference between a peak threshold voltage of the erased state E and a peak threshold voltage of the first program state P1. The peak threshold voltage may refer to a threshold voltage at which the number of memory cells is maximum within a distribution. In determining the EP1 valley, memory cells that are correctable via error correction code (ECC) may be included.

Meanwhile, as described above with reference to FIG. 9, since the channel hole diameter D1 of the memory cells included in the first block BLKa is smaller than the channel hole diameter D2 of the memory cells included in the second block BLKb, a program speed with respect to the memory cells included in the first block BLKa is higher than a program speed with respect to the memory cells included in the second block BLKb. Thus, a threshold voltage of the first program state P1 of the first block BLKa may be higher than a threshold voltage of the first program state P1 of the second block BLKb. Accordingly, a P1P2 valley between the first program state P1 and the second program state P2 with respect to the first block BLKa may be smaller than a P1P2 valley of the second block BLKb. The P1P2 valley refer to a threshold difference between a peak threshold voltage of the first program state P1 and a peak threshold voltage of the second program state P2.

As described above, channel hole diameters vary according to respective blocks in a 3D memory device. Thus, if a program operation and an erase operation are performed using a single bias condition regardless of the blocks and regardless of the channel hole diameters, performance of the memory device may be degraded.

Figure 13A:
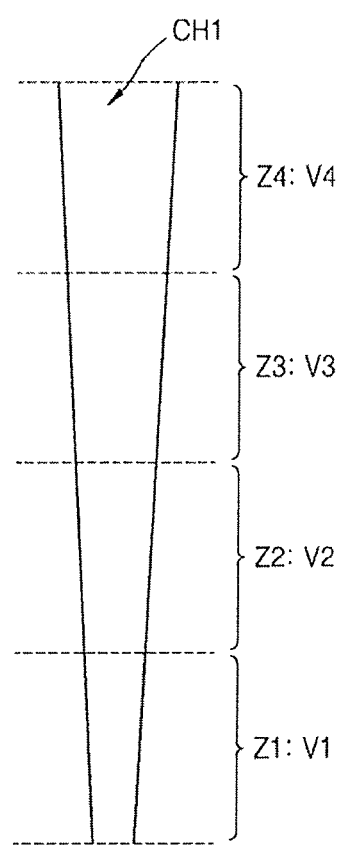
FIG. 13A illustrates a reference bias condition according to respective layers regarding a program operation of a memory device.

FIG. 13A illustrates a reference bias condition according to respective layers with respect to a program operation of a memory device.

Referring to FIG. 13A, a channel hole CH1 corresponding to a string included in a 3D memory device is illustrated. As described above, the channel hole CH1 is formed by etching portions of gate electrodes and insulation layers stacked on a substrate, and thus, the channel hole CH1 may be a tapered etching profile where a diameter of the channel hole CH1 is becoming downwardly smaller. The tapered sidewall of the channel hole CH1 may be due to reduction of influx of etchants into the channel hole CH1 as the channel hole CH1 is deeper. Thus, a diameter of the channel hole CH1 may be smaller towards the substrate.

In an exemplary embodiment, the channel hole CH1 may be divided into four zones according to channel hole diameters. For example, a zone in which a channel hole diameter is smaller than 40 nm may be referred to as a first zone Z1, and a zone in which a channel hole diameter is equal to or greater than 40 nm and smaller than 60 nm may be referred to as a second zone Z2, and a zone in which a channel hole diameter is equal to or greater than 60 nm and smaller than 80 nm may be referred to as a third zone Z3, a zone in which a channel hole diameter is equal to or greater than 80 nm and smaller than 100 nm may be referred to as a fourth zone Z4.

In a programming operation, different program start voltages may be applied according to where memory cells are positioned among the four zones. A first program start voltage V1 applied to word lines connected to the first zone Z1 may be set to be the smallest, and a second program start voltage V2 applied to word lines connected to the second zone Z2 may be set to be higher than the first program start voltage V1. A third program start voltage V3 applied to word lines connected to the third zone Z3 may be set to be higher than the second program start voltage V2, and a fourth program start voltage V4 applied to word lines connected to the fourth zone Z4 may be set to be higher than the third program start voltage V3. A difference in operating characteristics of memory cells due to a difference in channel hole diameters of respective layers may be compensated for by differentiating first programming voltage of the respective layers as described above. In this case, the program start voltage may refer to a starting voltage of an incremental-step-pulse programming (ISPP) operation.

The channel hole CH1 illustrated in FIG. 13A shows the reference bias condition of respective layers. Hereinafter, the channel hole CH1 will be referred to as a reference channel hole. When a channel hole size is changed, positions of respective zones may be changed, and even though the positions are changed, respective program start voltages applied to the respective zones are identical. This is shown in FIG. 13B.

Figure 13B:
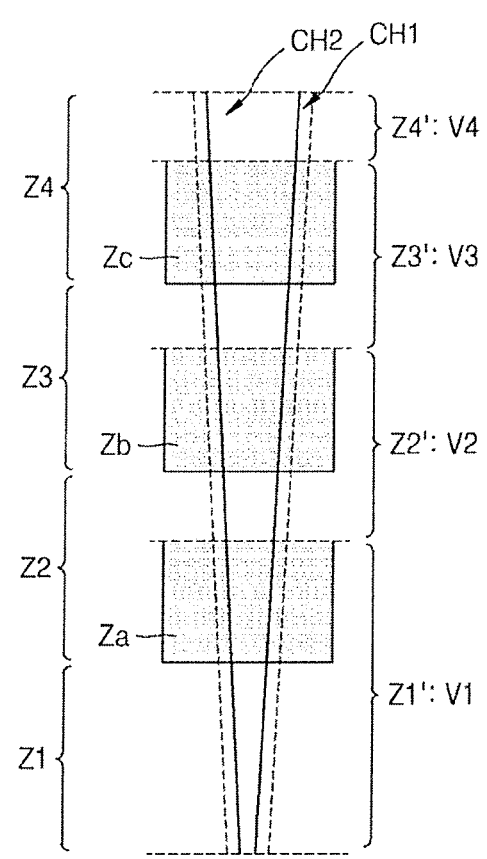
FIG. 13B illustrates a modified bias condition according to respective layers regarding a program operation of a memory device.

FIG. 13B shows a bias condition of layers in a program operation of a memory device, according to an exemplary example of the present inventive concept.

Referring to FIG. 13B, when a diameter of a channel hole CH2 is smaller than the reference channel hole CH1, bias zones of layers are changed. For example, a partial region Za within the second zone Z2 of the reference channel hole CH1 may be included in the first zone Z1' of which word lines are applied with the first start program voltage V1. A partial region Zb within the third zone Z3 of the reference channel hole CH1 may be included in the second zone Z2'. A partial region Zc within the fourth zone Z4 of the reference channel hole CH1 may be included in the third zone Z3'.

The first through fourth program start voltages V1 through V4 are applied to word lines positioned within the first through fourth zones Z1' through Z4', respectively. As described above, the modified bias conditions according to the respective layers modify positions of zones according to a change in a channel hole diameter, and program start voltages of the respective zones are maintained. According to the modified bias conditions according to the respective layers, compared to the reference bias condition according to the respective layers, only program start voltages applied to word lines connected to the some zones Za, Zb, and Zc may be modified.

Figure 14A:
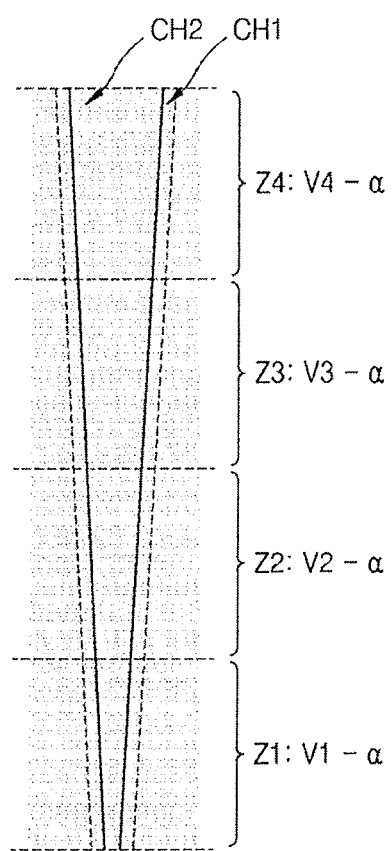
FIG. 14A illustrates an example of a bias condition of respective blocks regarding a program operation of a memory device, according to an exemplary embodiment of the present inventive concept.

FIG. 14A illustrates a bias condition of layers in a program operation of a memory device, according to an exemplary embodiment of the present inventive concept.

Referring to FIG. 14A, when a diameter of the channel hole CH2 is smaller than that of the reference channel hole CH1, a first offset α may be applied to each of the program start voltages applied to word lines of the first through fourth zones Z1 through Z4. Thus, a voltage V1-α may be applied to word lines connected to the first zone Z1; a voltage V2-α may be applied to word lines connected to the second zone Z2; a voltage V3-α may be applied to word lines connected to the third zone Z3; and a voltage V4-α may be applied to word lines connected to the fourth zone Z4.

In FIG. 13B, the bias zones Z1' through Z4' are adjusted based on the bias zones Z1 through Z4 of the reference channel hole CH1 to apply a different reference bias condition to some word lines within partial regions Za to Zc. In FIG. 13B, the bias condition of the channel hole CH1 is adjusted to have the offset reference bias condition of the reference channel hole CH1 without adjusting bias zones of the channel hole CH2. As described, according to the present exemplary embodiment, a difference in operating characteristics of a memory cell due to a difference in channel hole diameters of respective blocks may be compensated for by adjusting bias conditions according to the respective blocks.

Figure 14B:
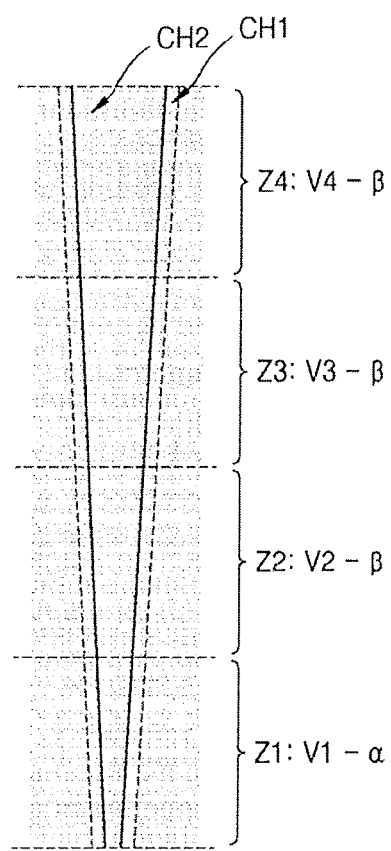
FIG. 14B illustrates an example of a bias condition of respective blocks regarding a program operation of a memory device, according to an exemplary embodiment of the present inventive concept.

FIG. 14B illustrates a bias condition of layers in a program operation of a memory device according to an exemplary embodiment of the present inventive concept.

Referring to FIG. 14B, if a diameter of the channel hole CH2 is smaller than that of the reference channel hole CH1, the first through fourth zones Z1 through Z4 are the same as those of the reference channel hole CH1, and a first offset α may be applied to a program start voltage applied to word lines connected to the first zone Z1, and a second offset β may be applied to each of program start voltages applied to word lines connected to each of the second through fourth zones Z2 through Z4. For example, the first offset α may be greater than the second offset β. Accordingly, a voltage V1-α may be applied to word lines connected to the first zone Z1, and a voltage V2-β may be applied to word lines connected to the second zone Z2, and a voltage V3-β may be applied to word lines connected to the third zone Z3, and a voltage V4-β may be applied to word lines connected to the fourth zone Z4.

In FIG. 14B, a different offset may be set with respect to zones. As described above, a difference in operating characteristics of a memory cell due to a difference in channel hole diameters of blocks may be compensated for by adjusting bias conditions according to the respective blocks.

Figure 15:
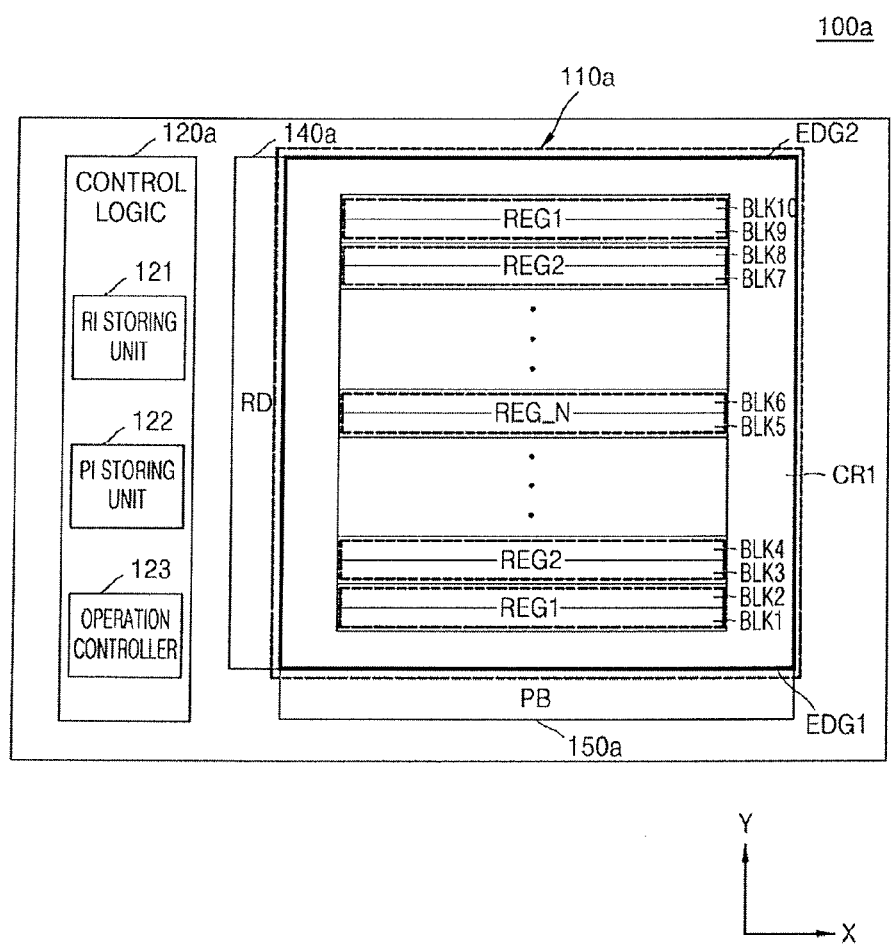
FIG. 15 illustrates a memory device according to an exemplary embodiment of the present inventive concept.

FIG. 15 illustrates a memory device 100a according to an exemplary embodiment of the present inventive concept.

Referring to FIG. 15, the memory device 100a may include a memory cell array 110a, a control logic 120a, a row decoder 140a, and a page buffer 150a. The memory cell array 110a may include a cell region CR1, and the cell region CR1 may include a plurality of blocks BLK1 through BLK10. The memory cell array 110a of FIG. 15 corresponds to the memory cell array 110a of FIG. 3. For the convenience of description, the memory cell array 110a of FIG. 3 has a single cell region CR1. The present inventive concept is not limited thereto. For example, the memory cell array 110a in FIG. 15 may be set to have four cell regions CR1 through CR4 as in FIG. 4.

In an exemplary embodiment, a plurality of blocks may be divided into N block regions based on a distance with respect to each of the first and the second edges EDG1 and EDG2 of the cell region CR1. For example, a plurality of blocks may be divided into N block regions based on a distance with respect to a relatively close edge among the first and the second edges EDG1 and EDG2, and N may be an integer equal to or greater than 2. Thus, blocks that are substantially at the same distance from the relatively close edge may be included in the same block region.

In an exemplary embodiment, a plurality of blocks may be divided into N block regions based on an absolute distance with respect to the first and the second edges EDG1 and EDG2 of the cell region CR1. In an exemplary embodiment, a plurality of blocks may be divided into N block regions based on a relative distance with respect to the first and the second edges EDG1 and EDG2 of the cell region CR1. The plurality of blocks may be divided into N block regions according to an order in which they are disposed with respect to the first and the second edges EDG1 and EDG2.

For example, a block BLK1 that is most adjacent to the first edge EDG1 and a block BLK2 that is second most adjacent to the first edge EDG1 may be included in a first block region REG1. Also, a block BLK10 that is most adjacent to the second edge EDG2 and a block BLK9 that is second most adjacent to the second edge EDG2 may be included in the first block region REG1. A block BLK3 that is third most adjacent to the first edge EDG1 and a block BLK4 that is fourth most adjacent to the first edge EDG1 may be included in a second block region REG2, and a block BLK8 that is third most adjacent to the second edge EDG2 and a block BLK7 that is fourth most adjacent to the second edge EDG2 may be included in the second block region REG2. Also, blocks BLK5 and BLK6 in a center of the cell region CR1 may be included in an Nth block region REG_N. However, the present inventive concept is not limited thereto, and according to an exemplary embodiment, a reference used to set block regions need not be the first and the second edges EDG1 and EDG2. For example, an arbitrary position in the cell region CR1 may be set to a reference to set block regions. For example, a predetermined line in the cell region CR1 may be set as a reference, and block regions may be divided with respect to a distance from the line. As an example, two lines in the cell region CR1 may be set as references, and block regions may be divided with respect to an order in which blocks are disposed with respect to the lines.

In an exemplary embodiment, the reference to set block regions may be chosen to reflect trends in change of channel hole size within a cell region. In FIG. 15, the channel hole sizes are symmetric with respect to a center region, and the channel hole size may increase toward the center region. Accordingly, two edges EDG1 and EDG2 in parallel to a word line may be chosen as the reference. Alternatively, a center line extending in parallel to a word line may be chosen as the reference.

FIG. 16 is a table REG_TABLE1 illustrating block region information stored in a block region storing unit 121 of FIG. 15 according to an exemplary embodiment.

Referring to FIG. 16, the table REG_TABLE1 stores information about block regions of FIG. 15. The first block BLK1 that is most adjacent to the first edge EDG1 and the tenth block BLK10 that is most adjacent to the second edge EDG2 may correspond to the first block region REG1, and the second block BLK2 that is second most adjacent to the first edge EDG1 and the ninth block BLK9 that is second most adjacent to the second edge EDG2 may also correspond to the first block region REG1.

Referring back to FIG. 15, the control logic 120a may include the block region information storing unit 121, a parameter information storing unit 122, and an operation controller 123. The block region information storing unit 121 and the parameter information storing unit 122 may be implemented using latches, for example. The present inventive concept is not limited thereto. For example, block region information and parameter information may be stored in a region of the memory cell array 110a. In an exemplary embodiment, block region information and parameter information may be stored in a buffer memory of a memory controller. In an exemplary embodiment, block region information and parameter information may be stored in an additional non-volatile memory included in a memory system.

The block region information storing unit 121 may store information about block regions of the cell region CR1 included in the memory cell array 110a. Block region information may be generated by dividing a plurality of blocks into at least two block regions based on a distance with respect to a relatively close edge among the first and second edges EDG1 and EDG2 of the cell region CR1. In an exemplary embodiment, block region information may be stored as a table showing block regions for corresponding blocks.

In an exemplary embodiment, the block region information storing unit 121 may store block region information that is modified according to an operation cycle count. For example, the block region information storing unit 121 may store first block region information corresponding to an operation cycle count that is equal to or less than a threshold value, and may store second block region information corresponding to an operation cycle count that is greater than the threshold value. Thus, a single block may correspond to different block regions according to an operation cycle count. This will be further described For example with reference to FIGS. 50 and 51.

In an exemplary embodiment, the block region information storing unit 121 may store block region information that is modified according to a data retention period. For example, the block region information storing unit 121 may store first block region information corresponding to a data retention period that is equal to or smaller than a threshold value and second block region information corresponding to a data retention period that is greater than the threshold value. Thus, a single block may correspond to different block regions according to a data retention period. This will be further described with reference to FIG. 56. [Note to client]

In an exemplary embodiment, the block region information storing unit 121 may store block region information that is modified according to an operation mode. For example, the block region information storing unit 121 may store first block region information corresponding to a program operation, second block region information corresponding to an erase operation, third block region information corresponding to a read operation, and fourth block region information corresponding to a read recovery operation. Accordingly, a single block may correspond to different block regions according to an operation mode. This will be further described For example with reference to FIGS. 27 and 28.

The parameter information storing unit 122 may store information about operation parameters respectively corresponding to at least two block regions. The operation parameters represent parameters that constitute bias conditions for program, erase, and read operations. In this case, the operation parameters may have a plurality of bias sets, each bias set including bias values for the operation parameters. Hereinafter, for the convenience of a description, the operation parameters and the bias sets may be interchangeably used. In an exemplary embodiment, parameter information may be stored as a table showing operation parameters corresponding to respective block regions.

In the present exemplary embodiment, operation parameters may be determined according to block regions. Thus, the same operation parameters may apply to the same block region, and accordingly, program, erase, and read operations on different blocks included in the same block region may be performed using the same operation parameters.

In an exemplary embodiment, the parameter information storing unit 122 may store operation parameters that are modified according to an operation cycle count. For example, the parameter information storing unit 122 may store parameter information corresponding to an operation cycle count that is equal to or less than a threshold value and modified parameter information corresponding to an operation cycle count that is greater than the threshold value. Accordingly, different bias conditions may be applied to the same block according to an operation cycle count. This will be further described in detail with reference to FIGS. 43 through 49.

In an exemplary embodiment, the parameter information storing unit 122 may store operation parameters that are changed according to a data retention period. For example, the parameter information storing unit 122 may store parameter information corresponding to a data retention period that is equal to or less than a threshold value and modified parameter information corresponding to a data retention period that is greater than the threshold value. Accordingly, different bias conditions may be applied to the same block according to a data retention period. This will be further described For example with reference to FIGS. 52 through 55.

In an exemplary embodiment, the parameter information storing unit 122 may store parameters for, for example, modifying a type of an algorithm corresponding to an auxiliary operation that may be additionally performed in respective operation modes with respect to the memory cell array 110a, a detailed condition of the algorithms, and whether to perform an algorithm or not. This will be further described For example with reference to FIGS. 58 through 63.

The operation controller 123 may control an operation performed on each block region of the memory cell array 110a using block region information and parameter information. For example, if a program command is received, the operation controller 123 may search block region information for a block corresponding to an address, and may control a program operation by using an operation parameter corresponding to the block region.

Figure 17:
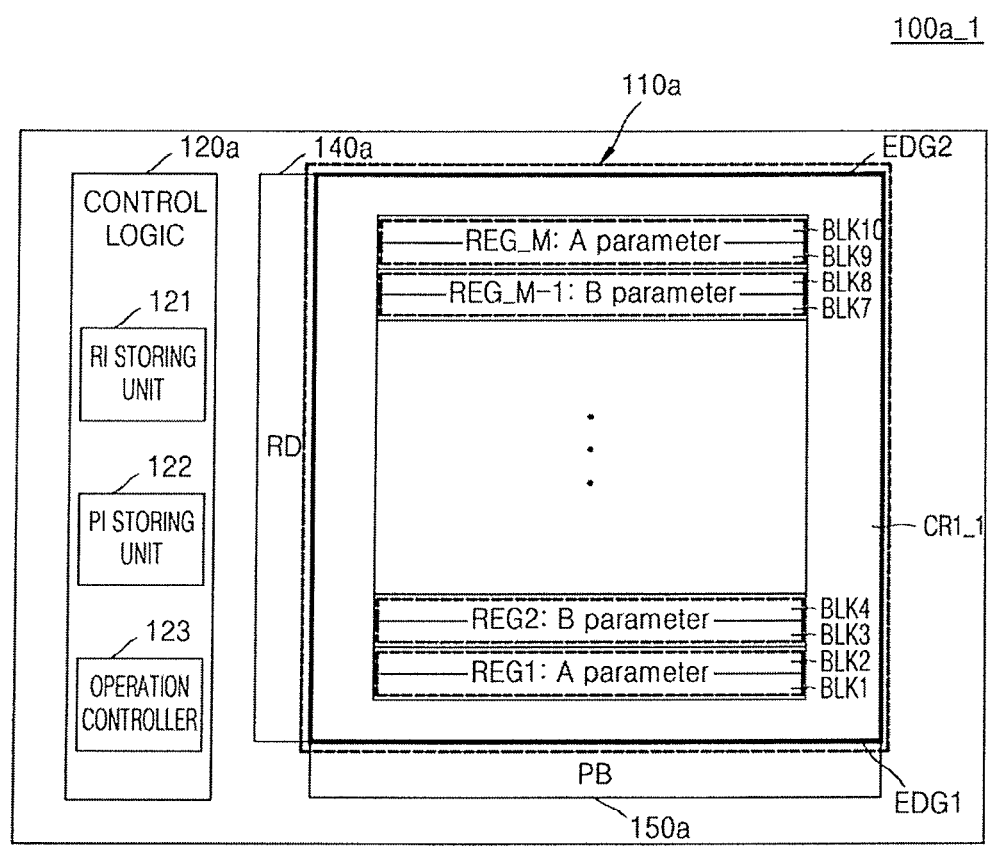
FIG. 17 illustrates a first modified example of the memory device of FIG. 15.

FIG. 17 illustrates a memory device 100a_1 which is a first modified example of the memory device 100a of FIG. 15.

Referring to FIG. 17, the memory device 100a_1 may include a memory cell array 110a, a control logic 120a, a row decoder 140a, and a page buffer 150a. The memory cell array 110a may include a cell region CR1_1, and the cell region CR1_1 may include a plurality of blocks BLK1 through BLK10. The memory cell array 110a according to the present exemplary embodiment corresponds to the memory cell array 110a of FIG. 3, and block regions may also be set with respect to the first through fourth cell regions CR1 through CR4 included in the memory cell array 110b of FIG. 4 as in the present exemplary embodiment.

According to the present exemplary embodiment, a plurality of blocks may be divided into M block regions based on a distance with respect to one of first and second edges EDG1 and EDG2 of the cell region CR1_1. For example, a plurality of blocks may be divided into M block regions based on a distance with respect to one of the first and second edges EDG1 and EDG2, and M may be an integer equal to or greater than 2. Thus, blocks that are substantially at the same distance from a relatively close edge may be included in different block regions.

In an exemplary embodiment, a plurality of blocks may be divided into M block regions based on an absolute distance with respect to the first edge EDG1 of the cell region CR1_1. In an exemplary embodiment, a plurality of blocks may be divided into M block regions based on a relative distance with respect to the first edge EDG1 of the cell region CR1_1. The plurality of blocks may be divided into M block regions according to an order in which they are disposed with respect to the first edge EDG1.

However, the exemplary embodiments are not limited thereto, and according to an exemplary embodiment, a reference used to set block regions may not be the first and second edges EDG1 and EDG2 but an arbitrary position in the cell region CR1_1. For example, a predetermined line in the cell region CR1_1 may be set as a reference, and block regions may be divided with respect to a distance from the line. As an example, two lines in the cell region CR1_1 may be set as references, and block regions may be divided with respect to an order in which blocks are disposed with respect to the lines.

A block region information storing unit 121 may store information about block regions of the cell region CR1_1 included in the memory cell array 110*a*. In the present exemplary embodiment, block region information may be generated by dividing a plurality of blocks into at least two block regions based on a distance with respect to one of the first and second edges EDG1 and EDG2 of the cell region CR1. In an exemplary embodiment, block region information may be stored as a table showing block regions for corresponding blocks.

FIG. 18 is a table REG_TABLE2 illustrating block region information stored in the block region storing unit 121 of FIG. 17 according to an exemplary embodiment Referring to FIG. 18, the table REG_TABLE2 stores information about block regions corresponding to respective blocks according to the method of setting block regions illustrated in FIG. 17. In the present exemplary embodiment, the first block BLK1 that is most adjacent to the first edge EDG1 and the second block BLK2 that is second most adjacent to the first edge EDG1 may correspond to the first block region REG1, and the third block BLK3 that is third most adjacent to the first edge EDG1 and the fourth block BLK4 that is fourth most adjacent to the first edge EDG1 may correspond to the second block region REG2. The tenth block BLK10 that is farthest from the first edge EDG1 and the ninth block BLK9 that is second farthest from the first edge EDG1 may correspond to an Mth block region REG_M.

In the present exemplary embodiment, operation parameters may be determined according to a distance with respect to a relatively close edge among the first and second edges EDG1 and EDG2. Thus, the same operation parameters may apply to different block regions. Accordingly, program, erase, and read operations on different blocks included in different block regions may be performed using the same operation parameters. Accordingly, the parameter information storing unit 122 may store information about operation parameters determined based on a distance with respect to the relatively close edge among the first and second edges EDG1 and EDG2 according to respective block regions.

For example, while the first block BLK1 and the tenth block BLK10 are included in the first block region REG1 and the Mth block region REG_M, respectively, the first block BLK1 and the tenth block BLK10 are respectively adjacent to the first and second edges EDG1 and EDG2. Thus, channel hole diameters of memory cells included in the first block BLK1 and the tenth block BLK10 may be substantially the same. Thus, although the tenth block BLK10 is included in a different block region from the first block BLK1, the same operation parameters as those with respect to the first block BLK1 may be applied to the tenth block BLK10.

Figure 19:
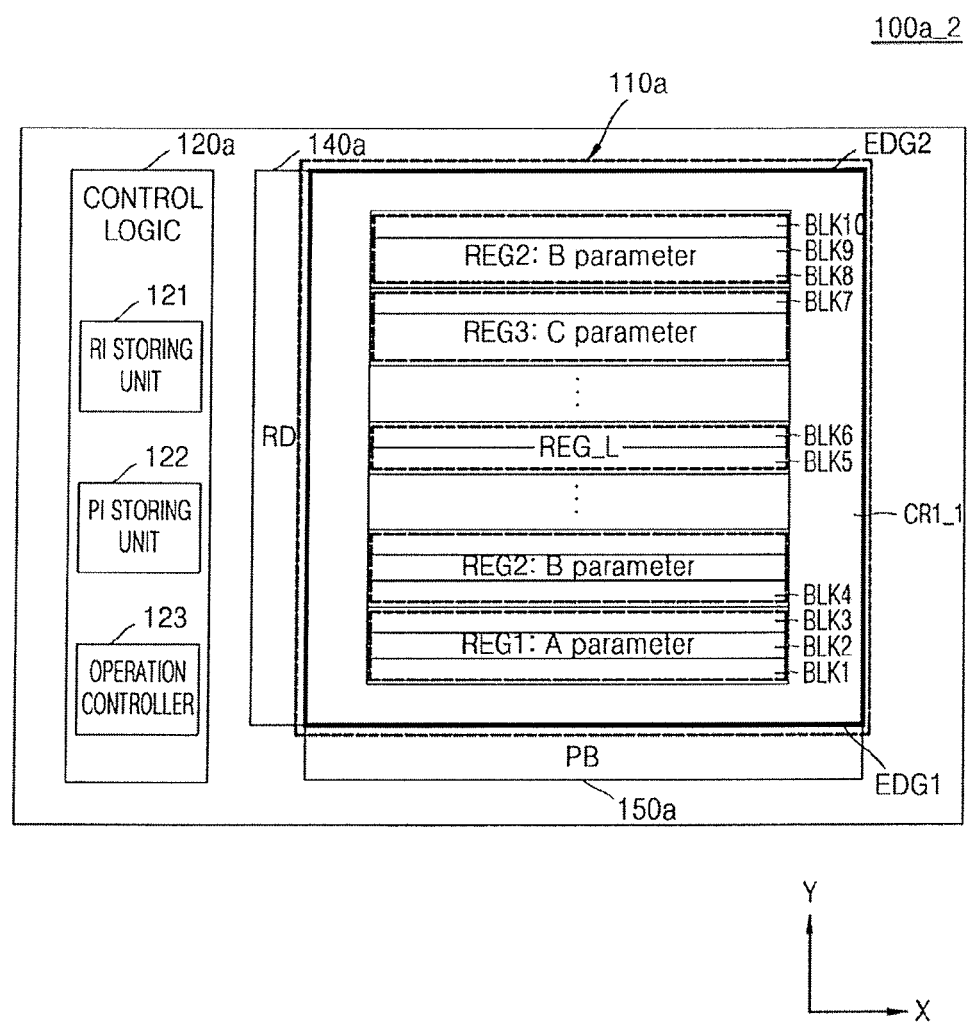
FIG. 19 illustrates a second modified example of the memory device of FIG. 15.

FIG. 19 illustrates a memory device 100*a*_2 which is a second modified example of the memory device 100*a* of FIG. 15.

Referring to FIG. 19, the memory device 100*a*_2 may include a memory cell array 110*a*, a control logic 120*a*, a row decoder 140*a*, and a page buffer 150*a*. The memory cell array 110*a* may include a cell region CR1_2, and the cell region CR1_2 may include a plurality of blocks BLK1 through BLK10. The memory cell array 110*a* according to the present exemplary embodiment corresponds to the memory cell array 110*a* of FIG. 3, and block regions may also be set with respect to the first through fourth cell regions CR1 through CR4 included in the memory cell array 110*b* of FIG. 4 as in the present exemplary embodiment.

According to the present exemplary embodiment, a plurality of blocks may be divided into L block regions based on a distance with respect to one of first and second edges EDG1 and EDG2 of the cell region CR1_2 and a distance with respect to the page buffer 150*a*. L may be an integer equal to or greater than 2. Thus, blocks that are substantially at the same distance from a relatively close edge may be included in different block regions.

As described above, operation parameters according to a geometrical shape of a memory cell may be different according to a distance with respect to the first and second edges EDG1 and EDG2. However, bias voltages to be applied to memory cells in reality may be different according to the distance with respect to the page buffer 150*a*. For example, the greater a distance between the page buffer 150*a* and a block, the higher may be a resistance component and a capacitance component of each bit line, and accordingly, a precharge voltage applied to a bit line via the page buffer 150*a* during a program operation may not be properly transmitted.

Thus, according to the present exemplary embodiment, unlike FIG. 17, some of operation parameters with respect to respective blocks may not be symmetrically determined with respect to a distance with respect to each of the first and second edges EDG1 and EDG2. According to the present exemplary embodiment, a bias condition with respect to an memory cell in reality may be determined by also considering a position of the page buffer 150*a*. However, the exemplary embodiments are not limited thereto, and block regions may also be set by considering not only the position of the page buffer 150*a* but also positions of other peripheral circuits such as the row decoder 140*a*.

The peripheral circuits such as the control logic 120*a*, the row decoder 140*a*, and the page buffer 150*a* may be asymmetrically arranged with respect to the cell region CR1_2. Thus, a distance between respective blocks and the peripheral circuits may be different according to the respective blocks so that other parameters that consider a distance between respective block regions and the peripheral circuits may be required in addition to parameters according to channel hole diameters of the respective block regions. Thus, in the present exemplary embodiment, block regions may be set by considering the parameters described above.

FIG. 20 is a table REG_TABLE3 illustrating block region information stored in a block region storing unit of FIG. 19 according to an exemplary embodiment Referring to FIG. 20, the table REG_TABLE3 stores information about block regions corresponding to respective blocks according to the method of setting block regions illustrated in FIG. 19. In the present exemplary embodiment, the first block BLK1 that is most adjacent to the first edge EDG1, the second block BLK2 that is second most adjacent to the first edge EDG1, and the third block BLK3 that is third most adjacent to the first edge EDG1 may correspond to the first block region REG1. The fourth block BLK4 that is fourth most adjacent to the first edge EDG1 may correspond to the second block region REG2. The tenth block BLK10 that is most adjacent to the second edge EDG2, the ninth block BLK9 that is second most adjacent to the second edge EDG2, and the eighth block BLK8 that is third most adjacent to the second edge EDG2 may correspond to the second block region REG2.

In the present exemplary embodiment, operation parameters may be determined according to block regions. Thus, the same operation parameters may apply to the same block region, and accordingly, program, erase, and read operations on different blocks included in the same block region may be performed using the same operation parameters. Accordingly, a parameter information storing unit 122 may store information about operation parameters according to respective block regions.

For example, as the first block BLK1 and the tenth block BLK10 are respectively adjacent to the first and second edges EDG1 and EDG2, memory cells included in the first block BLK1 and the tenth block BLK10 may have substantially the same channel hole diameters. However, since the first block BLK1 is disposed adjacent to the page buffer 150*a*, and the tenth block BLK10 is disposed relatively far from the page buffer 150*a*, a resistance component and a capacitance component of a bit line regarding the tenth block BLK10 may be higher than those of a bit line regarding the first block BLK1.

Thus, although the tenth block BLK10 is adjacent to the second edge EDG2, the tenth block BLK10 is included in a second block region REG1, which is different from a block region of the first block BLK1, and thus, different bias conditions (or bias sets) may be applied to the tenth block BLK10 from those applied to the first block BLK1. For example, parameter A may be applied to the first block BLK1 included in the first block region REG1, and parameter B may be applied to the tenth block BLK10 included in the second block region REG2.

Figure 21:
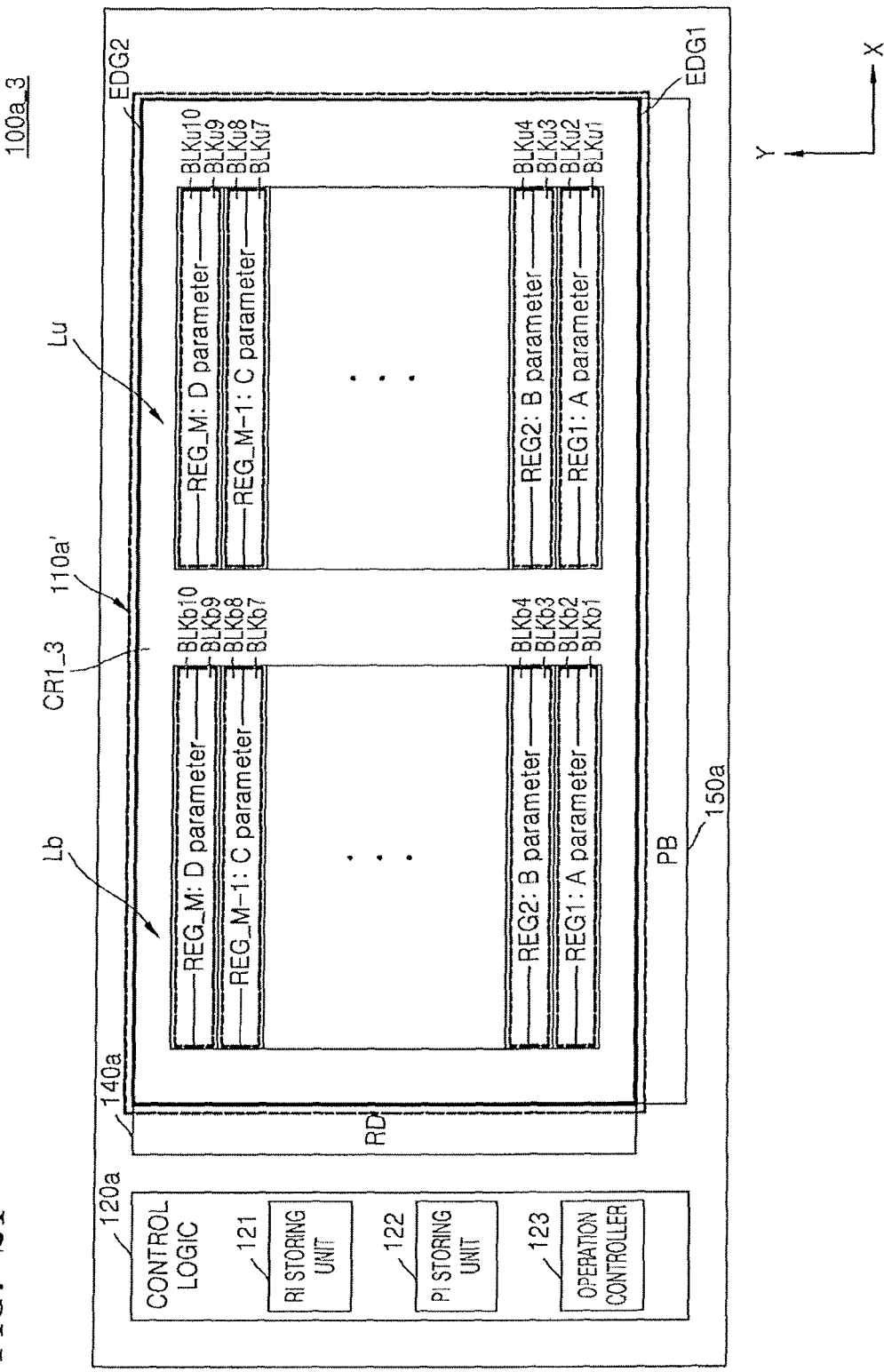
FIG. 21 illustrates a third modified example of the memory device of FIG. 15.

FIG. 21 illustrates a memory device 100*a*_3 which is a modified example of the memory device 100*a* of FIG. 15.

Referring to FIG. 21, the memory device 100*a*_3 may include a memory cell array 110*a*', a control logic 120*a*, a row decoder 140*a*, and a page buffer 150*a*. The memory cell array 110*a*' may include a cell region CR1_3, and the cell region CR1_3 may include a plurality of lower blocks BLKb1 through BLKb10 disposed in a lower layer Lb and a plurality of upper blocks BLKu1 through BLKu10 disposed in an upper layer Lu. The memory cell array 110*a*' may correspond to the memory cell array 110*a* of FIG. 3, and block regions may also be set with respect to the first through fourth cell regions CR1 through CR4 of FIG. 4 included in the memory cell array 110*b* of FIG. 4 as in the present exemplary embodiment. For the convenience of description, the lower layer Lb and the upper layer Lu are in a planar drawing, but the upper layer Lu is vertically stacked on the lower layer Lb.

Figure 22A:
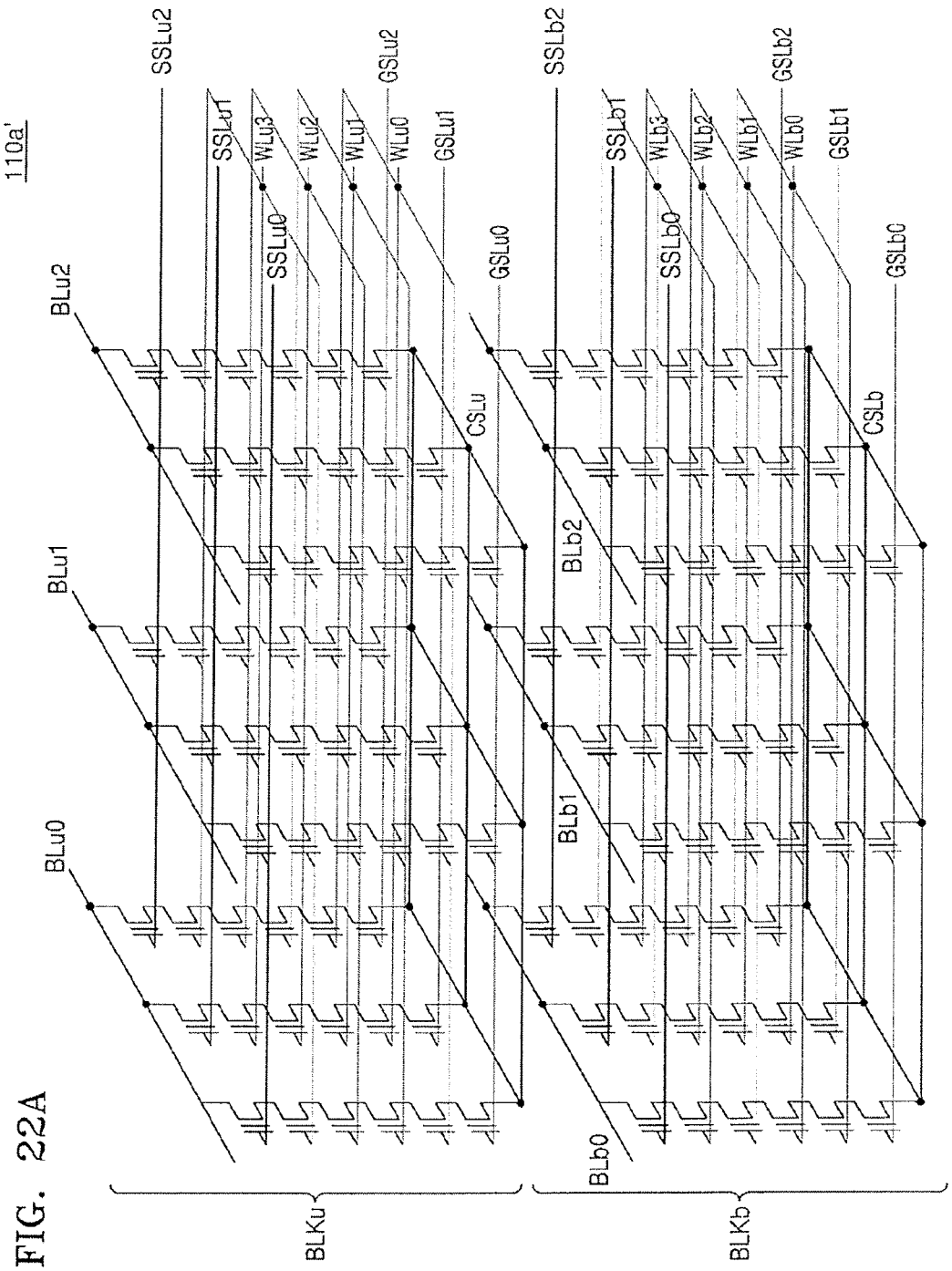
FIGS. 22A and 22B are circuit diagrams illustrating examples of a memory cell array of FIG. 21.
Figure 22B:
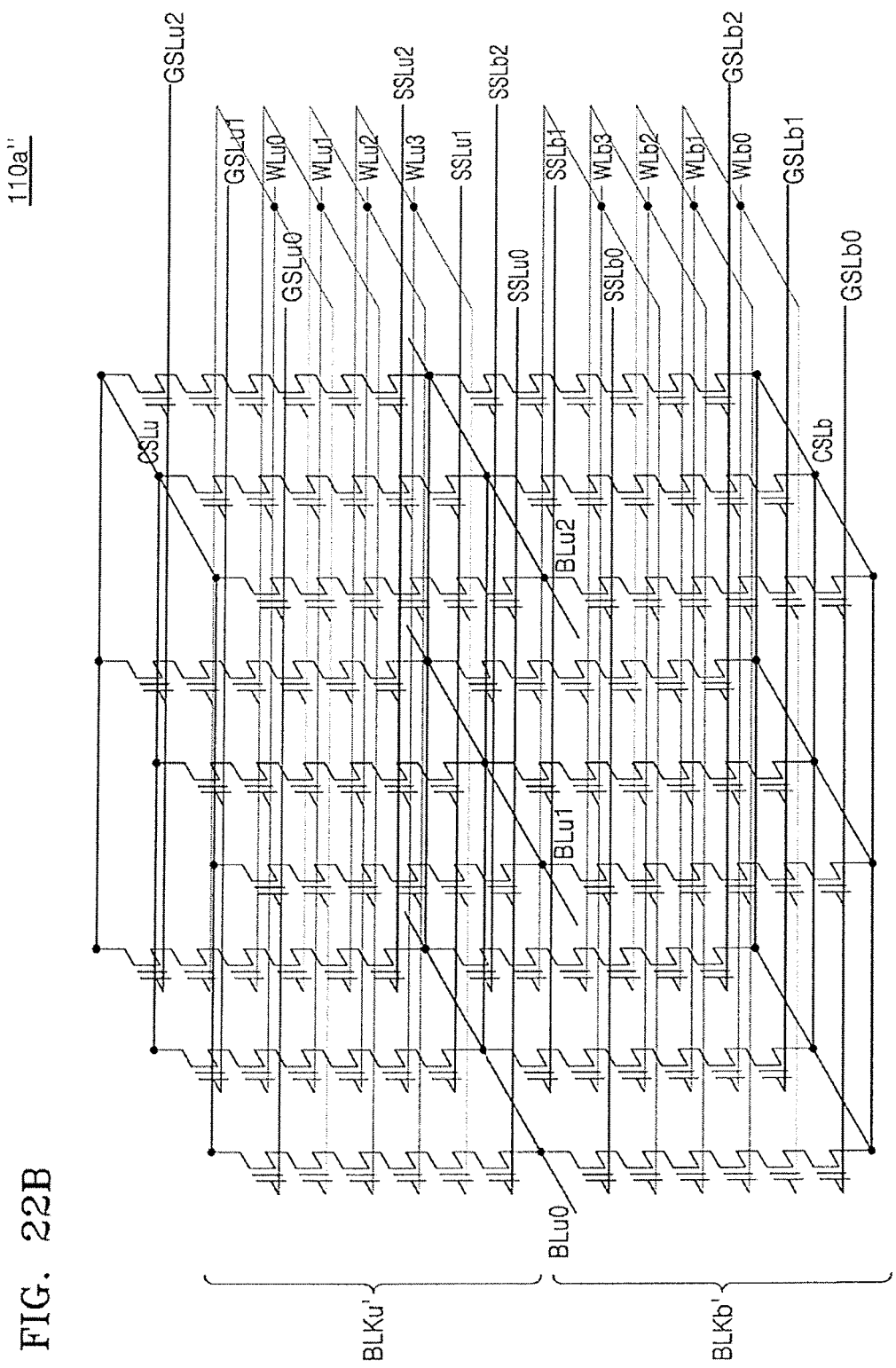

FIGS. 22A and 22B are circuit diagrams illustrating memory cell arrays 110*a*' and 110*a*" which are examples of the memory cell array of FIG. 21.

Referring to FIG. 22A, the memory cell array 110*a*' may include a plurality of blocks BLKb and BLKu that are vertically stacked. For example, the memory cell array 110*a*' may include a lower block BLKb disposed on a substrate and an upper block BLKu disposed on the lower block BLKb. The lower block BLKb and the upper block BLKu may be each a vertical NAND flash memory.

The lower block BLKb may include a plurality of NAND strings NSb, a plurality of word lines WLb0 to WLb3, a plurality of bit lines BLb0 to BLb2, a plurality of ground selection lines GSLb0 through GSLb2, a plurality of string selection lines SSLb0 through SSLb2, and a common source line CSLb. The number of NAND strings, the number of word lines, the number of bit lines, the number of ground selection lines, and the number of string selection lines may be variously changed according to exemplary embodiments.

The upper block BLKu may include a plurality of NAND strings NSu, a plurality of word lines WLu0 to WLu3, a plurality of bit lines BLu0 to BLu2, a plurality of ground selection lines GSLu0 through GSLu2, a plurality of string selection lines SSLu0 through SSLu2, and a common source line CSLu. The number of NAND strings, the number of word lines, the number of bit lines, the number of ground selection lines, and the number of string selection lines may be variously changed according to exemplary embodiments.

As described above, the lower block BLKb and the upper block BLKu may have a substantially similar form, and may have a substantially similar form to that of the first block BLK1 illustrated in FIG. 6. Thus, description provided with reference to FIG. 6 may also apply to the present exemplary embodiment, and thus repeated description will be omitted.

Referring to FIG. 22B, the memory cell array 110*a*" may include a plurality of blocks BLKb' and BLKu' that are vertically stacked. For example, the memory cell array 110*a*" may include a lower block BLKb' disposed on a substrate and an upper block BLKu' disposed on the lower block BLKb'. The lower block BLKb' and the upper block BLKu' may be each a vertical NAND flash memory. The memory cell array 110*a*" is a modified embodiment of the memory cell array 110*a*" of FIG. 22A, except that the memory cell array 110*a*" shares a plurality of bit lines BL0 to BL3, and here description will focus on differences only.

The lower block BLKb' may include a plurality of NAND strings NSb, a plurality of word lines WLb0 to WLb3, the plurality of bit lines BL0 to BL3, a plurality of ground selection lines GSLb0 through GSLb2, a plurality of string selection lines SSLb0 through SSLb2, and a common source line CSLb. The number of NAND strings, the number of word lines, the number of bit lines, the number of ground selection lines, and the number of string selection lines may be variously changed according to exemplary embodiments.

The upper block BLKu' may include a plurality of NAND strings NSu, a plurality of word lines WLu0 to WLu3, the plurality of bit lines BL0 to BL3, a plurality of ground selection lines GSLu0 through GSLu2, a plurality of string selection lines SSLu0 through SSLu2, and a common source line CSLu. The number of NAND strings, the number of word lines, the number of bit lines, the number of ground selection lines, and the number of string selection lines may be variously changed according to exemplary embodiments.

As described above, the upper block BLKu' may have a form corresponding to the lower block BLKb' that is inverted in a vertical direction with respect to the substrate, and the upper block BLKu' and the lower block BLKb' may share the plurality of bit lines BLb0 through BLb2.

Referring to FIG. 21 again, the plurality of lower blocks BLKb1 through BLKb10 disposed in the lower layer Lb may be divided into M block regions based on a distance with respect to one of the first and second edges EDG1 and EDG2 of the cell region CR1_3, and the plurality of upper blocks BLKu1 through BLKu10 disposed in the upper layer Lu may also be divided into M block regions based on a distance with respect to one of the first and second edges EDG1 and EDG2 of the cell region CR1_3. M may be an integer equal to or greater than 2.

In an exemplary embodiment, the same method of setting block regions may be applied to the plurality of lower blocks BLKb1 through BLKb10 disposed in the lower layer Lb and the plurality of upper blocks BLKu1 through BLKu10 disposed in the upper layer Lu. Accordingly, lower blocks and upper blocks that are substantially at the same distance with respect to the first edge EDG1 or the second edge EDG2 may be included in the same block regions.

The block region information storing unit 121 may store information about block regions of the cell region CR1_3 included in the memory cell array 110*a*'. In an exemplary embodiment, block region information may be generated by dividing a plurality of blocks into at least two block regions based on a distance with respect to one of the first and second edges EDG1 and EDG2 of the cell region CR1_3. In an exemplary embodiment, block region information may be stored as a table showing block regions for corresponding blocks.

FIG. 23 is a table REG_TABLE4 showing an example of block region information stored in the block region storing unit of FIG. 21.

Referring to FIG. 23, the table REG_TABLE4 stores information about block regions of blocks according to the method of setting block regions illustrated in FIG. 21. In an exemplary embodiment, the lower block BLKb1 and the upper block BLKu1 that are most adjacent to the first edge EDG1 and the lower block BLKb2 and the upper block BLKu2 that are second most adjacent to the first edge EDG1 may correspond to a first block region REG1. Also, the lower block BLKb3 and the upper block BLKu3 that are third most adjacent to the first edge EDG1 and the lower block BLKb4 and the upper block BLKu4 that are fourth most adjacent to the first edge EDG1 may correspond to a second block region REG2. Also, the lower block BLKb10 and the upper lower BLKu10 that are farthest from the first edge EDG1 and the lower block BLKb9 and the upper block BLKu9 that are second farthest from the first edge EDG1 may correspond to an Mth block region REG_M.

In an exemplary embodiment, operation parameters may be determined according to a distance with respect to a relatively close edge among the first and second edges EDG1 and EDG2. Thus, the same operation parameters may apply to different block regions. Accordingly, program, erase, and read operations on different blocks included in different block regions may be performed using the same operation parameters. Accordingly, the parameter information storing unit 122 may store information about operation parameters for each block regions determined based on a distance with respect to the relatively close edge among the first and second edges EDG1 and EDG2.

Figure 24:
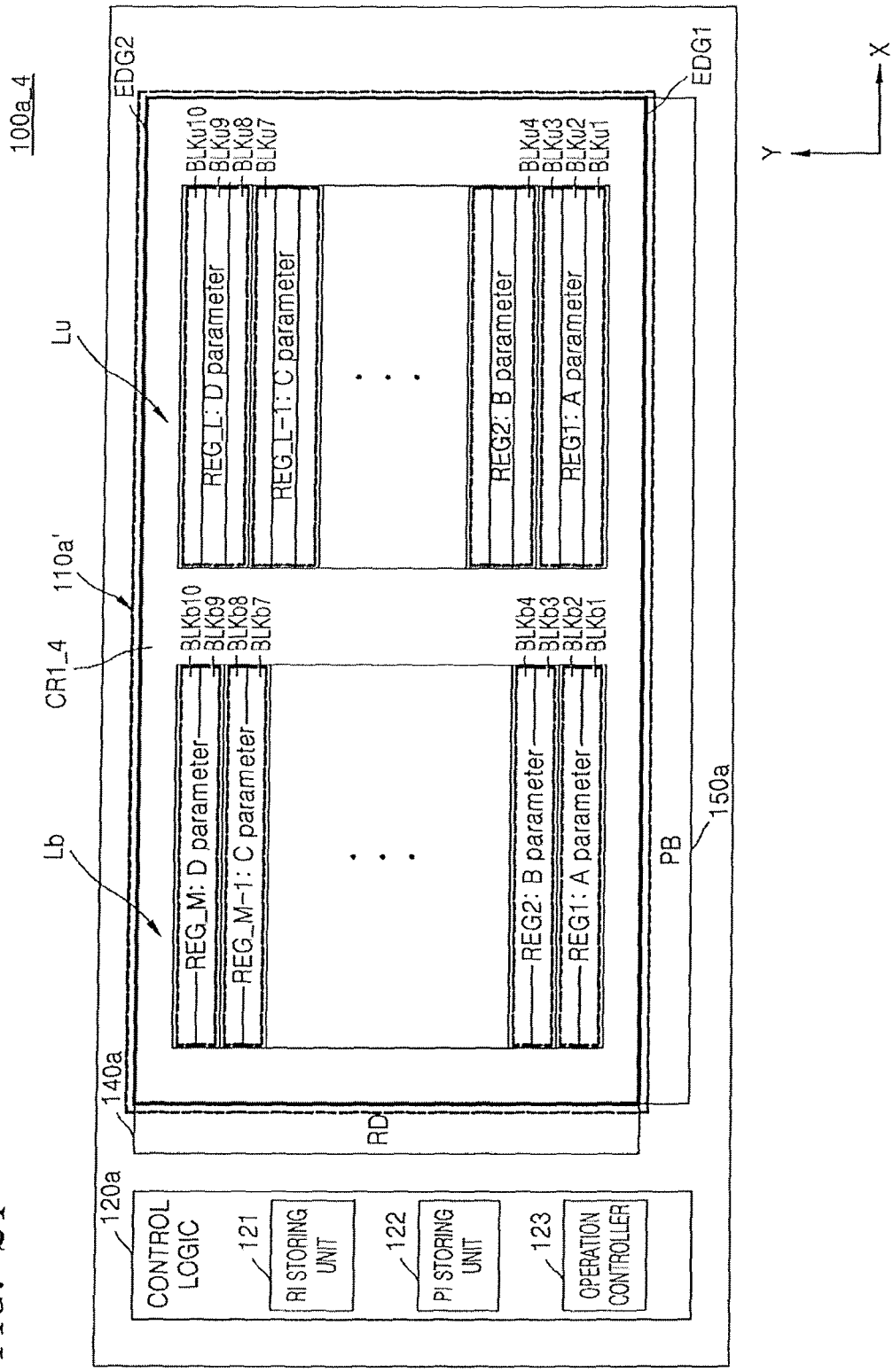
FIG. 24 illustrates a modified example of the memory device of FIG. 21.

FIG. 24 illustrates a memory device 100a_4 which is a modified example 100a_3 of the memory device of FIG. 21.

Referring to FIG. 24, the memory device 100a_4 may include a memory cell array 110a', a control logic 120a, a row decoder 140a, and a page buffer 150a. The memory cell array 110a' may include a cell region CR1_4, and the cell region CR1_4 may include a plurality of lower blocks BLK1 through BLK10 disposed in a lower layer Lb and a plurality of upper blocks BLKu1 through BLKu10 disposed in an upper layer Lu. The memory cell array 110a' may have a substantially similar form to the memory cell array 110a' of FIG. 22A or the memory cell array 110a" of FIG. 22B.

The plurality of lower blocks BLKb1 through BLKb10 disposed in the lower layer Lb may be divided into M block regions based on a distance with respect to one of the first and second edges EDG1 and EDG2 of the cell region CR1_4, and the plurality of upper blocks BLKu1 through BLKu10 disposed in the upper layer Lu may be divided into L block regions based on a distance with respect to one of the first and second edges EDG1 and EDG2 of the cell region CR1_4. M and L may each be an integer equal to or greater than 2. In an exemplary embodiment, M and L may be identical, or in an exemplary embodiment, M and L may be different from each other.

According to an exemplary embodiment, different methods of setting block regions may be applied to the plurality of lower blocks BLKb1 through BLKb10 disposed in the lower layer Lb and the plurality of upper blocks BLKu1 through BLKu10 disposed in the upper layer Lu. Accordingly, lower blocks and upper blocks that are substantially at the same distance from the first edge EDG1 or the second edge EDG2 may be included in different block regions.

The block region information storing unit 121 may store information about block regions of the cell region CR1_4 included in the memory cell array 110a'. In an exemplary embodiment, block region information may be generated by dividing a plurality of blocks into at least two block regions based on a distance from one of the first and second edges EDG1 and EDG2 of the cell region CR1_4. In an exemplary embodiment, block region information may be stored as a table showing block regions for corresponding blocks.

FIG. 25 is a table REG_TABLE5 showing an example of block region information stored in a block region storing unit 121 of FIG. 24.

Referring to FIG. 25, the table REG_TABLE5 stores information about block regions for blocks according to the method of setting block regions illustrated in FIG. 24. The lower block BLKb1 that is most adjacent to the first edge EDG1, the lower block BLKb2 that is second most adjacent to the first edge EDG1, the upper block BLKu1 that is most adjacent to the first edge EDG1, the upper block BLKu2 that is second most adjacent to the first edge EDG1, and the upper block BLKu3 that is third most adjacent to the first edge EDG1 may correspond to a first block region REG1. Also, the lower block BLKb3 that is third most adjacent to the first edge EDG1, the lower block BLKb4 that is fourth most adjacent to the first edge EDG1, and the upper block BLKu4 that is fourth most adjacent to the first edge EDG1 may correspond to a second block region REG2. Also, the lower block BLKb10 that is farthest from the first edge EDG1 and the lower block BKLb9 that is second farthest from the first edge EDG1 may correspond to an Mth block region REG_M. Also, the upper lower BLKu10 that is farthest from the first edge EDG1 and the upper block BLKu9 that is second farthest from the first edge EDG1 and the upper block BLKu8 that is third farthest from the first edge EDG1 may correspond to an Lth block region REG_L.

In an exemplary embodiment, information of operation parameters may be determined based on a distance with respect to a relatively close edge among the first and second edges EDG1 and EDG2. Thus, the same information of the operation parameters may apply to different block regions. Accordingly, program, erase, and read operations on different blocks included in different block regions may be performed using the same operation parameters. Accordingly, the parameter information storing unit 122 may store information about operation parameters determined based on the distance with respect to the relatively close edge among the first and second edges EDG1 and EDG2 according to respective block regions.

Figure 26:
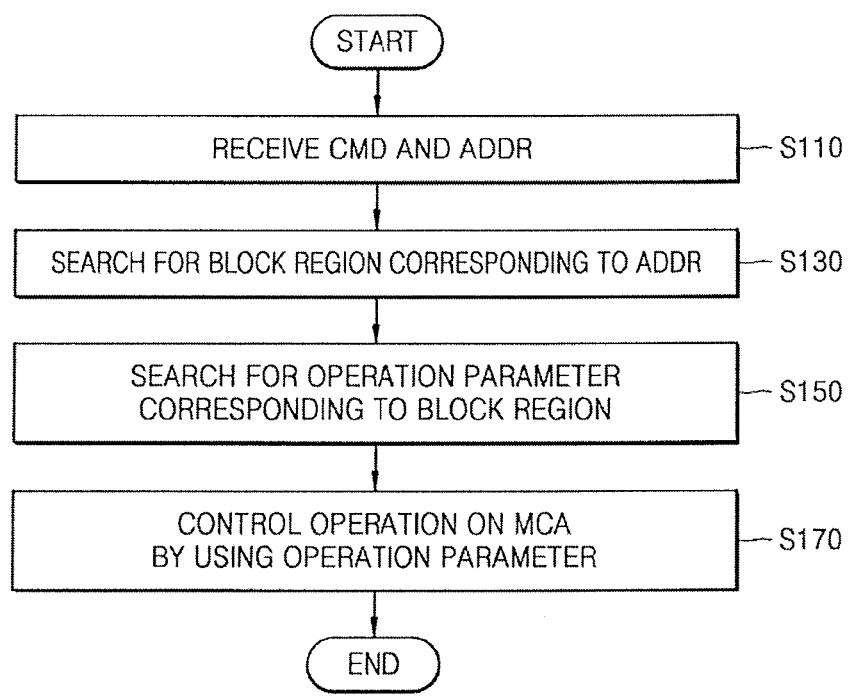
FIG. 26 is a flowchart of a method of operating a memory device according to an exemplary embodiment of the present inventive concept.

FIG. 26 is a flowchart of a method of operating a memory device according to an exemplary embodiment of the present inventive concept.

Referring to FIG. 26, the method of operating a memory device may include controlling an operation on a memory cell array performed in a control logic when a command and an address are received from a memory controller. The method may include, for example, operations that are sequentially performed in the control logic 120a of FIG. 15. The description provided with reference to FIGS. 1 through 25 may also apply to the method of the present exemplary embodiment, and repeated description will be omitted.

In operation S110, a command and an address are received from a memory controller. For example, the control logic 120a may receive a command and an address from the memory controller to thereby initiate an operation of the control logic 120a. In operation S130, a block region corresponding to the received address is searched for. For example, the operation controller 123 may search the block region information storing unit 121 for a block corresponding to the address. In operation S150, operation parameter information corresponding to the block region is searched for. For example, the operation controller 123 may search the parameter information storing unit 122 for the operation parameter information corresponding to the block region.

In operation S170, an operation on a memory cell array is controlled using operation parameter information. For example, the operation controller 123 may generate a voltage control signal CTRL_vol according to operation parameter information, and may provide the voltage generator 130 (see FIG. 2) with the voltage control signal CTRL_vol. Also, the operation controller 123 may generate a row address X-ADDR that is activated during an operation according to the operation parameter information, and provide the row decoder 140a with the row address X-ADDR. Also, the operation controller 132 may generate a column address Y-ADDR that is activated during an operation according to the operation parameter information, and provide the page buffer 150a with the column address Y-ADDR.

Figure 27:
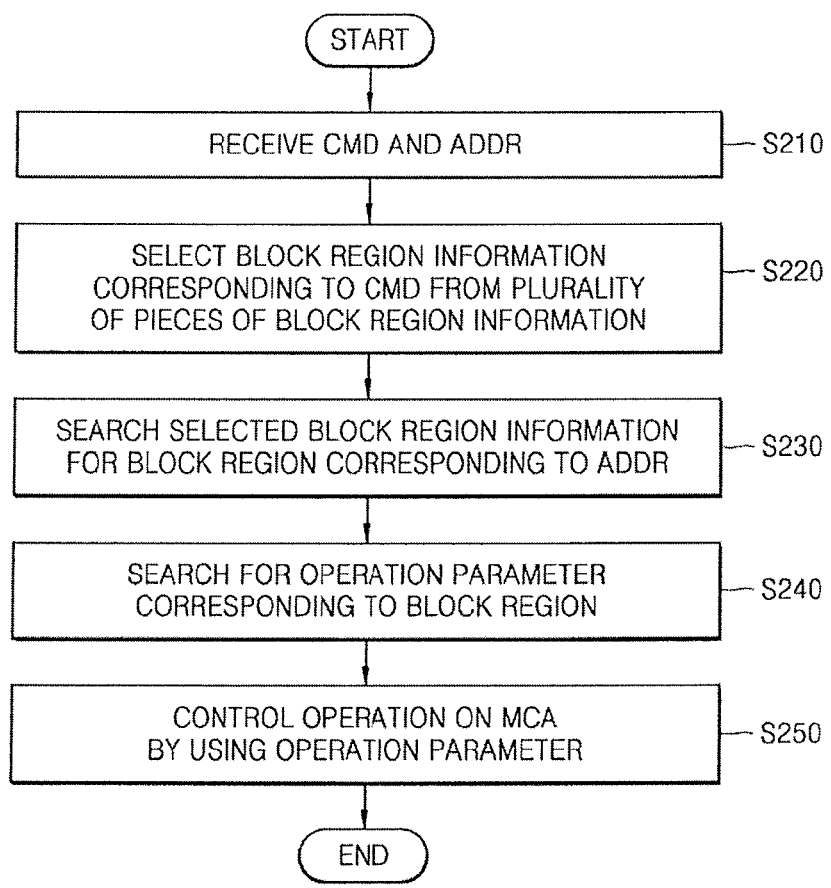
FIG. 27 is a flowchart of a method of operating a memory device according to an exemplary embodiment of the present inventive concept.

FIG. 27 is a flowchart of a method of operating a memory device according to an exemplary embodiment of the present inventive concept.

Referring to FIG. 27, the method may include controlling an operation on a memory cell array performed in a control logic when a command and an address are received from a memory controller. The method may include, for example, operations that are sequentially performed in the control logic 120a of FIG. 15. The method according to the present exemplary embodiment is a modified example of the method illustrated in FIG. 26, and the description provided with reference to FIGS. 1 through 26 may apply to the method of the present exemplary embodiment, and repeated description will be omitted.

In operation S210, a command and an address are received from a memory controller. For example, the control logic 120a may receive a command and an address from the memory controller to thereby initiate an operation of the control logic 120a.

In operation S220, block region information corresponding to the command is selected from a plurality of pieces of block region information. In an exemplary embodiment, different methods of setting block regions may be applied according to commands, and the block region information storing unit 121 may store block region information according to the commands. For example, the block region information storing unit 121 may divide blocks included in a cell region into block regions according to a first method of setting block regions if a program command is received. The block region information storing unit 121 may divide blocks included in a cell region into block regions according to a second method of setting block regions if an erase command is received. The block region information storing unit 121 may divide blocks included in a cell region into block regions according to a third method of setting block regions if a read command is received. The block region information storing unit 121 may divide blocks included in a cell region into block regions according to a fourth method of setting block regions if a read recovery command is received.

FIG. 28 is a table REG_TABLE6 showing an example of block region information stored in a block region storing unit according to an exemplary embodiment of the present inventive concept.

Referring to FIG. 28, the table REG_TABLE6 includes block region information for a plurality of operations, and each piece of block region information stores information about block regions assigned to blocks. The plurality of pieces of block region information may be stored in the block region information storing unit 121 illustrated in FIG. 15, 17, 19, 21 or 24.

In an exemplary embodiment, the plurality of pieces of block region information may include block region information regarding a program operation, block region information regarding an erase operation, block region information regarding a read operation, and block region information regarding a read recovery operation. A read recovery operation is an operation to correct or restore a read error occurred in a memory device, and may be performed using an algorithm referred to as a 'defence code'. Various defence code algorithms corresponding to a read recovery operation will be described in detail later with reference to FIG. 59.

When a program command is received from a memory controller, the operation controller 123 may select block region information regarding a program operation from the block region information unit 121. For example, according to block region information regarding a program operation, first and second blocks BLK1 and BLK2 may correspond to a first block region REG1; third and fourth blocks BLK3 and BLK4 may correspond to a second block region REG2; fifth and sixth blocks BLK5 and BLK6 may correspond to a third block region REG3; seventh and eighth blocks BLK7 and BLK8 may correspond to a fourth block region REG4; and ninth and tenth blocks BLK9 and BLK10 may correspond to a fifth block region REG5.

When an erase command is received from a memory controller, the operation controller 123 may select block region information regarding an erase operation from the block region information unit 121. For example, according to block region information regarding an erase operation, first and second blocks BLK1 and BLK2 may correspond to a first block region REG1; third through eighth blocks BLK3 through BLK8 may correspond to a second block region REG2; and ninth and tenth blocks BLK9 and BLK10 may correspond to a third block region REG3.

When a read command is received from a memory controller, the operation controller 123 may select block region information regarding a read operation from the block region information unit 121. For example, according to block region information regarding a read operation, first through third blocks BLK1 through BLK3 may correspond to a first block region REG1; fourth through seventh blocks BLK4 through BLK7 may correspond to a second block region REG2; and eighth through tenth blocks BLK8 through BLK10 may correspond to a third block region REG3.

When a read recovery command is received from a memory controller, the operation controller 123 may select block region information regarding a read recovery operation from the block region information unit 121. For example, according to block region information regarding a read recovery operation, first through fourth blocks BLK1 through BLK4 may correspond to a first block region REG1; fifth and sixth blocks BLK5 and BLK6 may correspond to a second block region REG2; and seventh through tenth blocks BLK7 through BLK10 may correspond to a third block region REG3.

Read error may occur for various causes, and such causes may be different according to positions of blocks in a cell region. For example, when a read operation is performed several times on memory cells included in a first block BLK1 having a first channel hole diameter, an upper voltage level of the memory cells in an erase state may increase due to a read inhibit voltage, thereby causing a read error. Meanwhile, in regard to memory cells included in a fifth block BLK5 having a second channel hole diameter greater than the first channel hole diameter, a lower voltage level of the memory cells in an upper program state such as first through third program states may be decreased according to passage of time, thereby causing a read error.

Thus, a read recovery operation to correct a read error may be performed based on block region information. A method of setting block regions for a read recovery operation may be different from a method of setting block regions with respect to program, erase, and read operations. Accordingly, different block regions having, for example, the same operation cycles or having the same data retention periods, may have different operation parameter information.

As described above, the block region storing unit 121 may store block region information according to commands, and thus, a block may be allocated to different block regions according to program, erase, read, and read recovery operations.

Referring to FIG. 27 again, in operation S230, selected block region information is searched for a block corresponding to the address. In operation S240, operation parameter information corresponding to the block region is searched for. In operation S250, an operation on a memory cell array is controlled using the operation parameter information.

In an exemplary embodiment, when a program command is applied, the operation controller 123 may search block region information regarding a program operation for a block corresponding to an address. For example, if the address corresponds to a fifth block BLK5, a third block region REG3 corresponding to the fifth block BLK5 is searched for, and next, operation parameter information corresponding to the third block region REG3 may be searched for. Next, a program operation on the fifth block BLK5 may be performed using the operation parameter information.

In an exemplary embodiment, if a read command is applied, the operation controller 123 may search block region information regarding a read operation for a block corresponding to an address. For example, if the address corresponds to a fifth block BLK5, a second block region REG2 corresponding to the fifth block BLK5 is searched for, and next, an operation parameter corresponding to the second block region REG2 may be searched for. Next, a read operation on the fifth block BLK5 may be performed using the operation parameter.

FIG. 29 is a table PAR_TABLE1 showing bias conditions of a program operation according to an exemplary embodiment of the present inventive concept.

Referring to FIG. 29, the table PAR_TABLE1 shows bias conditions of a program operation on a first block region REG1 and an Nth block region REG_N, for example, of a cell region CR1 of FIG. 15. The table PAR_TABLE1 may be stored in the parameter information storing unit 122 of FIG. 15. The present inventive concept is not limited thereto, and in an exemplary embodiment, the table PAR_TABLE1 may further include bias conditions of a program operation on the other block regions REG2 to REGN−1 of the cell region CR1 of FIG. 15, for example.

The first block region REG1 may include, for example, blocks adjacent to the first and second edges EDG1 and EDG2 of the cell region CR1, and the Nth block region REG_N may include, for example, blocks in a center of the cell region CR1. Accordingly, a channel hole diameter of strings included in the first block region REG1 may be smaller than a channel hole diameter of strings included in the Nth block region REG_N. Accordingly, if a same bias condition for a program operation is applied to the first region REG1 and the Nth block region REG_N, program speeds with respect to memory cells included in the first block region REG1 may be higher than a program speed with respect to memory cells included in the Nth block region REG_N.

In an exemplary embodiment, bias conditions of a program operation may be set for each block region to reduce a difference of program speeds between the first block region REG1 and the Nth block region REG_N. For example, the bias conditions of the program operation may be set such that the program speed of the first block region REG1 may be reduced. Accordingly, a program distribution of memory cells included in the first block region REG1 may be adjusted to be similar to a program distribution of memory cells included in the Nth block region REG_N. Hereinafter, bias conditions according to each block region of a program operation will be described. The bias conditions described below include various operation parameters. According to an exemplary embodiment, some of the operation parameters may be applied only, or other operation parameters may be additionally applied.

In an exemplary embodiment, during a program operation on the first block region REG1, a first program voltage Vpgm1 less than a second program voltage Vpgm2 may be applied to a selected word line WL_sel, and during a program operation on the Nth block region REG_N, the second program voltage Vpgm2 that is higher than the first program voltage Vpgm1 may be applied. Accordingly, memory cells in a same page or in a same height may have different program voltages according to block locations of the memory cells. For example, a first memory cell disposed in a block adjacent to an edge of a cell region is subject to a program voltage lower than a program voltage for a second memory cell disposed in a block in a centre region of the cell region. The first and the second memory cells are disposed within the same page.

In an exemplary embodiment, a program operation may be performed using an incremental step pulse programming (ISPP) method in which a program voltage applied to a word line is increased stepwise as a value of a program loop increases. Here, a program voltage may be increased with respect to the first block region REG1 by a first program voltage increment Vinc1 as a value of a loop increases, and a program voltage may be increased with respect to the Nth block region REG_N by a second program voltage increment Vinc2 that is greater than the first program voltage increment Vinc1, as a value of a loop increases.

In an exemplary embodiment, a program operation may be performed on the first block region REG1 during a first program duration Tpgm1, and a program operation may be performed on the Nth block region REG_N during a second program duration Tpgm2 that is longer than the first program duration Tpgm1. In an exemplary embodiment, a program operation may be performed such that a program duration increases stepwise as a value of a loop increases. Here, a program duration may be increased with respect to the first block region REG1 by a first time increment Tinc1, as a value of a loop increases, and a program duration may be increased with respect to the Nth block region REG_N by a second time increment Tinc2 which is longer than the first time increment Tinc1, as a value of a loop increases.

In an exemplary embodiment, a program loop includes a program operation and a verify operation that are sequentially performed, and the verify operation may be omitted in a predetermined number of initial program loops. The initial program loop without the verify operation may be referred to as a 'verify skip loop.' As a program speed with respect to the first block region REG1 is relatively high, a verify operation may be omitted only during a first verify skip loop Ls1, and a verify operation may be omitted with respect to the Nth block region REG_N during a second verify skip loop Ls2 which is greater than the first verify skip loop Ls1.

In an exemplary embodiment, the number of maximum loops according to ISPP may be preset. A first maximum loop Lm1 may be set with respect to the first block region REG1, and a second maximum loop Lm2 that is greater than the first maximum loop Lm1 may be set with respect to the Nth block region REG_N.

In an exemplary embodiment, a first program inhibit voltage Vinhp1 may be applied to a non-selected word line WL_unsel included in the first block region REG1, and a second program inhibit voltage Vinhp2 that is higher than the first program inhibit voltage Vinhp1 may be applied to a non-selected word line WL_unsel included in the Nth block region REG_N. In an exemplary embodiment, a first program verify voltage Vpvrf1 may be applied during a program verify operation on the first block region REG1, and a second program verify voltage Vpvrf2 that is higher than the first program verify voltage Vpvrf1 may be applied during a program verify operation on the Nth block region REG_N.

As described above, as at least one block or each block is set to have different bias conditions of operation parameters due to a difference in channel hole diameters, performance of memory cells may also be different deepening on the memory cells' block regions. In an exemplary embodiment, to reduce a difference in performance of the block regions, the operation controller 123 may check an address input from the outside and perform an auxiliary operation on some of the block regions by modifying an algorithm regarding a program operation. In an exemplary embodiment, the operation controller 123 may additionally perform an operation on some of block regions according to a command input from the outside by using a difference in performance of the block regions. In an exemplary embodiment, to reduce a difference in performance of block regions, the operation controller 123 may perform a background operation such as a garbage collection operation, on some of the block regions.

However, the present inventive concept is not limited thereto. For example, if blocks of cell regions CR1 through CR4 of the memory cell array 110b illustrated in FIG. 4 are simultaneously selected during a program operation, and if the memory device 100a does not have voltage sources allocated to each cell region, different parameters need not be applied to respective block regions.

Figure 30A:
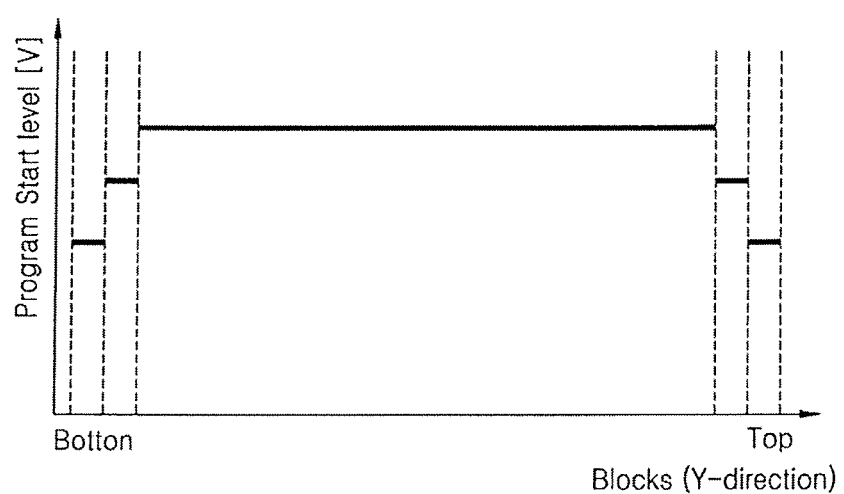
FIG. 30A is a graph showing program start voltage levels of respective blocks according to an exemplary embodiment of the present inventive concept.

FIG. 30A is a graph showing program start voltage levels of blocks according to an exemplary embodiment of the present inventive concept.

Referring to FIG. 30A, a horizontal axis denotes positions of blocks in the second direction of FIG. 9. The second direction may be in parallel to an extension direction of a bit line, and a vertical axis denotes a program start voltage. As described above with reference to FIG. 11, a threshold voltage of programmed memory cells included in a cell region may have a U shape along the second direction. To compensate for a program speed according to the block positions, a first program start voltage may be set with respect to block regions disposed in an edge region of a cell region, for example, block regions adjacent to an edge, and a second program start voltage may be set with respect to block regions in a center of the cell region. In an exemplary embodiment, the first program start voltage may be lower than the second program start voltage. The difference between the first program start voltage and the second program start voltage may be set to the extent that a program speed may be compensated for the blocks disposed in the edge region of the cell region.

For example, blocks included in a cell region may be divided into three block regions based on a distance with respect to two edges of the cell region. Block regions may be set such that blocks that are most adjacent to the two edges of the cell region are included in a first block region, and blocks that are second most adjacent to the two edges of the cell region are included in a second block region, and blocks in a center of the cell region are included in a third block region. Hereinafter, program operation parameters regarding the first through third block regions will be described.

In an exemplary embodiment, the lowest program start voltage may be set with respect to the first block region, and an intermediate program start voltage may be set with respect to the second block region, and the highest program start voltage may be set with respect to the third block region. In an exemplary embodiment, a program start voltage may be increased stepwise from an edge towards the center of the cell region.

Figure 30B:
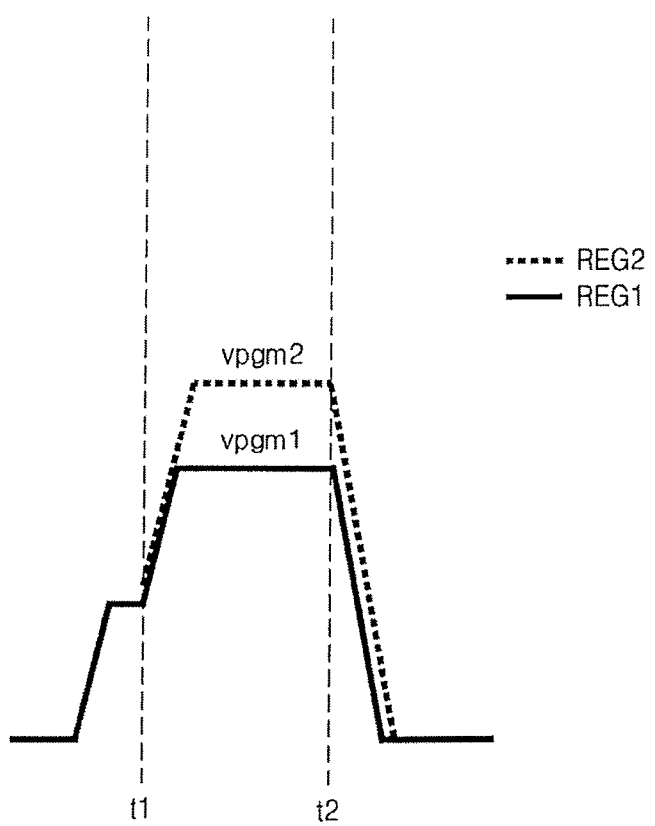
FIG. 30B is a graph showing program start voltages with respect to different block regions according to an exemplary embodiment of the present inventive concept.

FIG. 30B is a graph showing program start voltages with respect to different block regions according to an exemplary embodiment of the present inventive concept.

Referring to FIG. 30B, blocks included in a cell region may be divided into a first block region REG1 adjacent to two edges of the cell region and a second block region REG2 in a center of the cell region. In an exemplary embodiment, the same program duration may be set with respect to the first and second block regions REG1 and REG2, and a program start voltage Vpgm1 regarding the first block region REG1 may be set to be lower than a program start voltage Vpgm2 regarding the second block region REG2.

Figure 31A:
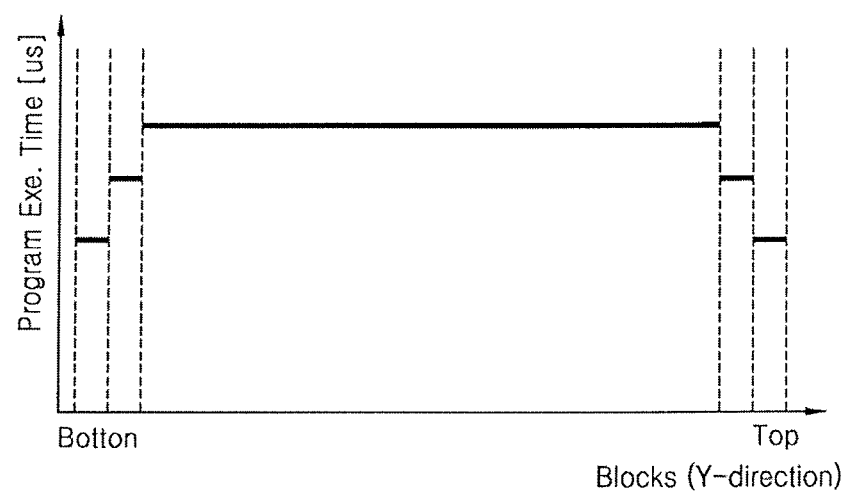
FIG. 31A is a graph showing program durations of respective blocks according to an exemplary embodiment of the present inventive concept.

FIG. 31A is a graph showing program duration of respective blocks according to an exemplary embodiment of the present inventive concept.

Referring to FIG. 31A, a horizontal axis denotes positions of blocks according to an extension direction of a bit line, and a vertical axis denotes a program duration, for example, a program execution time. In the present exemplary embodiment, to compensate for differences of program speeds among blocks, a first program duration may be set with respect to block regions adjacent to an edge of a cell region, and a second program duration may be set with respect to block regions in a center of the cell region. In an exemplary embodiment, the first program duration time may be shorter than the second program duration time.

In an exemplary embodiment, the shortest program duration may be set with respect to a first block region, and an intermediate program duration may be set with respect to a second block region, and the longest program duration may be set with respect to a third block region. In an exemplary embodiment, a program duration may be increased stepwise from an edge to a center of a cell region.

Figure 31B:
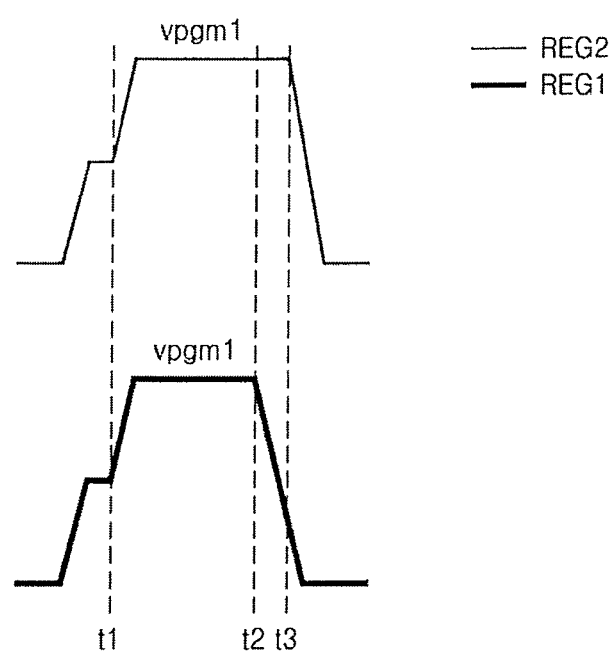
FIG. 31B is a graph showing program durations with respect to different block regions according to an exemplary embodiment of the present inventive concept.

FIG. 31B is a graph showing program duration with respect to different block regions according to an exemplary embodiment of the present inventive concept.

Referring to FIG. 31B, blocks included in a cell region may be divided into a first block region REG1 adjacent to two edges of the cell region and a second block region REG2 in a center of the cell region. In an exemplary embodiment, the same program start voltage Vpgm1 may be set with respect to the first and the second block regions REG1 and REG2, and a program duration regarding the first block region REG1 may be set to be from a first time t1 to a second time t2, and a program duration regarding the second block region REG2 may be set to be from the first time t1 to a third time t3. As described above, the program duration regarding the first block region REG1 may be set to be shorter than the program duration regarding the second block region REG2.

Figure 32:
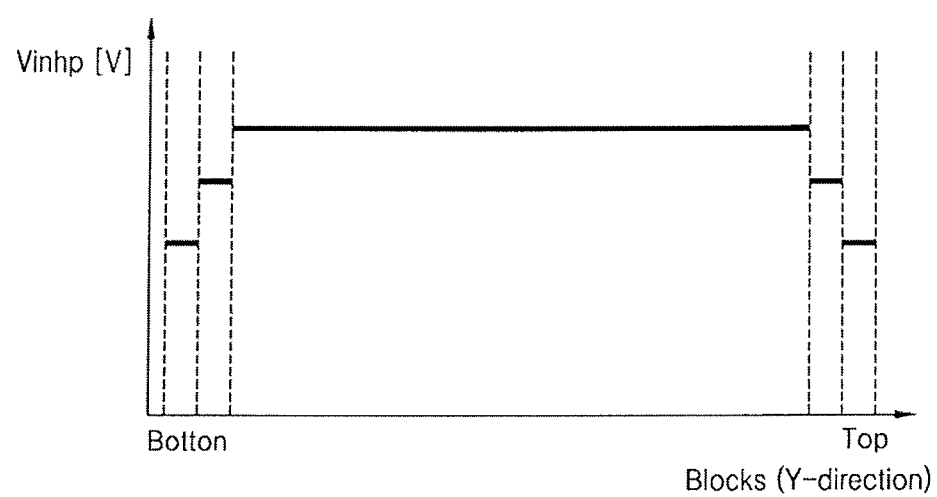
FIG. 32 is a graph showing program inhibit voltages of respective blocks, according to an exemplary embodiment of the present inventive concept.

FIG. 32 is a graph showing program inhibit voltages of respective blocks, according to an exemplary embodiment of the present inventive concept.

Referring to FIG. 32, a horizontal axis denotes positions of blocks according to an extension direction of a bit line, and a vertical axis denotes a program inhibit voltage. In the present exemplary embodiment, to compensate for a program speed with respect to respective block positions, a first program inhibit voltage may be set with respect to block regions adjacent to an edge of a cell region, and a second program inhibit voltage may be set with respect to block regions in a center of the cell region. In an exemplary embodiment, the second program inhibit voltage may be higher greater than the first program inhibit voltage.

In an exemplary embodiment, the lowest program inhibit voltage may be set with respect to a first block region, and an intermediate program inhibit voltage may be set with respect to a second block region, and the highest program inhibit voltage may be set with respect to a third block region. In an exemplary embodiment, a program inhibit voltage may be increased stepwise from an edge of an cell region towards a center of the cell region.

Figure 33:
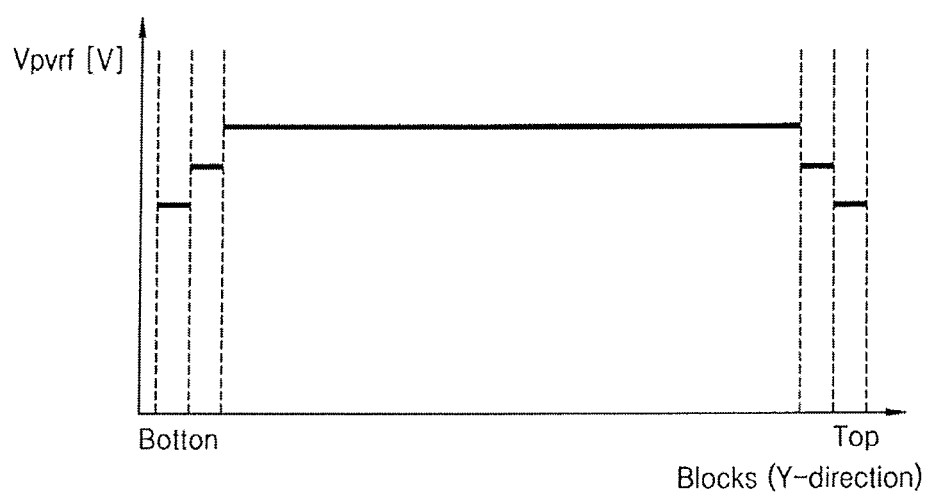
FIG. 33 is a graph showing programming verify voltages of respective blocks according to an exemplary embodiment of the present inventive concept.

FIG. 33 is a graph showing programming verify voltages of blocks according to an exemplary embodiment of the present inventive concept.

Referring to FIG. 33, a horizontal axis denotes positions of blocks according to an extension direction of a bit line, and a vertical axis denotes a program verify voltage. In the present exemplary embodiment, in order to compensate for a program speed with respect to respective block positions, a first program verify voltage may be set with respect to block regions adjacent to an edge of a cell region, and a second program verify voltage may be set with respect to block regions in a center of the cell region. In an exemplary embodiment, the second program verify voltage may be greater than the first program verify voltage.

In an exemplary embodiment, the lowest program verify voltage may be set with respect to a first block region, and an intermediate program verify voltage may be set with respect to a second block region, and the highest program verify voltage may be set with respect to a third block region. In an exemplary embodiment, a program verify voltage may be increased stepwise from an edge of a cell region towards a center of the cell region.

Figure 34:
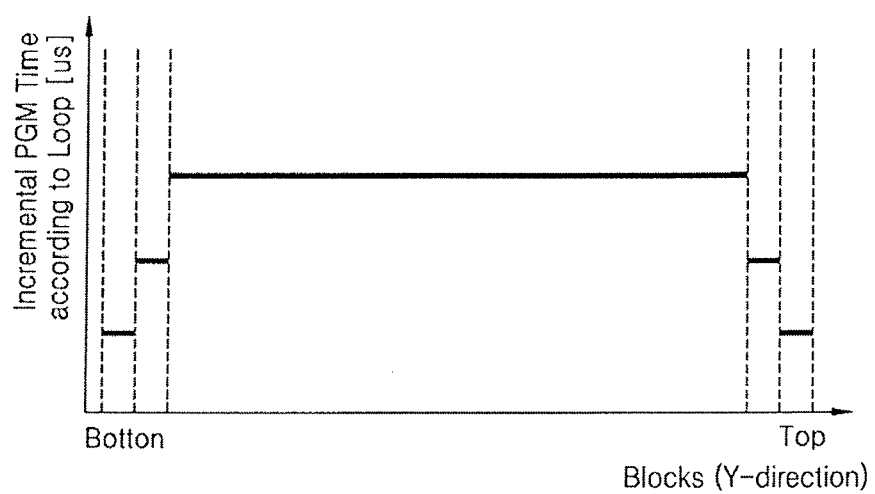
FIG. 34 is a graph showing program time increments according to loops of respective blocks according to an exemplary embodiment of the present inventive concept.

FIG. 34 is a graph showing program time increments according to loops of respective blocks according to an exemplary embodiment of the present inventive concept Referring to FIG. 34, a horizontal axis denotes positions of blocks according to an extension direction of a bit line, and a vertical axis denotes a program time increment. In the present exemplary embodiment, to compensate for a program speed with respect to respective block positions, a first program time increment for each loop may be set with respect to block regions adjacent to an edge of a cell region, and a second program time increment for each loop may be set with respect to block regions in a center of the cell region. In an exemplary embodiment, the second program time increment may be greater than the first program time increment.

In an present exemplary embodiment, the shortest program time increment may be set with respect to a first block region, and the intermediate program time increment may be set with respect to a second block region, and the longest program time increment may be set with respect to a third block region. In an exemplary embodiment, a program time increment may be increased stepwise from an edge of a cell region to a center of the cell region.

Figure 35:
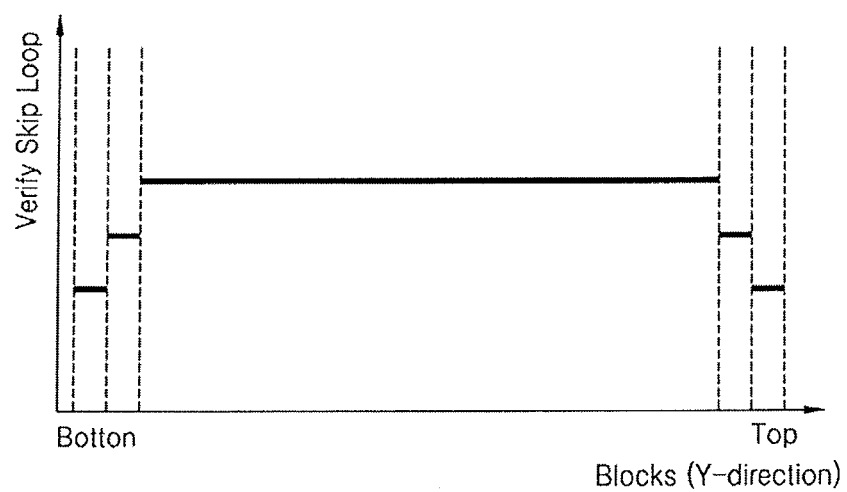
FIG. 35 is a graph showing verify skip loops of respective blocks according to an exemplary embodiment of the present inventive concept.

FIG. 35 is a graph showing verify skip loops of respective blocks according to an exemplary embodiment of the present inventive concept.

Referring to FIG. 35, a horizontal axis denotes positions of blocks according to an extension direction of a bit line, and a vertical axis denotes a verify skip loop. Here, the verify skip loop refers to the number of loops in which a verify operation is omitted but only a program operation is performed during an ISPP operation. In an exemplary embodiment, to compensate for a program speed with respect to respective block positions, a verify skip loop having a first value may be set with respect to block regions adjacent to an edge of a cell region, and a verify skip loop having a second value may be set with respect to block regions in a center of the cell region. In an exemplary embodiment, the second value may be greater than the first value.

In an exemplary embodiment, a verify skip loop of a smallest value may be set with respect to a first block region, and a verify skip loop of an intermediate value may be set with respect to a second block region, and a verify skip loop of a greatest value may be set with respect to a third block region. In an exemplary embodiment, a value of a verify skip loop may be increased stepwise from an edge to a center of a cell region.

FIG. 36 is a table PAR_TABLE2 showing bias conditions of an erase operation according to an exemplary embodiment of the present inventive concept.

Referring to FIG. 36, the table PAR_TABLE2 shows bias conditions of an erase operation with respect to a first block region REG1 and an Nth block region REG_N. For example, the table PAR_TABLE2 may be stored in the parameter information storing unit 122 of FIG. 15. The present inventive concept is not limited thereto, and in an exemplary embodiment, the table PAR_TABLE2 may further include bias conditions of an erase operation on other block regions.

The first block region REG1 may include, for example, blocks adjacent to the first and second edges EDG1 and EDG2 of a cell region CR1, and the Nth block region REG_N may include, for example, blocks in a center of the cell region CR1. Accordingly, a channel hole diameter of strings included in the first block region REG1 may be smaller than a channel hole diameter of strings included in the Nth block region REG_N. Thus, under the same bias condition, an erase speed with respect to memory cells included in the first block region REG1 may be faster than an erase speed with respect to memory cells included in the Nth block region REG_N.

According to an exemplary embodiment, bias conditions of an erase operation may be set with respect to each block region to reduce the erase speed with respect to the first block region REG1. Accordingly, a threshold voltage distribution of erased memory cells included in the first block region REG1 may be adjusted to be similar to a threshold voltage distribution of erased memory cells included in the Nth block region REG_N. Hereinafter, bias conditions for block regions of an erase operation will be described. The bias conditions described below include various operation parameters. According to exemplary embodiments, some of the operation parameters may be applied only, or other operation parameters may be additionally applied.

In an exemplary embodiment, during an erase operation on the first block region REG1, a first erase voltage Vers1 may be applied to a substrate SUB, and during an erase operation on the Nth block region REG_N, a second erase voltage Vers2 that is higher than the first erase voltage Vers1 may be applied to the substrate SUB. In an exemplary embodiment, during the erase operation on the first block region REG1, a first word line erase voltage Vwe1 may be applied to a word line WL, and during the erase operation on the Nth block region REG_N, a second word line erase voltage Vwe2 that is lower than the first word line erase voltage Vwe1 may be applied to the word line WL.

In an exemplary embodiment, an erase operation may be performed on the first block region REG1 during a first erase duration Ters1, and an erase operation may be performed on the Nth block region REG_N during a second erase duration Ters2 that is longer than the first erase duration Ters1. In an exemplary embodiment, during an erase verify operation on the first block region REG1, a first erase verify voltage Vevrf1 may be applied, and during an erase verify operation on the Nth block region REG_N, a second erase verify voltage Vevrf2 that is higher than the first erase verify voltage Vevrf1 may be applied.

However, the present inventive concept is not limited to the above, and if blocks included in the plurality of cell regions CR1 through CR4 of the memory cell array 110b illustrated in FIG. 4 are simultaneously selected during an erase operation, since the memory device 100a may not include a constant voltage source separately allocated to each cell regions, different parameters need not be applied according to the block regions.

Figure 37:
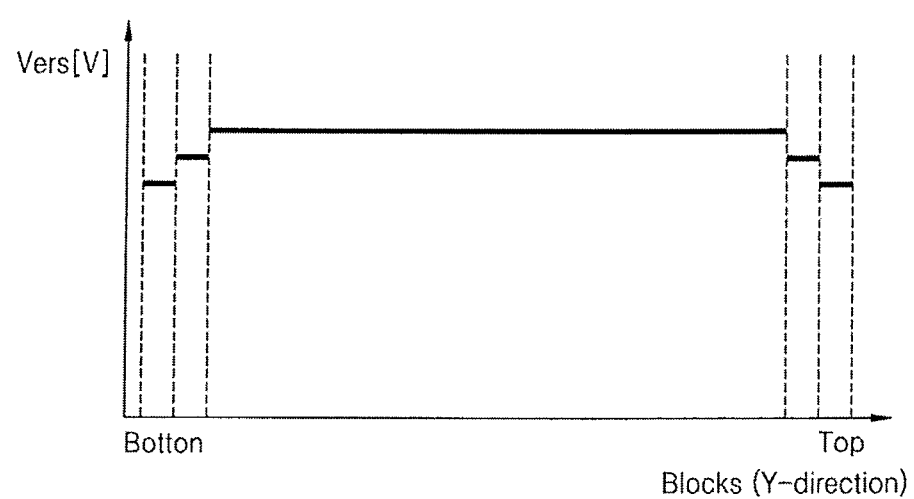
FIG. 37 is a graph showing erase voltages of respective blocks according to an exemplary embodiment of the present inventive concept.

FIG. 37 is a graph showing erase voltages of blocks according to an exemplary embodiment of the present inventive concept.

Referring to FIG. 37, a horizontal axis denotes positions of blocks in the second direction of FIG. 9, that is, an extension direction of a bit line, and a vertical axis denotes an erase voltage. As described above with reference to FIG. 11, a threshold voltage of erased memory cells included in a cell region may have an inverted U shape according to block positions. In an exemplary embodiment, to compensate for an erase speed with respect to the block positions as described above, a first erase voltage may be set with respect to block regions disposed in an edge region of a cell region, for example, block regions adjacent to an edge, and a second erase voltage may be set with respect to block regions in a center of the cell region. In an exemplary embodiment, the second erase voltage may be greater than the first erase voltage.

For example, blocks included in a cell region may be divided into three block regions based on a distance with respect to two edges of the cell region. Block regions may be set such that blocks that are most adjacent to the two edges of the cell region are included in a first block region, and blocks that are second most adjacent to the two edges of the cell region are included in a second block region, and blocks in a center of the cell region are included in a third block region. Hereinafter, erase operation parameters regarding the first through third block regions will be described.

In an exemplary embodiment, the lowest erase voltage may be set with respect to the first block region, and an intermediate erase voltage may be set with respect to the second block region, and the highest erase voltage may be set with respect to the third block region. In an exemplary embodiment, an erase voltage may be increased stepwise from an edge of a cell region towards a center of the cell region.

Figure 38:
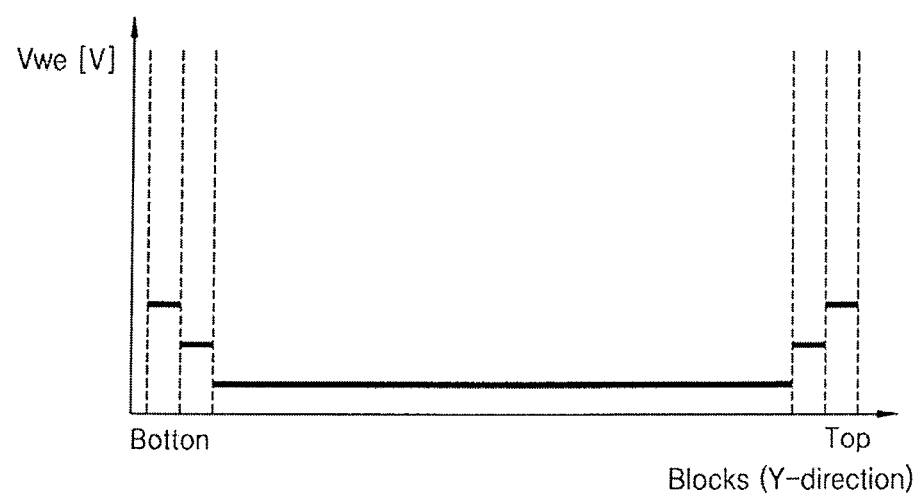
FIG. 38 is a graph showing word line erase voltages of respective blocks according to an exemplary embodiment of the present inventive concept.

FIG. 38 is a graph showing word line erase voltages of respective blocks according to an exemplary embodiment of the present inventive concept.

Referring to FIG. 38, a horizontal axis denotes positions of blocks in an extension direction of a bit line, and a vertical axis denotes a word line erase voltage. In an exemplary embodiment, to compensate for an erase speed with respect to the block positions as described above, a first word line erase voltage may be set with respect to block regions adjacent to an edge of a cell region, and a second word line erase voltage may be set with respect to block regions in a center of the cell region. In an exemplary embodiment, the second word line erase voltage may be smaller than the first word line erase voltage.

In an exemplary embodiment, to reduce an erase speed with respect to a first block region, a highest word line erase voltage may be set as a word line erase voltage applied to word lines connected to the first block region. Accordingly, as a difference between a word line erase voltage and an erase voltage applied to a substrate is reduced, an erase speed with respect to the first block region may be reduced. Also, an intermediate word line erase voltage may be set as a word line erase voltage with respect to a second block region, and a lowest word line erase voltage may be set as a word line erase voltage with respect to a third block region. In an exemplary embodiment, a word line erase voltage may be reduced stepwise from an edge of a cell region towards a center of the cell region.

Figure 39:
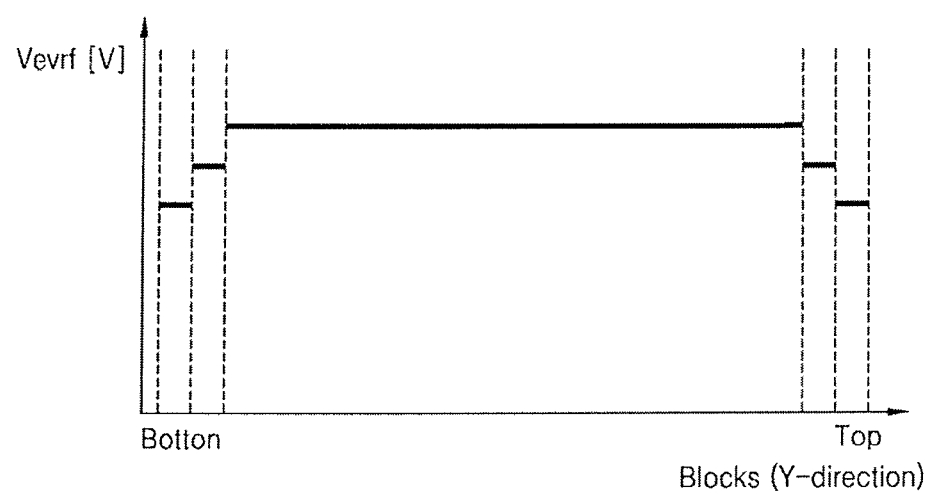
FIG. 39 is a graph showing erase verify voltages of respective blocks according to an exemplary embodiment of the present inventive concept.

FIG. 39 is a graph showing erase verify voltages of blocks according to an exemplary embodiment of the present inventive concept.

Referring to FIG. 39, a horizontal axis denotes positions of blocks in an extension direction of a bit line, and a vertical axis denotes an erase verify voltage. In an exemplary embodiment, to compensate for an erase speed according to the block positions as described above, a first erase verify voltage may be set with respect to block regions adjacent to an edge of a cell region, and a second erase verify voltage may be set with respect to block regions in a center of the cell region.

In an exemplary embodiment, as an erase speed with respect to a first block region is high and thus a threshold voltage level of the first block region after an erase operation under the same bias conditions may be lower than blocks closer to the center of the cell region. Accordingly, a lowest erase verify voltage may be set as an erase verify voltage with respect to the first block region. Also, an intermediate erase verify voltage may be set as an erase verify voltage with respect to a second block region, and a highest erase verify voltage may be set as an erase verify voltage with respect to a third block region. In an exemplary embodiment, an erase verify voltage may be increased stepwise from an edge towards a center of the cell region.

FIG. 40 is a table PAR_TABLE3 showing bias conditions of a read operation according to an exemplary embodiment of the present inventive concept.

Referring to FIG. 40, the table PAR_TABLE3 shows bias conditions of a read operation with respect to a first block region REG1 and an Nth block region REG_N. For example, the table PAR_TABLE3 may be stored in the parameter information storing unit 122 of FIG. 15. The present inventive concept is not limited thereto, and in an exemplary embodiment, the table PAR_TABLE3 may further include bias conditions of a read operation on other block regions.

The first block region REG1 may include, for example, blocks adjacent to first and second edges EDG1 and EDG2 of a cell region CR1, and the Nth block region REG_N may include, for example, blocks in a center of the cell region CR1. Accordingly, a channel hole diameter of strings included in the first block region REG1 may be smaller than a channel hole diameter of strings included in the Nth block region REG_N. Thus, a probability of a read disturb with respect to memory cells included in the first block region REG1 due to Fowler-Nordheim (FN) stress may be higher than a probability of a read disturb with respect to memory cells of the other block regions closer to a center of the cell region CR1.

According to an exemplary embodiment, bias conditions of a read operation may be set with respect to respective block regions to compensate for a read disturb with respect to the first block region REG1. Hereinafter, bias conditions of a read operation according to positions of block regions will be described. The bias conditions described below include various operation parameters. According to an exemplary embodiment, some of the operation parameters may be applied only or other operation parameters may be additionally applied.

In an exemplary embodiment, during a read operation on the first block region REG1, a first read determination voltage Vrd1 may be applied to a selected word line WL_sel, and during a read operation on the Nth block region REG_N, a second read determination voltage Vrd2 that is higher than the first read determination voltage Vrd1 may be applied to the selected word line WL_sel. In an exemplary embodiment, during a read operation on the first block region REG1, a first read inhibit voltage Vinhr1 may be applied to a non-selected word line WL_unsel, and during a read operation on the Nth block region REG_N, a second read inhibit voltage Vinhr2 that is higher than the first read inhibit voltage Vinhr1 may be applied to the non-selected word line WL_unsel.

For example, during a read operation, a plurality of memory cells included in a page connected to one word line may be simultaneously read or only some of the memory cells may be read. As distances between each memory cell of one page and a peripheral circuit are different, read environments with respect to the memory cells may vary due to a difference in word line resistance or noise. Thus, if the number of memory cells to be read among a plurality of memory cells included in one page is modified, operation parameters corresponding to block regions may be modified or operation parameters determined for each block region may not be applied.

However, the present inventive concept is not limited to the above, and if blocks included in the plurality of cell regions CR1 through CR4 of the memory cell array 110b illustrated in FIG. 4 are simultaneously selected during a read operation, since the memory device 100a need not include a constant voltage source separately allocated to each cell region, different parameters need not be applied according to a position of each block region.

Figure 41:
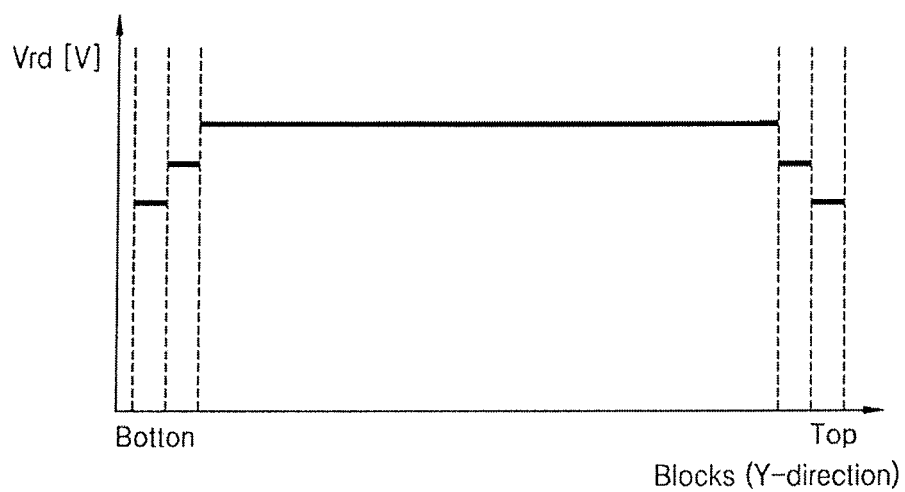
FIG. 41 is a graph showing read determination voltages of respective blocks according to an exemplary embodiment of the present inventive concept.

FIG. 41 is a graph showing read determination voltages of respective blocks according to an exemplary embodiment of the present inventive concept.

Referring to FIG. 41, a horizontal axis denotes positions of blocks in the second direction of FIG. 9, for example, an extension direction of a bit line, and a vertical axis denotes a read determination voltage. As described above with reference to FIG. 9, diameters of channel holes included in a cell region may be different according to block positions. In an exemplary embodiment, to compensate for a difference in channel hole diameters according to block positions, a first read determination voltage may be set with respect to block regions disposed in an edge region of a cell region, that is, block regions adjacent to an edge, and a second read determination voltage may be set with respect to block regions in a center of the cell region. In an exemplary embodiment, the second read determination voltage may be greater than the first read determination voltage.

For example, blocks included in a cell region may be divided into three block regions based on a distance with respect to two edges of the cell region. Block regions may be set such that blocks that are most adjacent to the two edges of the cell region are included in a first block region, and blocks that are second most adjacent to the two edges of the cell region are included in a second block region, and blocks in a center of the cell region are included in a third block region. Hereinafter, read operation parameters regarding the first through third block regions will be described.

In an exemplary embodiment, the lowest read determination voltage may be set with respect to the first block region, and an intermediate read determination voltage may be set with respect to the second block region, and the highest read determination voltage may be set with respect to the third block region. In an exemplary embodiment, a read determination voltage may be increased stepwise from an edge towards a center of a cell region.

Figure 42:
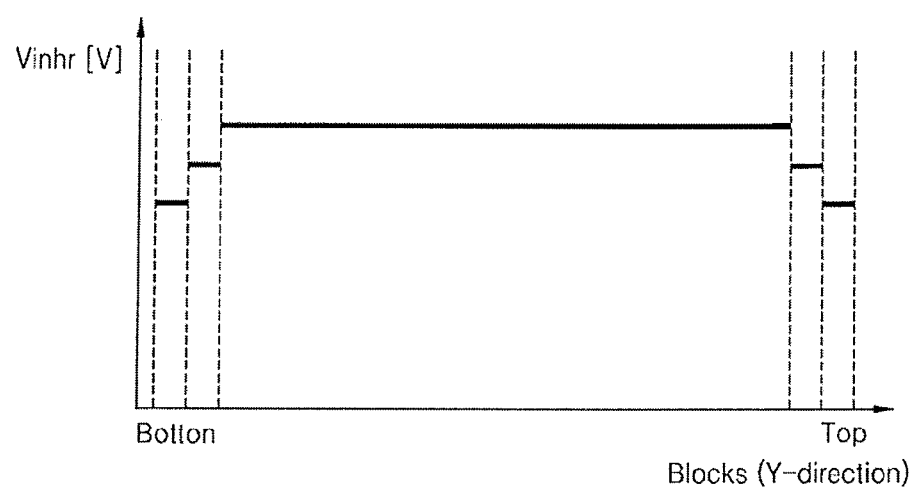
FIG. 42 is a graph showing reading inhibit voltages of respective blocks according to an exemplary embodiment of the present inventive concept.

FIG. 42 is a graph showing read inhibit voltages of blocks according to an exemplary embodiment of the present inventive concept.

Referring to FIG. 42, a horizontal axis denotes positions of blocks in an extension direction of a bit line, and a vertical axis denotes a read inhibit voltage. In an exemplary embodiment, to compensate for a difference in channel hole diameters according to block positions, a first read inhibit voltage may be set with respect to block regions adjacent to an edge of a cell region, and a second read inhibit voltage may be set with respect to block regions in a center of the cell region. In an exemplary embodiment, the second read inhibit voltage may be greater than the first read inhibit voltage.

In an exemplary embodiment, a lowest read inhibit voltage may be set with respect to a first block region, an intermediate read inhibit voltage may be set with respect to a second block region, and a highest read inhibit voltage may be set with respect to a third block region. In an exemplary embodiment, a read inhibit voltage may be increased stepwise from an edge towards a center of a cell region.

Figure 43:
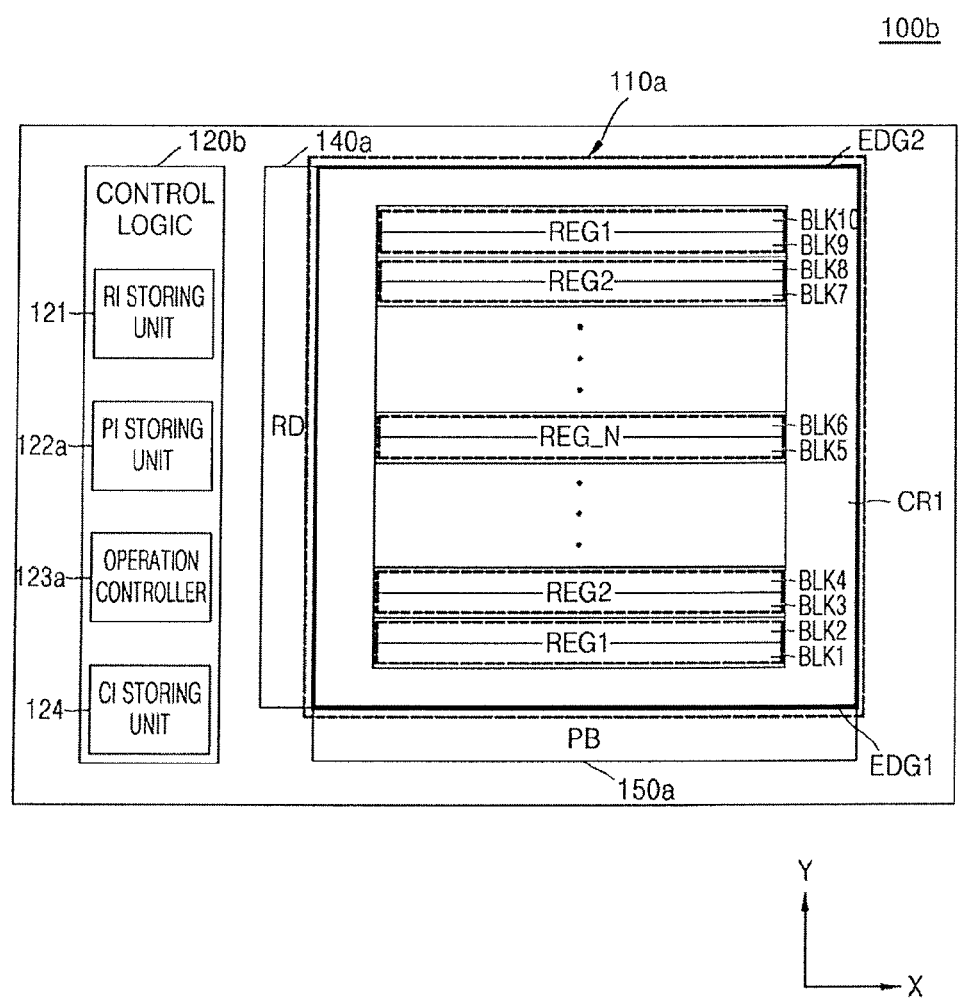
FIG. 43 illustrates a memory device according to an exemplary embodiment of the present inventive concept.

FIG. 43 illustrates a memory device 100b according to an exemplary embodiment of the present inventive concept.

Referring to FIG. 43, the memory device 100b may include a memory cell array 110a, a control logic 120b, a row decoder 140a, and a page buffer 150a. The memory device 100b is similar to the memory device 100a of FIG. 15, and description will focus on differences from FIG. 15. In an exemplary embodiment, the memory device 100b may include the memory cell array illustrated in FIG. 17, FIG. 19, FIG. 21 or FIG. 24, and a method of setting block regions in a memory cell array may vary according to an exemplary embodiment.

According to an exemplary embodiment, a control logic 120b may include a block region information storing unit 121, a parameter information storing unit 122a, an operation controller 123a, and a cycle information storing unit 124.

Compared with the control logic 120 of FIG. 15, the control logic 120*b* may further include the cycle information storing unit 124.

The block region information storing unit 121 may store information about block regions of a cell region CR1 included in the memory cell array 110*a*. The block region information may be generated by dividing a plurality of blocks into at least two block regions based on a distance with respect to a relatively close edge among first and second edges EDG1 and EDG2 of the cell region CR1. In an exemplary embodiment, block region information may be stored as a table showing block regions for corresponding blocks.

The cycle information storing unit 124 may store information about a P/E cycle count with respect to a plurality of blocks BLK1 through BLK10 included in the memory cell array 110*a*. The P/E cycle count refers to the number of times of P/E cycles. The cycle information storing unit 124 may be implemented using a latch. In an exemplary embodiment, cycle information may be stored in a region of the memory cell array 110*a*. In an exemplary embodiment, cycle information may be stored in a buffer memory of a memory controller. In an exemplary embodiment, cycle information may be stored in an additional non-volatile memory included in a memory system.

Figure 44:
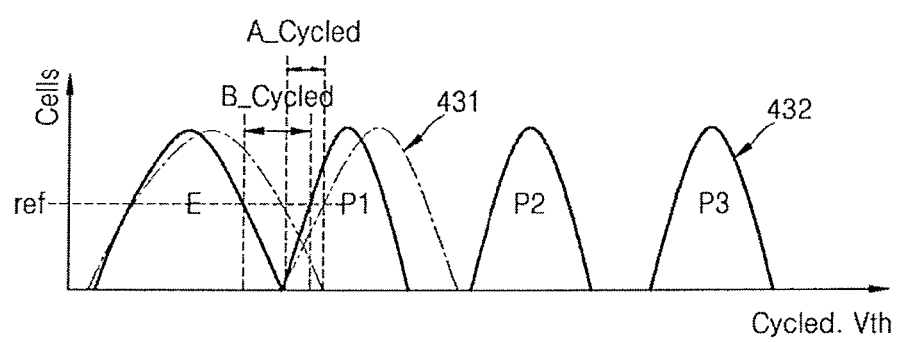
FIG. 44 is a graph showing a second distribution of the first and second blocks of FIG. 9 according to a threshold voltage.

FIG. 44 is a graph showing a threshold voltage distribution of the first and second blocks BLKa and BLKb of FIG. 9.

Referring to FIG. 44, a horizontal axis denotes a threshold voltage Vth, and a vertical axis denotes the number of memory cells. The threshold voltage distribution denotes a distribution of the first and second blocks BLKa and BLKb corresponding to a P/E cycle count with respect to the first and second blocks BLKa and BLKb, which is equal to or higher than a threshold value. A dotted line 431 denotes a threshold voltage distribution with respect to the first block BLKa, and a solid line 432 denotes a threshold voltage distribution with respect to the second block BLKb.

An erase speed with respect to memory cells included in the first block BLKa may be initially relatively high, but may be relatively reduced as the P/E cycle count increases because a program speed and an erase speed of the memory cells included in the first block BLKa are relatively high so that a variation in a threshold voltage in the memory cells increases according to an increase in the P/E cycle count, thereby speeding up deterioration of the memory cells.

As a result, data in the memory cells may not be easily erased due to charges trapped in a charge storage layer included in the memory cells (for example, the charge storage layer CS of FIG. 5). Consequently, if a P/E cycle count is equal to or higher than a threshold value, as an upper voltage level of an erase state E of the first block BLKa increases, an EPI valley (A_cycled) of the first block BLKa may be smaller than an EPI valley (B_cycled) of the second block BLKb (i.e., A_cycled<B_cycled).

On the other hand, a program speed with respect to the memory cells included in the first block BLKa may be further increased according to an increase in the P/E cycle count. In addition, an upper voltage level of the first through third program states P1 through P3 may be further increased due to charges trapped in the charge storage layer included in the memory cells included in the first block BLKa. As a result, if a P/E cycle count is equal to or higher than a threshold value, as an upper voltage level of the first through third program states P1 through P3 of the first block BLKa increases, valleys between the first through third program states P1 through P3 may be moved to be higher.

As described above, as a P/E cycle count increases, a deterioration speed of memory cells having a relatively small channel hole diameter may be increased. In the present exemplary embodiment, a channel hole diameter of the first block region REG1 adjacent to the first and second edges EDG1 and EDG2 of the cell region CR1 may be smaller than that of the Nth block region REG_N in a center of the cell region CR1. Accordingly, the memory cells included in the first block region REG1 may be deteriorated further as the P/E cycle count increases.

Referring to FIG. 43 again, in the present exemplary embodiment, operation parameters to be applied may be modified based on a P/E cycle count. In an exemplary embodiment, an increase in a program speed of the first block region REG1 according to an increase in a P/E cycle count may be reduced by changing program operation parameters. In an exemplary embodiment, a slowdown in an erase operation due to deterioration of the first block region REG1 according to an increase in a P/E cycle count may be reduced by changing erase operation parameters. In an exemplary embodiment, a read error due to a shift of a valley according to an increase in a P/E cycle count may be reduced by changing read operation parameters.

In an exemplary embodiment, if a P/E cycle count is equal to or less than a threshold value, a reference bias condition in which the same operation parameters are commonly applied to block regions may be applied, and if a P/E cycle count is greater than the threshold value, each block region may have bias condition of operation parameters different from each other. In an exemplary embodiment, if a P/E cycle count is equal to or less than a threshold value, each block region may have a first bias condition of operation parameters different from each other, and if a P/E cycle count is greater than the threshold value, each block region may have a second bias condition of operation parameters different from each other. The second bias condition may be generated by modifying some of the operation parameters having the first bias condition.

The parameter information storing unit 122*a* may store information about operation parameters of at least two block regions. The operation parameters may have bias conditions for program, erase, and read operations. In an exemplary embodiment, parameter information may be stored as a table including bias conditions of the operation parameters for each block region.

In an exemplary embodiment, the parameter information storing unit 122*a* may store a first table including reference operation parameters according to the reference bias condition that is commonly applied to a plurality of block regions and a second table including different bias conditions with respect to each block region according to the first bias condition. In an exemplary embodiment, the parameter information storing unit 122*a* may store a second table including different bias conditions with respect to each block region according to the first bias condition and a third table including different bias conditions with respect to each block region according to the second bias condition. In an exemplary embodiment, the parameter information storing unit 122*a* may store all of the first through third tables.

The operation controller 123*a* may control an operation on each block region of the memory cell array 110*a* using block region information, parameter information, and cycle information. For example, the operation controller 123*a* may select bias conditions for operation parameters according to a P/E cycle count, and control an operation performed on each block region of the memory cell array 110*a* using the selected bias conditions.

In an exemplary embodiment, the operation controller 123a may determine a P/E cycle count, and if the P/E cycle count is equal to or less than a threshold value, the operation controller 123a may select parameter information for a reference operation parameter and control an operation using the reference operation parameter. If the P/E cycle count is greater than the threshold value, the operation controller 123a may search block region information for a block corresponding to an address, search parameter information, for example, bias conditions, for an operation parameter corresponding to the block region, and control an operation by using the selected bias conditions.

In an exemplary embodiment, the operation controller 123a may search block region information for a block corresponding to an address, and determine a P/E cycle count. If the P/E cycle count is equal to or less than a threshold value, the operation controller 123a may search parameter information for an operation parameter corresponding to the block region, and control an operation by using the operation parameter corresponding to the block region. If a P/E cycle count is greater than the threshold value, the operation controller 123a may search modified parameter information for operation parameters corresponding to a block region and control an operation by using the modified operation parameter information corresponding to the block region.

Figure 45:
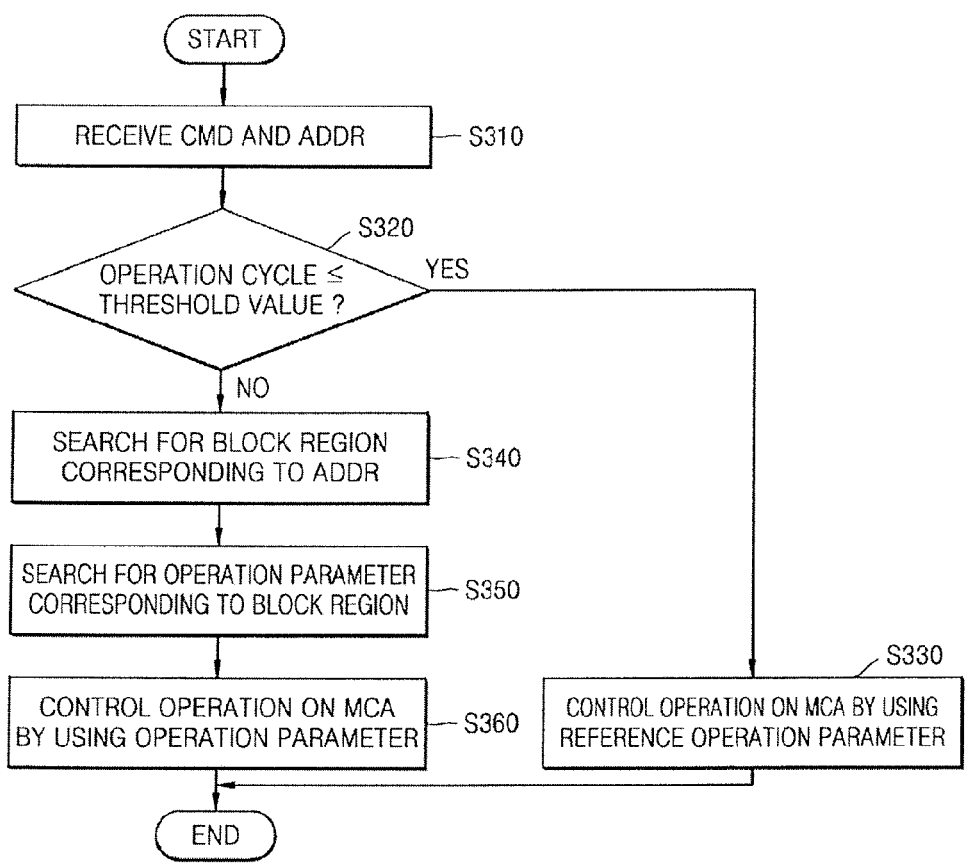
FIG. 45 is a flowchart of an example of a method of operating a memory device according to an exemplary embodiment of the present inventive concept.

FIG. 45 is a flowchart of an example of a method of operating a memory device according to an exemplary embodiment of the present inventive concept.

According to operation steps of FIG. 45, a control logic may control an operation on a memory cell array when a command and an address are received from a memory controller. The method may include, for example, operations that are sequentially performed in the control logic 120b of FIG. 43. The description provided with reference to FIG. 43 may also apply to the method of the present exemplary embodiment, and repeated description will be omitted.

In operation S310, a command and an address are received from a memory controller. In operation S320, whether an operation cycle is equal to or less than a threshold value is determined. In an exemplary embodiment, the operation cycle may be a P/E cycle count. In an exemplary embodiment, the operation cycle may be a read cycle count. If the operation cycle is equal to or less than the threshold value, operation S330 is performed, and otherwise, operation S340 is performed. However, the present inventive concept is not limited thereto, and in an exemplary embodiment, whether an operation cycle is less than a threshold value may be determined in operation S320. In this case, if the operation cycle is less than the threshold value, operation S330 may be performed, and otherwise, operation S340 may be performed.

In operation S330, an operation on a memory cell array is controlled using a reference operation parameter. If the P/E cycle count is less than the threshold value, the operation controller 123a may perform a program, erase or read operation on memory cells disposed in the cell region CR1 of the memory cell array 110a by using the same reference operation parameter, regardless of block positions in the cell region CR1. The threshold value may be set to a P/E cycle count below which the characteristics of memory cells are not deteriorated to cause errors. For example, if the P/E cycle count increases beyond the threshold number, memory cells closest to the edges EDG1 and EDG2 may start to deteriorate due to the small channel hole diameter sizes.

In operation S340, a block region corresponding to the received address is searched for. For example, the operation controller 123a may search the block region information storing unit 121 for a block region corresponding to the address.

In operation S350, an operation parameter corresponding to the block region is searched for. For example, the operation controller 123a may search the parameter information storing unit 122a for an operation parameter corresponding to the block region.

In operation S360, an operation on a memory cell array is performed using the operation parameter chosen in operation S350.

Figure 46:
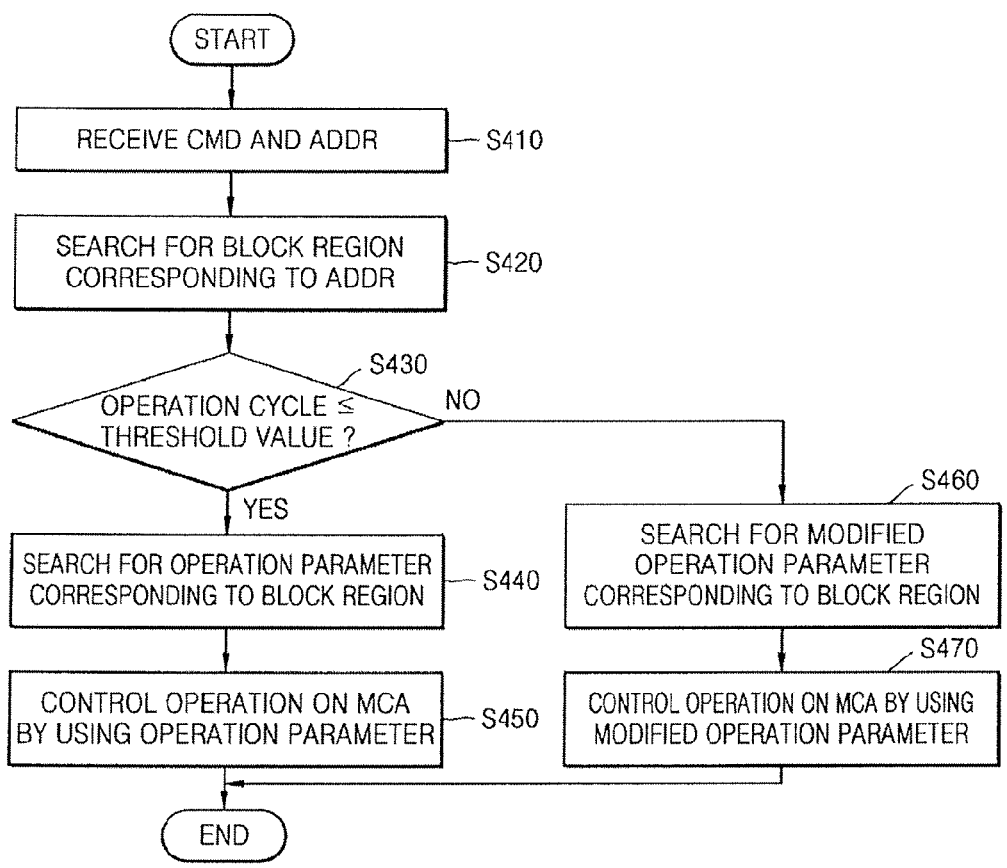
FIG. 46 is a flowchart of an example of a method of operating a memory device according to an exemplary embodiment of the present inventive concept.

FIG. 46 is a flowchart of a method of operating a memory device according to an exemplary embodiment of the present inventive concept.

According to an exemplary operation steps of FIG. 46, the control logic 120b of FIG. 43 may operate a memory device. The description provided with reference to FIG. 43 may apply to the method of the present exemplary embodiment, and repeated description will be omitted.

In operation S410, a command and an address are received from a memory controller. In operation S420, a block region corresponding to the received address is searched for. For example, the operation controller 123a may search the block region information storing unit 121 for a block region corresponding to the address.

In operation S430, whether an operation cycle is equal to or less than a threshold value is determined. [Note to client: operation cycle is counted per block region?] In an exemplary embodiment, the operation cycle may be a P/E cycle count. In an exemplary embodiment, the operation cycle may be a read cycle count. If the operation cycle is equal to or less than the threshold value, operation S440 is performed, and otherwise, operation S460 is performed. However, the present inventive concept is not limited thereto, and in an exemplary embodiment, whether an operation cycle is less than a threshold value may be determined in operation S430. In this case, if the operation cycle is less than the threshold value, operation S440 may be performed, and otherwise, operation S460 may be performed.

In operation S440, an operation parameter corresponding to a block region is searched for. For example, the operation controller 123a searches the parameter information storing unit 122a for an operation parameter. The operation parameter may correspond to the first bias condition illustrated in FIG. 47, FIG. 48 or FIG. 49. In operation S450, an operation on a memory cell array is controlled using the operation parameter chosen in the operation S440.

In operation S460, modified operation parameter information corresponding to the block region is searched for. For example, the operation controller 123a searches the parameter information storing unit 122a to select modified operation parameter information corresponding to the selected block region. The modified operation parameter information may include the second bias condition illustrated in FIG. 47, FIG. 48 or FIG. 49. In operation S470, an operation on a memory cell array is controlled using the modified operation parameter information.

FIG. 47 is a table PAR_TABLE4 showing bias conditions of a program operation according to an exemplary embodiment of the present inventive concept.

Referring to FIG. 47, the table PAR_TABLE4 shows bias conditions of a program operation on the first block region REG1 and the Nth block region REG_N. For example, the table PAR_TABLE4 may be stored in the parameter information storing unit 122a of FIG. 43. The present inventive concept is not limited thereto, and in an exemplary embodiment, the table PAR_TABLE4 may further include bias conditions of a program operation on other block regions.

The table PAR_TABLE4 may include a reference bias condition that is commonly applied to block regions, irrespective of the locations of the block regions, a first bias condition that is applied to each block region, and a second bias condition that is applied to each block region. The second bias condition may be generated by modifying some of operation parameters included in the first bias condition. In an exemplary embodiment, the table PAR_TABLE4 may include only the reference bias condition and the first bias condition. In an exemplary embodiment, the table PAR_TABLE4 may include only the first and the second bias conditions.

The reference bias condition may be applied commonly to a plurality of block regions included in a cell region. In an exemplary embodiment, a program operation may be performed on a memory cell array by using the reference bias condition during an initial program loop. The first bias condition may be differently set for each block region. The first bias condition of the table PAR_TABLE4 is the same as the bias condition of FIG. 29, and thus detailed description thereof will be omitted.

The second bias condition may be different for each block region, and may be applied when a P/E cycle count is greater than a threshold value. In an exemplary embodiment, the second bias condition may be generated by modifying some of operation parameters with respect to the first block region REG1, included in the first bias condition. In an exemplary embodiment, the second bias condition may be generated by modifying some of operation parameters with respect to the Nth block region REG_N, included in the first bias condition. In an exemplary embodiment, the second bias condition may be generated by modifying some of operation parameters with respect to the first block region REG1 and the Nth block region REG_N, included in the first bias condition.

As a P/E cycle count increases, a program speed of memory cells included in the first block region REG1 may be further increased due to deterioration of the memory cells included in the first block region REG1 having a relatively small channel hole diameter. Thus, in the present exemplary embodiment, if a P/E cycle count is greater than a threshold value, a difference between a program voltage with respect to the first block region REG1 and a program voltage with respect to the Nth block region REG_N may be further increased, thereby compensating for a difference in program speeds of each block region. For example, a difference in program speed of each block may be compensated for by slowing down a program speed with respect to the first block region REG1.

Hereinafter, a second bias condition of block regions of a program operation will be described. The second bias condition described below includes various operation parameters. According to an exemplary embodiment, some of the operation parameters may be applied, or other operation parameters may be additionally applied.

In an exemplary embodiment, during a program operation on the first block region REG1, a first modified program voltage Vpgm1' that is lower than a first program voltage Vpgm1 may be applied to a selected word line WL_sel, and during a program operation on the Nth block region REG_N, a second program voltage Vpgm2 may be applied to the selected word line WL_sel. Accordingly, a difference between the first modified program voltage Vpgm1' and the second program voltage Vpgm2 may be greater than a difference between the first program voltage Vpgm1 and the second program voltage Vpgm2. For example, the first program voltage Vpgm1 may be lower than the second program voltage Vpgm2 by 1 V under the first bias condition, and the modified first program voltage Vpgm1' may be lower than the second program voltage Vpgm2 by 1.5 V.

In an exemplary embodiment, a program operation may be performed on the first block region REG1 during a first modified program duration Tpgm1' that is shorter than a first program duration Tpgm1, and a program operation may be performed on the Nth block region REG_N during a second program duration Tpgm2. Accordingly, a difference between the first modified program duration Tpgm1' and the second program duration Tpgm2 may be greater than a difference between the first program duration Tpgm1 and the second program duration Tpgm2.

According to an exemplary embodiment, a program voltage may be increased with respect to the first block region REG1 by a first modified program voltage increment Vinc1' that is smaller than a first program voltage increment Vinc1 as a value of a loop increases. In an exemplary embodiment, a program duration may be increased with respect to the first block region REG1 by a first modified time increment Tinc1' that is shorter than the first time increment Tinc1, as a value of a loop increases.

In an exemplary embodiment, a verify operation may be skipped only during a first modified verify skip loop Ls1' that is of a value equal to or smaller than a first verify skip loop Ls1 with respect to the first block region REG1. In an exemplary embodiment, a first modified maximum loop Lm1' that is of a value equal to or smaller than a first maximum loop may be set with respect to the first block region REG1.

In an exemplary embodiment, a first modified Vinhp1' that is lower than a first program inhibit voltage Vinhp1 may be applied to a non-selected word line WL_unsel included in the first block region REG1. In an exemplary embodiment, during a program verify operation on the first block region REG1, a first modified program verify operation voltage Vpvrf1' that is higher than a first program verify voltage Vpvrf1 may be applied.

FIG. 48 is a table PAR_TABLE5 showing bias conditions of an erase operation according to an exemplary embodiment of the present inventive concept.

Referring to FIG. 48, the table PAR_TABLE5 shows bias conditions with respect to an erase operation on the first block region REG1 and the Nth block region REG_N. For example, the table PAR_TABLE5 may be stored in the parameter information storing unit 122a of FIG. 43. The present inventive concept is not limited thereto, and in an exemplary embodiment, the table PAR_TABLE5 may further include bias conditions with respect to an erase operation on other block regions.

According to an exemplary embodiment, the table PAR_TABLE5 may include a reference bias condition that is commonly applied to block regions, a first bias condition that is applied to each block region, and a second bias condition that is applied to each block region. The second bias condition may be generated by modifying some of operation parameters included in the first bias condition. In an exemplary embodiment, the table PAR_TABLE5 may include only the reference bias condition and the first bias condition. In an exemplary embodiment, the table PAR_TABLE5 may include only the first and second bias conditions.

The reference bias condition may be applied commonly to a plurality of block regions included in a cell region. In an exemplary embodiment, an erase operation may be performed on a memory cell array by using the reference bias condition during an initial program loop. The first bias condition may be differently set according to positions of block regions. The first bias condition may be substantially the same as the bias condition described with reference to FIG. 25, and thus detailed description thereof will be omitted.

The second bias condition may be differently set according to positions of block regions, and may be applied when a P/E cycle count is greater than a threshold value. In an exemplary embodiment, the second bias condition may be generated by modifying some of the first bias condition of the first block region REG1. In an exemplary embodiment, the second bias condition may be generated by modifying some of the first bias condition of the Nth block region REG_N. In an exemplary embodiment, the second bias condition may be generated by modifying some of the first bias conditions of the first block region REG1 and the Nth block region REG_N.

As a P/E cycle count increases, charges may be trapped in a charge storage layer of memory cells included in the first block region REG1 due to deterioration of the memory cells included in the first block region REG1 having a first channel hole diameter smaller than a second channel hole diameter of memory cells in the Nth block region REG_N, and accordingly, a threshold voltage of erased memory cells may be increased. Thus, in an exemplary embodiment, if a P/E cycle count is greater than a threshold value, an erase voltage with respect to the first block region REG1 may be further increased, thereby compensating for a difference in channel hole diameters of block regions.

Hereinafter, the second bias condition with respect to respective block regions of an erase operation will be described. The second bias condition described below includes various operation parameters. According to an exemplary embodiment, some of the operation parameters may be applied, or other operation parameters may be further applied.

In an exemplary embodiment, during an erase operation on the first block region REG1, a first modified erase voltage Vers1' that is higher than a first erase voltage Vers1 may be applied to a substrate SUB, and during an erase operation on the Nth block region REG_N, a second erase voltage Vers2 may be applied to the substrate SUB. In an exemplary embodiment, during an erase operation on the first block region REG1, a first modified word line erase voltage Vwe1' that is lower than a first word line erase voltage Vwe1 may be applied to a word line WL, and during an erase operation on the Nth block region REG_N, a second word line erase voltage Vwe2 may be applied to the word line WL. In an exemplary embodiment, an erase operation may be performed on the first block region REG1 during a first modified erase duration Ters1' that is longer than a first erase duration Ters1, and an erase operation may be performed on the Nth block region REG_N during a second erase duration Ters2. In an exemplary embodiment, during an erase verify operation on the first block region REG1, a first modified erase verify voltage Vevrf1' that is higher than a first erase verify voltage Vevrf1 may be applied.

FIG. 49 is a table PAR_TABLE6 showing bias conditions of a read operation according to an exemplary embodiment of the present inventive concept.

Referring to FIG. 49, the table PAR_TABLE6 shows bias conditions of a read operation on the first block region REG1 and the Nth block region REG_N. For example, the table PAR_TABLE6 may be stored in the parameter information storing unit 122a of FIG. 43. The present inventive concept is not limited thereto, and in an exemplary embodiment, the table PAR_TABLE6 may further include bias conditions of a read operation on other block regions.

According to an exemplary embodiment, the table PAR_TABLE6 may include a reference bias condition that is commonly applied to block regions, a first bias condition that is applied according to positions of block regions, and a second bias condition that is applied according to positions of block regions. The second bias condition may be generated by modifying some of operation parameters included in the first bias condition. In an exemplary embodiment, the table PAR_TABLE6 may include only the reference bias condition and the first bias condition. In an exemplary embodiment, the table PAR_TABLE6 may include only the first and second bias conditions.

The reference bias condition may be applied commonly to a plurality of block regions included in a cell region. In an exemplary embodiment, if a read cycle count is equal to or less than a threshold value, a read operation may be performed on a memory cell array by using the reference bias condition. The first bias condition may be differently set according to positions of block regions. The first bias condition of FIG. 49 is the same as the bias condition described with reference to FIG. 28, and thus detailed description thereof will be omitted.

The second bias condition may be differently set according to positions of block regions, and may be applied when a P/E cycle count or a read count is greater than a threshold value. In an exemplary embodiment, the second bias condition may be generated by modifying some of operation parameters with respect to the first block region REG1, included in the first bias condition. In an exemplary embodiment, the second bias condition may be generated by modifying some of operation parameters with respect to the Nth block region REG_N, included in the first bias condition. In an exemplary embodiment, the second bias condition may be generated by modifying some of operation parameters with respect to the first block region REG1 and the Nth block region REG_N, included in the first bias condition.

As described above with reference to FIG. 44, as a P/E cycle count increases, a program speed with respect to memory cells included in the first block region REG1 having a first channel hole diameter may be further increased so that upper levels of respective program states P1, P2, and P3 are further increased, in compared with memory cells of the Nth block region REG_N having a second channel hole diameter greater than the first channel hole diameter. Meanwhile, as a P/E cycle count increases, an erase operation on the memory cells included in the first block region REG1 may be improperly performed so that an upper level of the memory cells in an erase level E may also be further increased. Thus, in an exemplary embodiment, if a P/E cycle count is greater than a threshold value, a read determination voltage with respect to the first block region REG1 may be further increased, thereby compensating for a difference in channel hole diameters of block regions.

Hereinafter, a second bias condition of block regions of a read operation will be described. The second bias condition described below includes various operation parameters. According to an exemplary embodiment, some of the operation parameters may be applied, or other operation parameters may be additionally applied.

In an exemplary embodiment, during a read operation on the first block region REG1, a first modified read determination voltage Vrd1' that is higher than a first read determination voltage Vrd1 may be applied to a selected word line WL_sel, and during a read operation on the Nth block region REG_N, a second read determination voltage Vrd2 may be applied to the selected word line WL_sel. In an exemplary embodiment, during a read operation on the first block region REG1, a first modified read inhibit voltage Vinhr1' that is higher than a first read inhibit voltage Vinhr1 may be applied to a non-selected word line WL_unsel, and during a read operation on the Nth block region REG_N, a second read inhibit voltage Vinhr2 may be applied to the non-selected word line WL_unsel.

Figure 50:
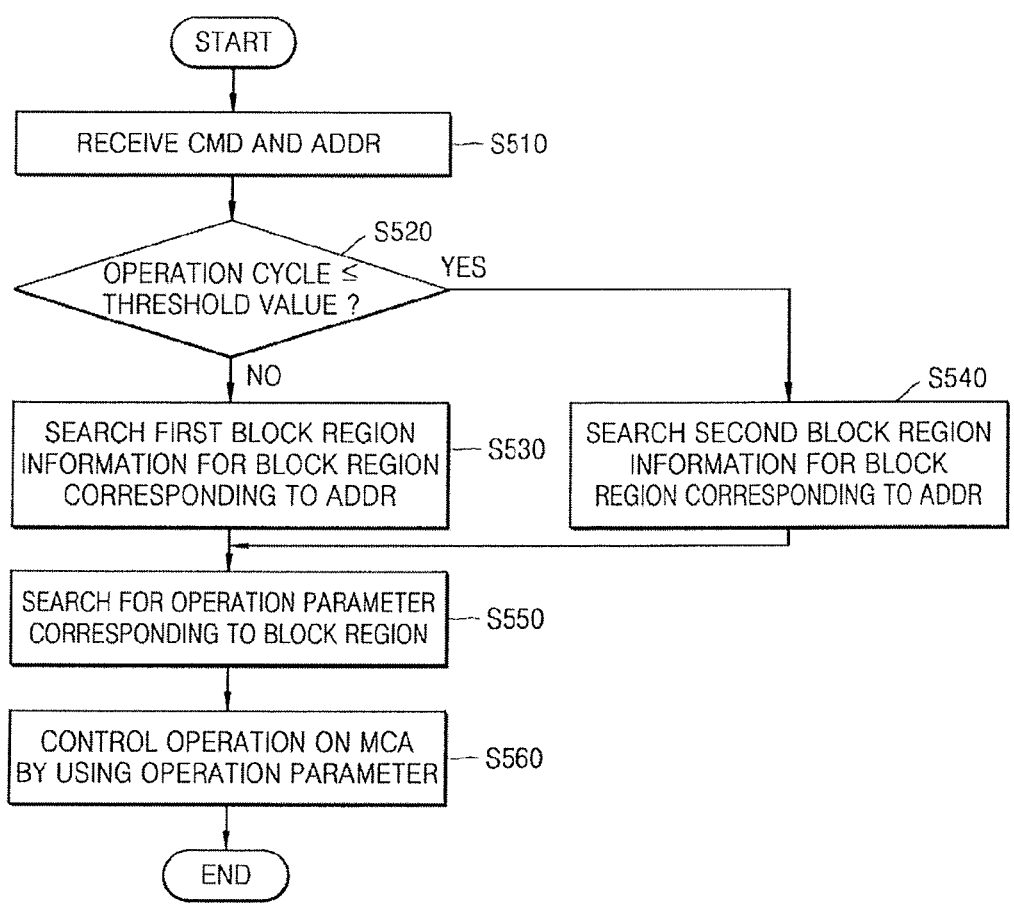
FIG. 50 is a flowchart of an example of a method of operating a memory device according to an exemplary embodiment of the present inventive concept.

FIG. 50 is a flowchart of a method of operating a memory device according to an exemplary embodiment of the present inventive concept.

The method of FIG. 50 may include operations that are sequentially performed in the control logic 120b of FIG. 43. The description provided with reference to FIG. 43 may apply to the method of FIG. 50, and repeated description will be omitted.

In operation S510, a command and an address are received from a memory controller. In operation S520, whether an operation cycle is equal to or less than a threshold value is determined. In an exemplary embodiment, the operation cycle may be a P/E cycle count. In an exemplary embodiment, the operation cycle may be a read cycle count. As a result of determining, if the operation cycle is equal to or less than the threshold value, operation S530 is performed, and otherwise, operation S540 is performed. However, the present inventive concept is not limited thereto, and in an exemplary embodiment, whether an operation cycle is less than a threshold value may be determined in operation S520. As a result of determining, if the operation cycle is less than the threshold value, operation S530 may be performed, and otherwise, operation S540 may be performed.

In operation S530, first block region information is searched for a block region corresponding to the address. The first block region information may be information indicating a plurality of blocks in a cell region CR1, divided into at least two block regions according to a first method of setting block regions. In an exemplary embodiment, the first block region information may be applied to an initial cycle stage of a program operation or a read operation. For example, the operation controller 123a may search the first block region information stored in the block region information storing unit 121 for a block region corresponding to the address.

In operation S540, second block region information is searched for a block region corresponding to the address. The second block region information may be information indicating a plurality of blocks in the cell region CR1, divided into at least two block regions according to a second method of setting block regions. In an exemplary embodiment, the second block region information may be applied to an operation after a predetermined cycle of the program operation or the read operation, that is, an operation after a cycle corresponding to a threshold value. For example, the operation controller 123a may search the second block region information stored in the block region information storing unit 121 for a block region corresponding to the address.

In operation S550, an operation parameter corresponding to the block region is searched for. For example, the operation controller 123a searches the parameter information storing unit 122a for the operation parameter. In an exemplary embodiment, the operation controller 123a may search the parameter information storing unit 122a for operation parameters corresponding to a reference bias condition. In operation S560, an operation on a memory cell array is controlled using the operation parameters.

As described above, according to an exemplary embodiment, block regions may be differently set according to operation cycles. For example, according to the first block region information applied to operations prior to a P/E cycle corresponding to a threshold value, a third block BLK3 that is third most adjacent to the first edge EDG1 may correspond to the second block region REG2; according to the second block region information applied to operations after the P/E cycle corresponding to the threshold value, the third block BLK3 may correspond to the first block region REG1. Accordingly, a program operation may be performed on the third block BLK3 by using operation parameters according to the second block region REG2 before prior to the P/E cycle corresponding to the threshold value, and after the P/E cycle corresponding to the threshold value, a program operation may be performed on the third block BLK3 by using operation parameters according to the first block region REG1. [Note to client: Need elaboration]

Figure 51:
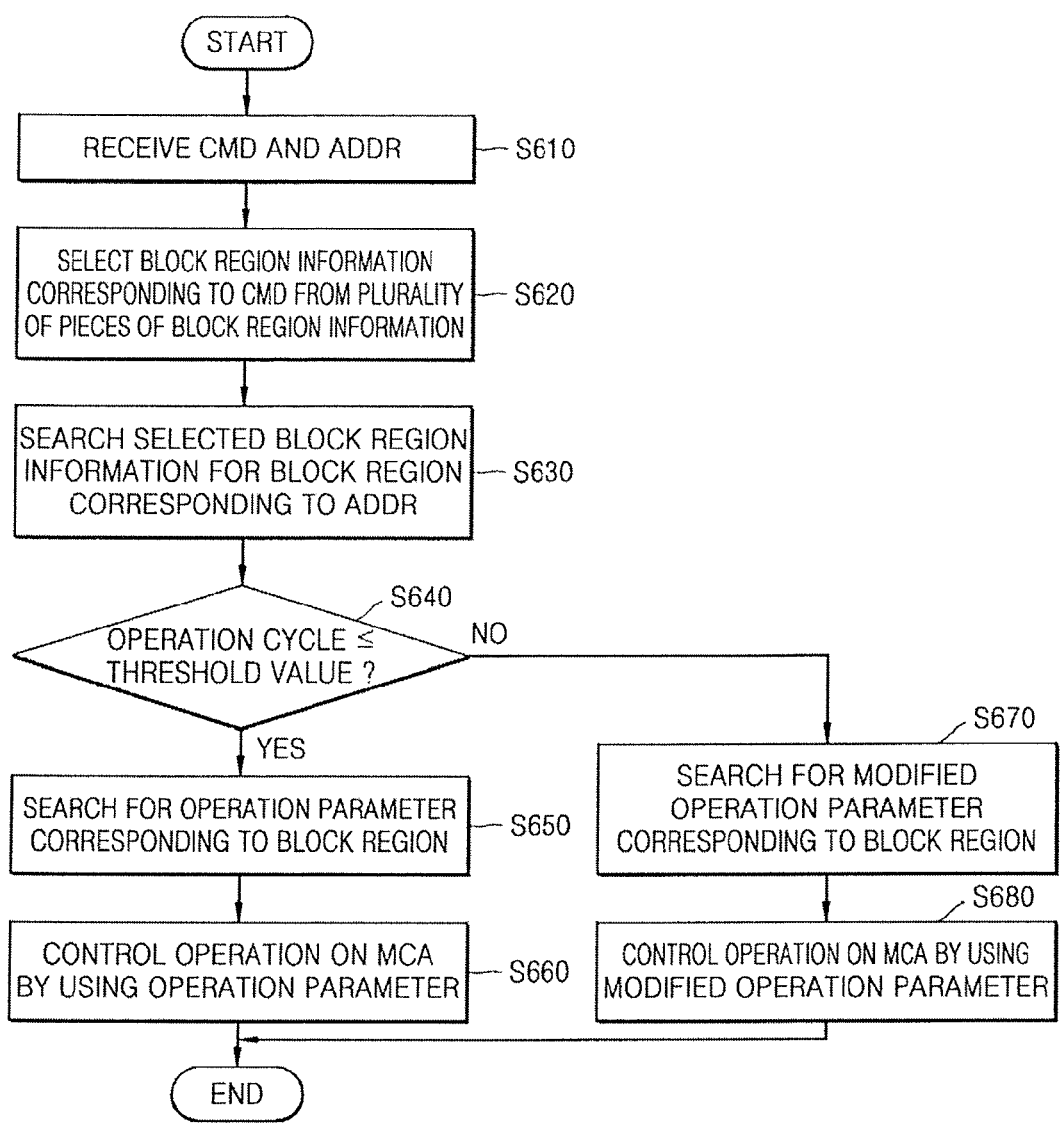
FIG. 51 is a flowchart of an example of a method of operating a memory device according to an exemplary embodiment of the present inventive concept.

FIG. 51 is a flowchart of an example of a method of operating a memory device according to an exemplary embodiment of the present inventive concept.

The method of FIG. 51 may include, for example, operations that are sequentially performed in the control logic 120b of FIG. 43. The description provided with reference to FIG. 43 may apply to the method of FIG. 51, and repeated description will be omitted.

In operation S610, a command and an address are received from a memory controller. In operation S620, block region information corresponding to the command is selected from among a plurality of pieces of block region information. For example, if the received command is a program command, block region information corresponding to a program operation may be selected from among the plurality of pieces of block region information included in the table REG_TABLE6 illustrated in FIG. 28.

In operation S630, the selected block region information is searched for a block region corresponding to the address. For example, if the received address is the third block BLK3, the block region information with respect to the program operation included in the table REG_TABLE6 illustrated in FIG. 28 may be searched for the second block region REG2 corresponding to the third block BLK3.

In operation S640, whether an operation cycle is equal to or less than a threshold value is determined. In an exemplary embodiment, the operation cycle may be a P/E cycle count. In an exemplary embodiment, the operation cycle may be a read cycle count. As a result of determining, if the operation cycle is equal to or less than the threshold value, operation S650 is performed, and otherwise, operation S670 is performed. However, the inventive concept is not limited thereto, and in an exemplary embodiment, whether an operation cycle is less than a threshold value may be determined in operation S640. As a result of determining, if the operation cycle is less than the threshold value, operation S650 may be performed, and otherwise, operation S670 may be performed.

In operation S650, an operation parameter corresponding to the block region is searched for. For example, the operation controller 123a searches the parameter information storing unit 122a for the operation parameter. The operation parameter may correspond to the first bias condition illustrated in FIG. 47, FIG. 48 or FIG. 49. In operation S660, an operation on a memory cell array is controlled using the operation parameter.

In operation S670, modified operation parameter information is searched for. For example, the operation controller 123a searches the parameter information storing unit 122a to select the modified operation parameter information corresponding to the selected block region. The modified operation parameter information may include the second bias condition illustrated in FIG. 47, FIG. 48 or FIG. 49. In operation S680, an operation on a memory cell array is controlled using the modified operation parameter information.

As described above, according to the present exemplary embodiment, block regions may be differently set according to commands, and different bias conditions may be set according to operation cycles. Thus, performance and reliability of a memory device may be further increased.

FIG. 52 illustrates a memory device 100c according to an exemplary embodiment of the present inventive concept.

Referring to FIG. 52, the memory device 100c may include a memory cell array 110a, a control logic 120c, a row decoder 140a, and a page buffer 150a. The memory device 100c is a modified example of the memory device 100a of FIG. 15, and description provided with reference to FIG. 15 may also apply to the present exemplary embodiment. Here, description will focus on differences from the exemplary embodiment of FIG. 15. In an exemplary embodiment, the memory device 100c may include the memory cell array illustrated in FIG. 17, FIG. 19, FIG. 21 or FIG. 24, and a method of setting block regions in a memory cell array may be modified in various manners.

According to an exemplary embodiment, the control logic 120c may include a block region information storing unit 121, a parameter information storing unit 122b, an operation controller 123b, and a data retention period information storing unit 125. Compared with the control logic 120 illustrated in FIG. 15, the control logic 120c of FIG. 52 may further include the data retention period information storing unit 125.

The block region information storing unit 121 may store information about block regions of a cell region CR1 included in the memory cell array 110a. In an exemplary embodiment, block region information may be generated by dividing a plurality of blocks into at least two block regions based on a distance with respect to a relatively close edge among first and second edges EDG1 and EDG2 of the cell region CR1. In an exemplary embodiment, block region information may be stored as a table showing block regions for corresponding blocks.

The data retention period information storing unit 125 may store information about a data retention period with respect to each block of a plurality of blocks BLK1 through BLK10 included in the memory cell array 110a. The data retention period information storing unit 125 may be implemented using a latch. In an exemplary embodiment, data retention period information may be stored in a region of the memory cell array 110a. In an exemplary embodiment, data retention period information may be stored in a buffer memory of a memory controller. In an exemplary embodiment, data retention period information may be stored in an additional non-volatile memory included in a memory system.

In an exemplary embodiment, a data retention period may be determined based on a program order stamp (POS) indicating a relative order among program operations. For example, the data retention period information storing unit 125 may store a POS allocated to a memory cell when a program operation or an erase operation is performed on the memory cell, and when a new POS is allocated to a memory cell, the data retention period information storing unit 125 may update the data retention period information. In an exemplary embodiment, the data retention period information storing unit 125 may sequentially store POSs according to respective block regions. In an exemplary embodiment, the data retention period information storing unit 125 may sequentially store block regions according to respective POSs.

Figure 53A:
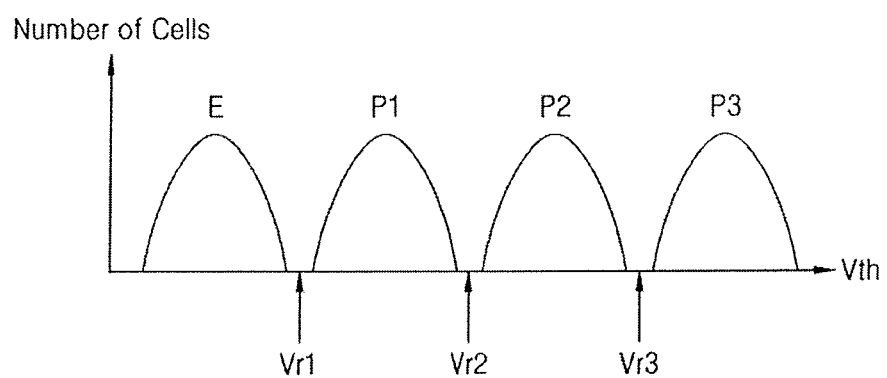
FIG. 53A is a graph showing a distribution according to a threshold voltage after programming of a memory device is completed.

FIG. 53A is a graph showing a threshold voltage distribution after programming of a memory device is completed.

Referring to FIG. 53A, a horizontal axis denotes a threshold voltage Vth, and a vertical axis denotes the number of memory cells. The memory cells may be the memory cells illustrated in FIG. 5 or FIG. 6. When a memory cell is a multi-level cell that is programmed to two bits, the memory cell may have one of an erase state E, a first program state P1, a second program state P2, and a third program state P3.

Each of first through third read voltages Vr1, Vr2, and Vr3 corresponds to an initially set default level. For example, the first read voltage Vr1 has a voltage level between a distribution of memory cells MC having the erase state E and a distribution of memory cells MC having the first program state P1. The second read voltage Vr2 has a voltage level between a distribution of memory cell MC having the first program state P1 and a distribution of memory cell MC having the second program state P2. The third read voltage Vr3 has a voltage level between a distribution of memory cell MC having the second program state P2 and a distribution of memory cell MC having the third program state P3.

Figure 53B:
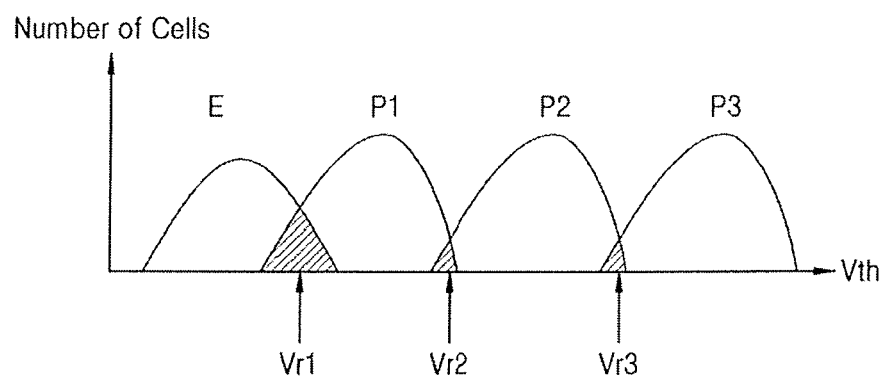
FIG. 53B is a graph showing a distribution according to a threshold voltage after a predetermined duration passes after programming of the memory device having the distribution of FIG. 53A is completed.

FIG. 53B is a graph showing a threshold voltage distribution according to a threshold voltage after a predetermined duration has passed after programming of the memory device having the threshold voltage distribution of FIG. 53A is completed.

Referring to FIG. 53B, the two adjacent threshold voltage distributions may overlap each other. For example, the shaded portion indicates to the overlapped portion of two adjacent threshold voltage distribution due to the increase of data retention periods. Since the read voltages Vr1 to Vr3 fall to the shaded regions, a read error may be caused in memory cells corresponding to the shaded portion of FIG. 53B, and accordingly, reliability of the memory device may be decreased.

For example, when performing a read operation on a memory device by using the first read voltage Vr1, even though memory cells MC corresponding to the shaded portion are programmed to the first program state P1, they may be determined to be in the erase state E. Consequently, an error may be generated in a read operation, and reliability of the memory device may decrease.

Referring to FIG. 52 again, operation parameters to be applied may be modified based on a data retention period. In an exemplary embodiment, to compensate for a reduction in a threshold voltage of the first through third program states P1, P2, and P3 due to an increase in a data retention period, a program voltage may be further increased as the data retention period increases, thereby increasing lower voltage levels of the first through third program states P1, P2, and P3. In an exemplary embodiment, to compensate for an increase in a threshold voltage of the erase state E due to an increase in a data retention period, an erase voltage applied to a substrate may be further increased as the data retention period increases, thereby increasing an upper voltage level of the erase state E. In an exemplary embodiment, to compensate for a shift of a valley due to an increase in a data retention period, a read determination voltage may be further reduced as the data retention period increases.

In an exemplary embodiment, if a data retention period is equal to or less than a threshold value, a reference bias condition in which the same operation parameters are commonly applied to block regions, and if a data retention period is greater than the threshold value, a first bias condition in which operation parameters are different according to positions of block regions may be applied. In an exemplary embodiment, if a data retention period is equal to or less than a threshold value, the first bias condition in which operation parameters are different according to positions of block regions may be applied, and if a data retention period is greater than the threshold value, a second bias condition in which operation parameters are different according to positions of block regions may be applied. The second bias condition may be generated by modifying some of the operation parameters included in the first bias condition.

The parameter information storing unit 122b may store information about operation parameters respectively corresponding to at least two block regions. The operation parameters represent parameters that constitute bias conditions for program, erase, and read operations. In an exemplary embodiment, parameter information may be stored as a table showing operation parameters for each block region.

In an exemplary embodiment, the parameter information storing unit 122b may store a first table including a reference bias condition that is commonly applied to a plurality of block regions and a second table including a first bias condition for each block region. In an exemplary embodiment, the parameter information storing unit 122b may store a second table including a first bias condition for each block region and a third table including a second bias condition for each block region. In an exemplary embodiment, the reference bias condition, the first bias condition may be different from the second bias condition. In an exemplary embodiment, the parameter information storing unit 122b may store all of the first through third tables.

The operation controller 123b may control an operation performed on each block region in the memory cell array 110a according to block region information, parameter information (bias conditions for operation parameters), and data retention period information. For example, the operation controller 123b may select bias conditions for operation parameters based on a data retention period, and control an operation performed on each block region of the memory cell array 110a using the selected bias conditions.

In an exemplary embodiment, the operation controller 123b may determine a data retention period, and if the data retention period is equal to or less than a threshold value, the operation controller 123a may search parameter information, for example, reference bias conditions, for a reference operation parameter and control an operation by using the reference bias conditions. If the data retention period is greater than the threshold value, the operation controller 123b may search block region information for a block corresponding to an address, search parameter information, for example, bias conditions, for an operation parameter corresponding to the block region, and control an operation by using the operation parameter corresponding to the block region.

In an exemplary embodiment, the operation controller 123b may search block region information for a block corresponding to an address, and determine a data retention period. If the data retention period is equal to or less than a threshold value, the operation controller 123b may search parameter information for an operation parameter corresponding to the block region, and control an operation by using the operation parameter corresponding to the block region. If the data retention period is greater than the threshold value, the operation controller 123b may search modified parameter information for operation parameters corresponding to the block region and control an operation by using the modified operation parameter information corresponding to the block region. In an exemplary embodiment, the parameter information may include bias conditions for operation parameters.

Although not illustrated, in an exemplary embodiment, the control logic 120c may further include the cycle information storing unit 124 illustrated in FIG. 43. The control logic 120c may select a bias condition based on cycle information and data retention period information, and may control an operation performed on each block region in a memory cell array by using the selected bias condition.

Figure 54:
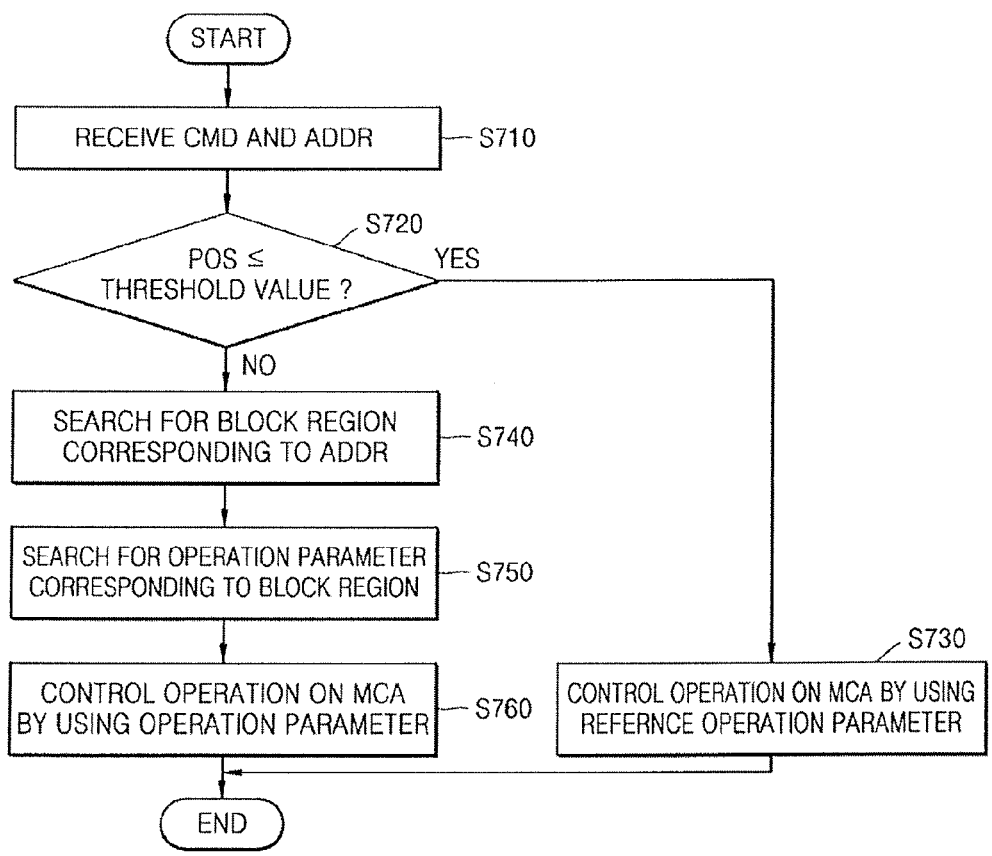
FIG. 54 is a flowchart of an example of a method of operating a memory device according to an exemplary embodiment of the present inventive concept.

FIG. 54 is a flowchart of an example of a method of operating a memory device according to an exemplary embodiment of the present inventive concept.

Referring to FIG. 54, a method of controlling an operation on a memory cell array may be performed in a control logic when a command and an address are received from a memory controller. The method may include, for example, operations that are sequentially performed in the control logic 120c of FIG. 52. The description provided with reference to FIG. 52 may apply to the method of the present exemplary embodiment, and repeated description will be omitted.

In operation S710, a command and an address are received from a memory controller. In operation S720, whether a POS is equal to or less than a threshold value is determined. As a result of determining, if the POS is equal to or less than the threshold value, operation S730 is performed, and otherwise, operation S740 is performed. However, the present inventive concept is not limited thereto, and in an exemplary embodiment, whether a POS is less than a threshold value may be determined in operation S720. As a result of determining, if the POS is less than the threshold value, operation S730 may be performed, and otherwise, operation S740 may be performed.

In operation S730, an operation on a memory cell array is controlled using reference operation parameter information. If a POS is less than a threshold value, spreading of threshold voltage distributions of memory cells may be relatively small to the extent that no overlaps between adjacent threshold voltage distributions occur. Thus, the operation controller 123b may control a program, erase or read operation on performed the cell region CR1 of the memory cell array 110a using the same reference operation parameter information.

In operation S740, a block region corresponding to the received address is searched for. For example, the operation controller 123b may search the block region information storing unit 121 for a block corresponding to the address. In operation S750, an operation parameter corresponding to the block region is searched for. For example, the operation controller 123b may search the parameter information storing unit 122b for operation parameter information corresponding to the block region. In operation S760, an operation on a memory cell array is controlled using the operation parameter information.

Figure 55:
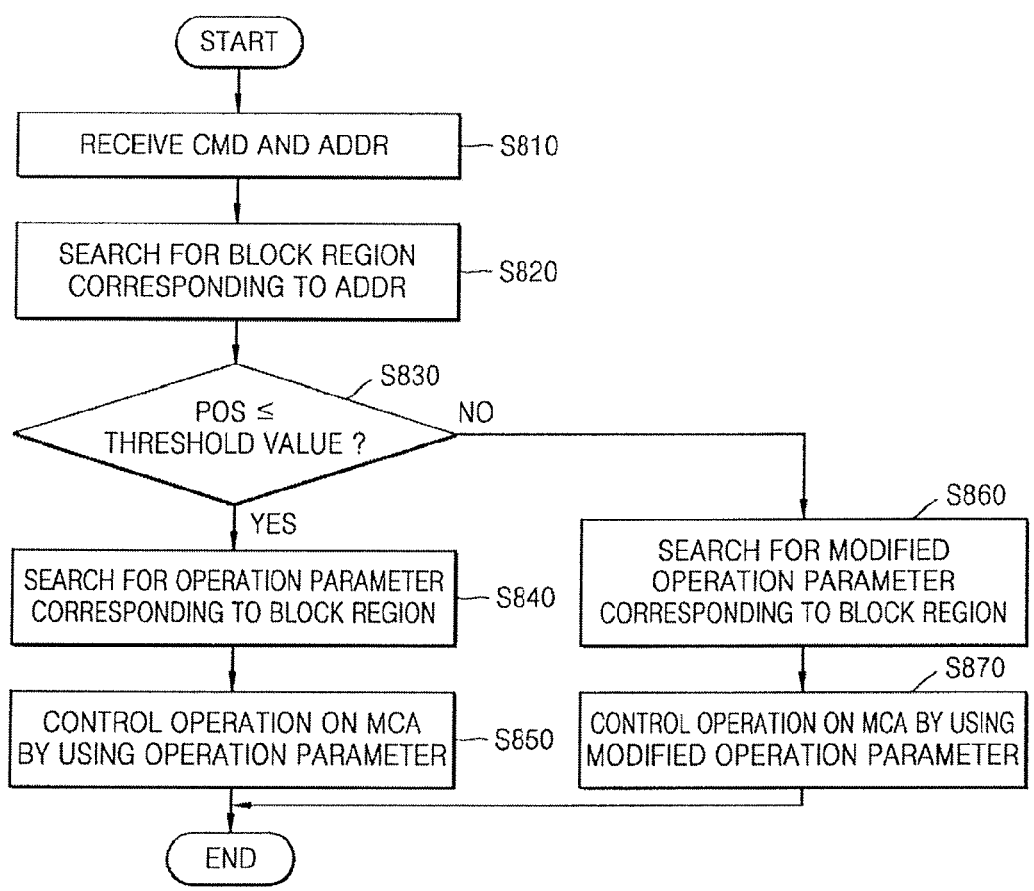
FIG. 55 is a flowchart of an example of a method of operating a memory device according to an exemplary embodiment of the present inventive concept.

FIG. 55 is a flowchart of an example of a method of operating a memory device according to an exemplary embodiment of the present inventive concept.

Referring to FIG. 55, operations may be sequentially performed in the control logic 120c of FIG. 52. The description provided with reference to FIG. 52 may apply to the method of the present exemplary embodiment, and repeated description will be omitted.

In operation S810, a command and an address are received from a memory controller. In operation S820, a block region corresponding to the received address is searched for. For example, the operation controller 123b may search the block region information storing unit 121 for a block corresponding to the address. In operation S830, whether a POS is equal to or less than a threshold value is determined. As a result of determining, if the POS is equal to or less than the threshold value, operation S840 is performed, and otherwise, operation S860 is performed. However, the present inventive concept is not limited thereto, and in an exemplary embodiment, whether a POS is less than a threshold value may be determined in operation S830. As a result of determining, if the POS is less than the threshold value, operation S840 may be performed, and otherwise, operation S860 may be performed.

In operation S840, operation parameter information corresponding to the block region is searched for. For example, the operation controller 123b searches the parameter information storing unit 122b for the operation parameter information. In operation S850, an operation on a memory cell array is controlled using the operation parameter information.

In operation S860, modified operation parameter information is searched for. For example, the operation controller 123b may search the parameter information storing unit 122b for the modified operation parameter information. In operation S870, an operation on a memory cell array is controlled using the modified operation parameter information. In an exemplary embodiment, the modified operation parameter information may include bias condition for operations parameters.

Figure 56:
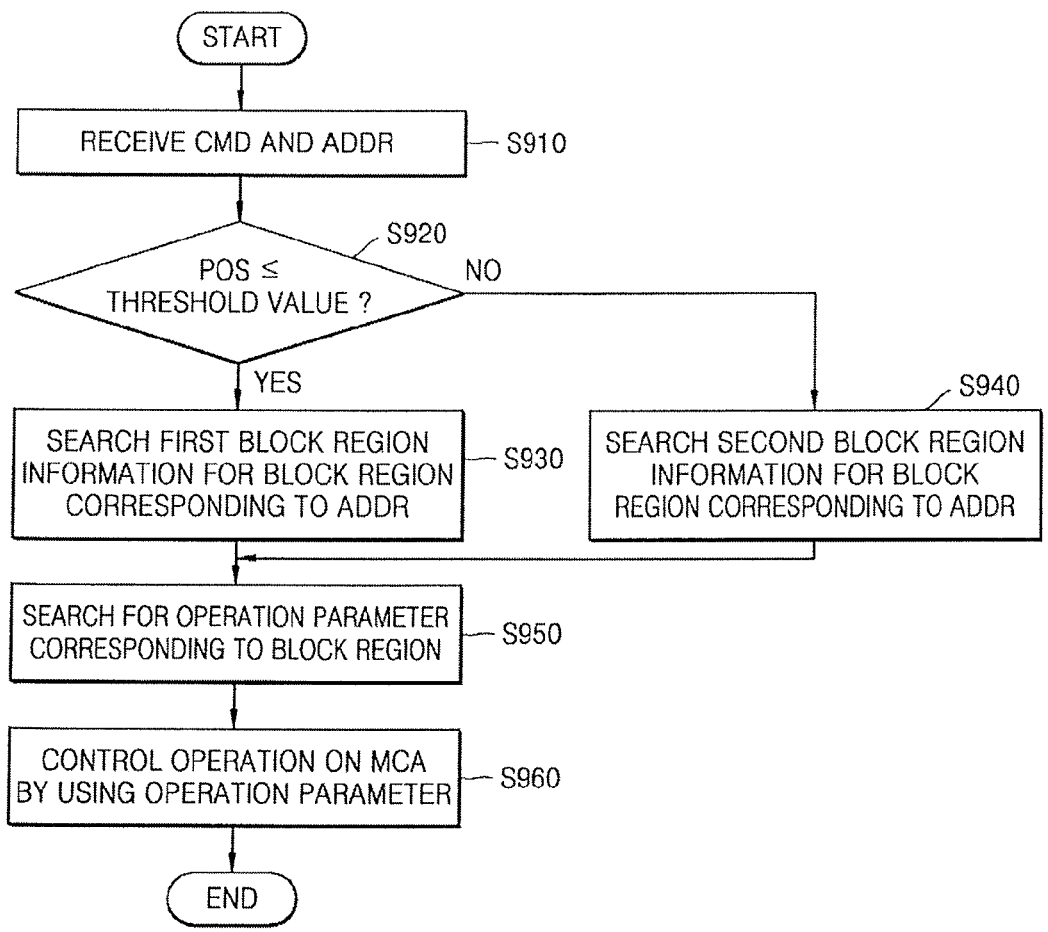
FIG. 56 is a flowchart of an example of a method of operating a memory device according to an exemplary embodiment of the present inventive concept.

FIG. 56 is a flowchart of an example of a method of operating a memory device according to an exemplary embodiment of the present inventive concept.

Referring to FIG. 56, the method of operating a memory device according to the present exemplary embodiment may include, for example, operations that are sequentially performed in the control logic 120c of FIG. 52. The description provided with reference to FIG. 52 may apply to the method of the present exemplary embodiment, and repeated description will be omitted.

In operation S910, a command and an address are received from a memory controller. In operation S920, whether a POS is equal to or less than a threshold value is determined. As a result of determining, if the POS is equal to or less than the threshold value, operation S930 is performed, and otherwise, operation S940 is performed. However, the present inventive concept is not limited thereto, and in an exemplary embodiment, whether a POS is less than a threshold value may be determined in operation S920. As a result of determining, if the POS is less than the threshold value, operation S930 may be performed, and otherwise, operation S940 may be performed.

In operation S930, first block region information is searched for a block corresponding to the address. The first block region information may be information indicating a plurality of blocks in a cell region CR1, divided into at least two block regions according to a first method of setting block regions. In an exemplary embodiment, the first block region information may be applied when a data retention period is a first period. For example, the operation controller 123b may search the first block region information stored in the block region information storing unit 121 for a block corresponding to the address.

In operation S940, second block region information is searched for a block corresponding to the address. The second block region information may be information indicating to a plurality of blocks in the cell region CR1, divided into at least two block regions according to a second method of setting block regions. In the present exemplary embodiment, the second block region information may be applied when a data retention period is a second period greater than the first period. For example, the operation controller 123b may search the second block region information stored in the block region information storing unit 121 for a block corresponding to the address. In an exemplary embodiment, the first and the second block region information may include a block region assigned to a block corresponding to an address.

In operation S950, an operation parameter information corresponding to the block region is searched for. For example, the operation controller 123b searches the parameter information storing unit 122b for the operation parameter information. In an exemplary embodiment, the operation controller 123b may search the parameter information storing unit 122b for operation parameter information, for example, reference bias conditions. In operation S960, an operation on a memory cell array is controlled using the operation parameter information.

As described above, block regions may be differently set according to POSs. For example, according to the first block region information applied to operations prior to a POS corresponding to a threshold value, a third block BLK3 that is third most adjacent to the first edge EDG1 may correspond to the second block region REG2; according to the second block region information applied to operations after the POS corresponding to the threshold value, the third block BLK3 may correspond to the first block region REG1. Accordingly, a program operation may be performed on the third block BLK3 by using operation parameters according to the second block region REG2 before the POS corresponding to the threshold value, and after the POS corresponding to the threshold value, a program operation may be performed on the third block BLK3 by using operation parameters according to the first block region REG1.

Figure 57:
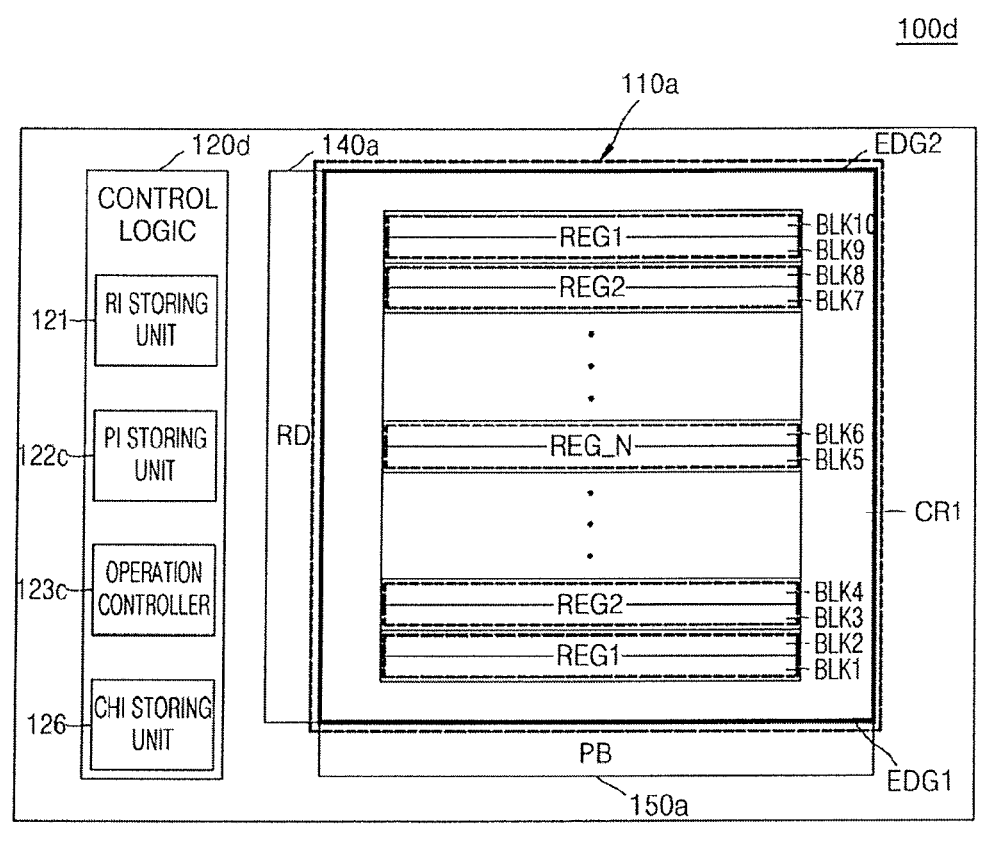
FIG. 57 illustrates a memory device according to an exemplary embodiment of the present inventive concept.

FIG. 57 illustrates a memory device 100d according to an exemplary embodiment of the present inventive concept.

Referring to FIG. 57, the memory device 100d may include a memory cell array 110a, a control logic 120d, a row decoder 140a, and a page buffer 150a. The memory device 100d is a modified example of the memory device 100a of FIG. 15, and description provided with reference to FIG. 15 may also apply to the present exemplary embodiment. Here, description will focus on differences from the exemplary embodiment of FIG. 15. In an exemplary embodiment, the memory device 100d may include the memory cell array illustrated in FIG. 17, FIG. 19, FIG. 21 or FIG. 24, and a method of setting block regions in a memory cell array may be modified in various manners.

According to an exemplary embodiment, the control logic 120d may include a block region information storing unit 121, a parameter information storing unit 122c, an operation controller 123c, and a chip information storing unit 126. Compared with the control logic 120 illustrated in FIG. 15, the control logic 120d may further include the chip information storing unit 126.

The block region information storing unit 121 may store information about block regions of a cell region CR1 included in the memory cell array 110a. In the an embodiment, block region information may be generated by dividing a plurality of blocks into at least two block regions based on a distance with respect to a relatively close edge among first and second edges EDG1 and EDG2 of the cell region CR1. In an exemplary embodiment, block region information may be stored as a table showing block regions for corresponding blocks.

The parameter information storing unit 122c may store information about operation parameters respectively corresponding to at least two block regions. The operation parameters refer to parameters that constitute bias conditions for program, erase, and read operations. In an exemplary embodiment, parameter information may be stored as a table including bias conditions for operation parameters corresponding to each block region.

The chip information storing unit 126 may store information of a chip in which the memory device 100d is implemented. The chip information storing unit 126 may be implemented using a latch. In an exemplary embodiment, chip information may be stored in a region of the memory cell array 110a. In an exemplary embodiment, chip information may be stored in a buffer memory of a memory controller. In an exemplary embodiment, chip information may be stored in an additional non-volatile memory included in a memory system.

The difference in channel hole diameters of blocks described with reference to FIG. 9 may be generated due to process variations of manufacturing the memory device 100d. To accommodate such difference of channel hole diameters due to process variations, bias conditions of operation parameters applied to the memory device 100d may be controlled with reference to chip information related to the manufacturing the memory device 100d. In this case, reliability of the memory device 100d may be further increased. For example, the chip information may include information indicating a chip position in a wafer, a wafer position in a lot or information about equipment used in the manufacturing processes of the chip.

The operation controller 123c may control an operation performed on each block region of the memory cell array 110a using block region information, parameter information, and chip information. For example, the operation controller 123c may select bias conditions for operation parameters based on chip information, and control an operation performed on each block region of the memory cell array 110a using the selected bias conditions.

Although not illustrated, in an exemplary embodiment, the control logic 120d may further include the cycle information storing unit 124 illustrated in FIG. 43. The control logic 120d may select a bias condition based on cycle information and chip information, and may control an operation performed on each block region in a memory cell array using the selected bias condition. In an exemplary embodiment, the control logic may further include the data retention period information storing unit 125. The control logic 120d may select a bias condition based on data retention period information and chip information, and may control an operation on each block region in a memory cell array using the selected bias condition.

Figure 58:
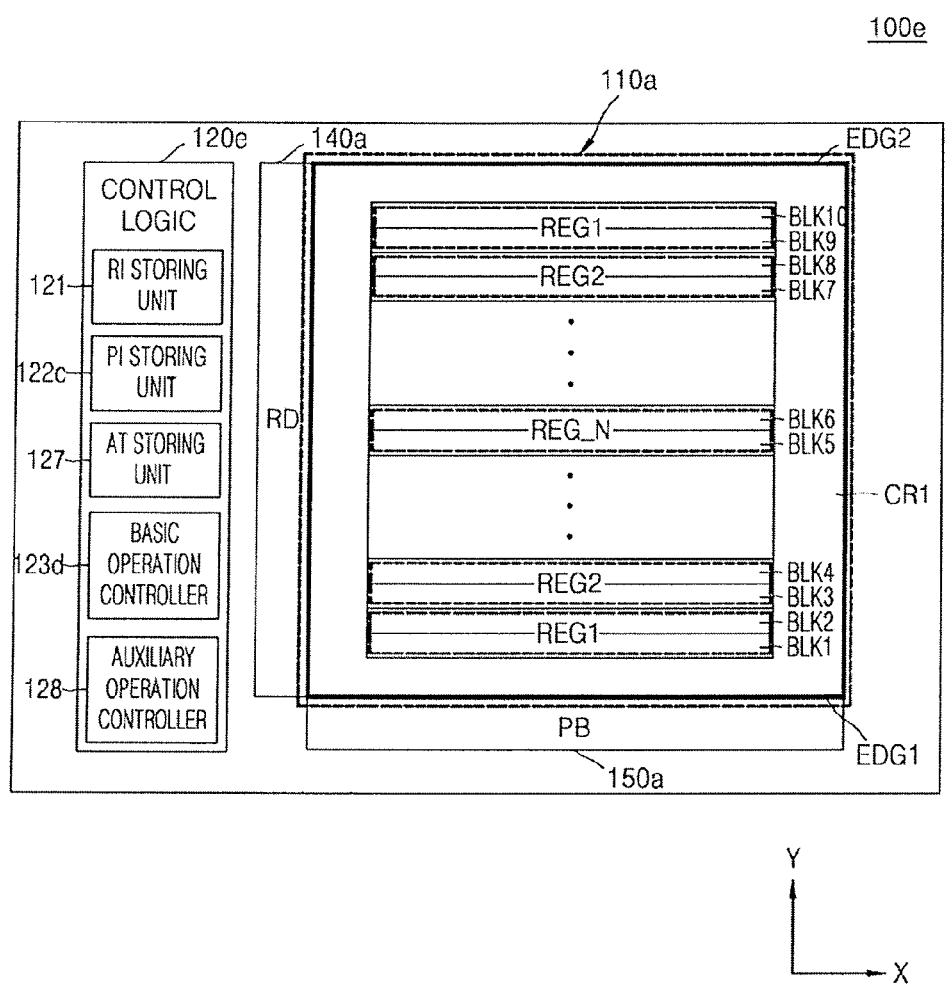
FIG. 58 illustrates a memory device according to an exemplary embodiment of the present inventive concept.

FIG. 58 illustrates a memory device 100e according to an exemplary embodiment of the present inventive concept.

Referring to FIG. 58, the memory device 100e may include a memory cell array 110a, a control logic 120e, a row decoder 140a, and a page buffer 150a. The memory device 100e is a modified example of the memory device 100a of FIG. 15, and description provided with reference to FIG. 15 may also apply to the present exemplary embodiment. Here, description will focus on differences from the exemplary embodiment of FIG. 15. In an exemplary embodiment, the memory device 100e may include the memory cell array illustrated in FIG. 17, FIG. 19, FIG. 21 or FIG. 24, and a method of setting block regions in a memory cell array may be modified in various manners.

The control logic 120e may include a block region information storing unit 121, a parameter information storing unit 122d, a basic operation controller 123d, an algorithm table storing unit 127, and an auxiliary operation controller 128. Compared with the control logic 120 illustrated in FIG. 15, the control logic 120e may further include the algorithm table storing unit 127 and the auxiliary operation controller 128.

The block region information storing unit 121 may store information about block regions of a cell region CR1 included in the memory cell array 110a. In an exemplary embodiment, block region information may be generated by dividing a plurality of blocks into at least two block regions based on a distance with respect to a relatively close edge among first and second edges EDG1 and EDG2 of the cell region CR1. In an exemplary embodiment, block region information may be stored as a table showing block regions for corresponding blocks. For example, the block information storing unit 121 may store the table REG_TABLE1 illustrated in FIG. 16.

In an exemplary embodiment, the memory cell array 110a may include a plurality of lower blocks disposed on a substrate and a plurality of upper blocks disposed on the plurality of lower blocks as illustrated in FIG. 22A or FIG. 22B. The plurality of lower blocks and the plurality of upper blocks may be divided into block regions according to different methods of setting block regions, and accordingly, lower blocks and upper blocks that are substantially at the same distance with respect to the first edge EDG1 or the second edge EDG2 may be included in different block regions and different algorithm information may be respectively applied to the lower blocks and the upper blocks. [Note to client: . . . .]

The parameter information storing unit 122d may store information about operation parameters for at least two block regions. The operation parameters represent parameters that constitute bias conditions for basic operations such as program, erase, and read operations. In an exemplary embodiment, parameter information may be stored as a table showing bias conditions for block regions.

In addition, the parameter information storing unit 122d may store, according to block regions, parameters for modifying a type of an algorithm corresponding to an auxiliary operation that may be additionally performed in each operation mode on the memory cell array 110a or a detailed condition of the algorithm or modifying whether the algorithm is to be performed or not.

The algorithm table storing unit 127 may store algorithm information of block regions in the form of a table. Algorithm information may indicate whether algorithms are applied to block regions or not. An algorithm may include a series of operation sequences to perform an auxiliary operation on the memory cell array 110a. In an exemplary embodiment, an auxiliary operation may be an operation that is additionally performed in an operation mode of an operation (hereinafter, referred to as a 'basic operation') such as a program, erase or read operation on the memory cell array 110a. Operation circuits used in the memory device 100d may vary according to whether an algorithm is applied or not or according to a type of an algorithm.

In an exemplary embodiment, algorithm information may be determined according to block regions. Thus, the same algorithms may be applied to the same block regions, and accordingly, an auxiliary operation may be performed by using the same algorithm with respect to different blocks included in the same block region.

For example, the first block region REG1 has a first channel hole diameter, and the Nth block region REG_N has a second channel hole diameter which is greater than the first channel hole diameter. Memory cells included in the Nth block region REG_N has a first word line resistance greater than a second word line resistance of memory cells included in the first block region REG1. In an exemplary embodiment, the first word line resistance may be greater than the second word line resistance. Thus, in a word line set up operation, an over-drive algorithm is applied to the Nth block region REG_N, and an over-drive algorithm need not be applied to the first block region REG1. Accordingly, different operation circuits may be performed during program operations on the first block region REG1 and the Nth block region REG_N.

In an exemplary embodiment, the algorithm table storing unit 127 may be implemented using a latch. In an exemplary embodiment, an algorithm table may be stored in a region of the memory cell array 110a. In an exemplary embodiment, an algorithm table may be stored in a buffer memory of a memory controller. In an exemplary embodiment, an algorithm table may be stored in an additional non-volatile memory included in a memory system.

In an exemplary embodiment, the algorithm table storing unit 127 may store algorithm information that is modified according to an operation cycle count. For example, the algorithm table storing unit 127 may store algorithm information corresponding to an operation cycle count that is equal to or less than a threshold value, and modified algorithm information corresponding to an operation cycle count that is greater than the threshold value. Accordingly, different operation algorithms may be applied according to operation cycle counts. In an exemplary embodiment, operation cycle count information may be stored in a region of the memory cell array 110a. In an exemplary embodiment, operation cycle count information may be stored in a buffer memory of a memory controller. In an exemplary embodiment, operation cycle count information may be stored in an additional non-volatile memory included in a memory system. This will be described further in detail with reference to FIGS. 61 and 62.

In an exemplary embodiment, the algorithm table storing unit 127 may store algorithm information that is modified according to a data retention period. For example, the algorithm table storing unit 127 may store algorithm information corresponding to a data retention period that is equal to or less than a threshold value, and modified algorithm information corresponding to a data retention period that is greater than the threshold value. Accordingly, different operation algorithms may be applied according to data retention periods. In an exemplary embodiment, data retention period information may be stored in a region of the memory cell array 110a. In an exemplary embodiment, data retention period information may be stored in a buffer memory of a memory controller. In an exemplary embodiment, data retention period information may be stored in an additional non-volatile memory included in a memory system.

FIG. 59 illustrates an example of an algorithm table ALG_TABLE1 stored in the algorithm table storing unit 127 of FIG. 58.

Referring to FIG. 59, the algorithm table ALG_TABLE1 may include first algorithm information indicating whether algorithms are applied to the first block region REG1 and second algorithm information indicating whether algorithms are applied to the Nth block region REG_N. The present inventive concept is not limited thereto, and in an exemplary embodiment, the table ALG_TABLE1 may further include information indicating whether algorithms are applied to other block regions. In an exemplary embodiment, the table ALG_TABLE1 may further include information indicating whether other algorithms are applied to the first block region REG1 and the Nth block region REG_N.

The first block region REG1 may include, for example, blocks adjacent to the first and second edges EDG1 and EDG2 of the cell region CR1, and the Nth block region REG_N may include, for example, blocks in a center of the cell region CR1. Accordingly, a channel hole diameter of strings included in the first block region REG1 may be smaller than a channel hole diameter of strings included in the Nth block region REG_N. Thus, a program speed and an erase speed with respect to memory cells included in the first block region REG1 may be higher than a program speed and an erase speed with respect to memory cells included in the Nth block region REG_N.

Applying of various algorithms to block regions may reduce a difference in operating characteristics between the first block region REG1 and the Nth block region REG_N. Thus, a threshold voltage distribution of memory cells included in the first block region REG1 may be similar to a distribution of memory cells included in the Nth block region REG_N. Hereinafter, various algorithms are described. According to exemplary embodiments, only some of the various algorithms may be applied or other algorithms may be additionally applied.

In an exemplary embodiment, a pre-program algorithm may be applied to the first block region REG1 so that a pre-program operation is performed on the first block region REG1, and the pre-program algorithm need not be applied to the Nth block region REG_N. The pre-program operation is an operation of programming all memory cells in a block to a preset level or higher before performing an erase cycle, to limit the number of over erased memory cells in the block. The pre-program operation may cause charge storage layers of all memory cells in the block to have an identical amount of charges.

In an exemplary embodiment, a post-program algorithm may be applied to the first block region REG1 so that a post-program operation is performed on the first block region REG1, and the post-program operation need not be applied to the Nth block region REG_N. The post-program operation is an operation of programming some memory cells in a block to a preset level or higher after performing an erase cycle, to limit the number of over erased memory cells in the block.

An erase speed with respect to the memory cells included in the first block region REG1 may be relatively higher than an erase speed of the memory cells included in the Nth block region REGN, which have a greater channel hole diameter than that of the memory cells in the first block region REG1. Thus, the number of over erased memory cells in the first block region REG1 may be reduced by applying a pre-program algorithm or a post-program algorithm to the first block region REG1, thereby increasing reliability of the memory device. In an exemplary embodiment, to increase reliability of a memory device in regard to an erase operation, another algorithm may be further applied to the first block region REG1.

In an exemplary embodiment, sub-blocks need not be applied to the first block region REG1 but sub-blocks may be applied to the Nth block region REG_N. A block may be divided into at least two sub-blocks. For example, memory cells disposed at levels adjacent to a ground selection line may be allocated to a first sub-block, and memory cells disposed adjacent to a string selection line may be allocated to a second sub-block. Accordingly, an erase operation may be performed according to sub-blocks in a block of the Nth block region REG_N.

As the memory cells included in the first block region REG1 have a first channel hole diameter to the extent that a read disturb may be generated. As such, a threshold voltage distribution is spread due to a read inhibit voltage applied during repeated read operations. A read inhibit voltage is applied in units of physical blocks to the first block region REG1, and a read inhibit voltage is applied in units of sub-blocks to the Nth block region REG_N. If a read cycle is not controlled in units of sub-blocks which are each a logically single block, a reclaim operation may frequently occur, resulting in degradation of performance of a memory device. For example, a read reclaim cycle period of memory cells included in the first block region REG1 is shorter than a read reclaim cycle period of memory cells included in the Nth block region REG_N. In an exemplary embodiment, sub-blocks need not be applied to the first block region REG1.

In an exemplary embodiment, a count pulse program algorithm may be applied to the first block region REG1 so that a count pulse program operation is performed on the first block region REG1, and a count pulse program algorithm need not be applied to the Nth block region REG_N. In an exemplary embodiment, a time when to apply a count pulse program algorithm may be differently set with respect to the first block region REG1 and the Nth block region REG_N.

A count pulse program operation may be referred to as a detrapping operation and is an operation of supplying a detrapping voltage to a selected memory cell between a program operation and a verify operation to move charges trapped in a programmed memory cell. After a program operation is completed, charges trapped in a charge storage layer are rearranged in several to several tens of seconds, and this rearrangement is referred to as an initial verify shift (IVS). By applying a count pulse between a program operation and a verify operation, an electric field which is in an opposite direction to a direction of a program operation may be applied between a gate electrode and a channel region of a memory cell so that IVS is generated relatively early.

In an exemplary embodiment, a soft program algorithm may be applied to the first block region REG1 so that a soft program operation is performed on the first block region REG1, and a soft program algorithm need not be applied to the Nth block region REG_N. As a result of performing a verify operation, a threshold voltage of a verify-passed memory cell may be reduced, and thus, a soft program operation may be performed again in a next program loop of the memory cell.

In an exemplary embodiment, an off string search algorithm may be applied to the first block region REG1 so that an off string search operation is performed on the first block region REG1, and an off string search algorithm need not be applied to the Nth block region REG_N. Due to a variation of a manufacturing process, some pillars are formed in channel holes such that the pillars are not in contact with a substrate. In this case, such pillars may be defective, and may form an off string pillar having a non-contact state between a channel region formed in the pillars and the substrate. In addition, when a drain is formed, the drain is not in contact with the pillars having the non-contact state. For example, if a channel hole is small to the extent that a pillar does not fill the channel hole or if the channel hole is not open to expose the drain, an off string pillar may be formed. The off string pillar may cause a malfunction in a program, erase or read operation on a memory block, and thus, an operation of detecting an off string pillar may be performed in advance.

In an exemplary embodiment, a priority may be given to a retention table among the operation parameters with respect to the first block region REG1 to perform a read recovery operation on the first block region REG1. For example, if a channel hole diameter is small to the extent that a displacement with respect to charge shift is relatively great and thus a probability of read errors increases as a data retention period increases. Thus, for the first block region REG1, a priority may be given to a retention table in a predefined table (PDT) to perform a read recovery operation on the first block region REG1.

In an exemplary embodiment, a priority may be given to an endurance table with respect to the Nth block region REG_N to perform a read recovery operation on the Nth block region REG_N. For example, if a channel hole diameter is large to the extent that a program operation or an erase operation is not properly performed for a P/E cycle count, a probability of read errors may increase. Thus, with respect to the Nth block region REG_N, a priority may be given to an endurance table to perform a read recovery operation on the Nth block region REG_N.

In an exemplary embodiment, if a read error is caused due to a shift in a threshold voltage distribution (or overlapping of neighbouring threshold voltage distributions), a valley search operation may be performed by using different methods of searching for valleys according to block regions and different valley search orders according to block regions. For example, characteristics of a read error generated in a block may be recognized according to positions of block regions, and a read recovery operation may be performed using different methods and different orders according to block regions.

Hereinafter, various examples of a read recovery operation will be described. As will be described later, a read recovery operation may be performed using various algorithms, and here, types of algorithms applied to the read recovery operation and an application order of the algorithms may be different according to block regions in a cell region.

In an exemplary embodiment, a read recovery operation may be performed using a read retry operation in which a read operation is repeated by changing a read level until correction of a read error is completed, and here, a read retry algorithm may be applied. In an exemplary embodiment, a read recovery operation may be performed using a history level read retry operation in which a read operation is performed again using a read level that has been used in a previous successful read operation. Here, a history level read retry algorithm may be applied.

In an exemplary embodiment, a read recovery operation may be performed using a predefined table (PDT) read retry operation in which a read operation is performed again based on a table including information about previously-set read levels, and here, a PDT read retry algorithm may be applied. The PDT may include information about read voltage levels that are determined according to predicted distortion in a threshold voltage distribution of memory cells. [Note to client: how predicted?]

As an example, a read recovery operation may be performed using a minimum error search (MES) operation in which memory cells are read using read levels spaced apart from each other at equal intervals around a valley, and a read level having a smallest value between pieces of read data is used as a final read voltage, and here a MES algorithm may be applied. As an example, a read recovery operation may be performed using a read level swing operation in which a memory cell is read using voltage levels around a read level determined as an optimum read level in a previous operation, and here a read level swing algorithm may be applied.

As an example, a read recovery operation may be performed using a monitoring cell search operation in which monitoring cells are read, and distortion of a distribution of memory cells is measured based on a result of reading, and a read voltage is adjusted based on a result of measuring. Here, a monitoring cell search algorithm may be performed. The monitoring cells may be cells that are previously set to measure distortion of a distribution. The monitoring cells may be cells that have the same structure as memory cells, are at previously set locations, and are programmed to previously set data.

As an example, a read recovery operation may be performed using a Last Sector Count of One/Read Voltage Tracking Loop (LSCO/RVTL) operation in which the number of '1's of read data and a reference value are compared, distortion of a threshold voltage distribution is measured based on a result of comparing, and a read voltage level is determined based on a result of measuring. Here, a LSCO/RVTL algorithm may be applied. The reference value may be programmed to memory cells together with data, and may include information about a prediction value of data read as '1' in a read operation.

Whether an algorithm is to be applied or not to block regions is described above based on correlation between a difference in geometrical shapes such as a channel hole diameter and characteristics of memory cells. Thus, if bias conditions regarding basic operations such as a program, erase or read operation are applied according to respective block regions in order to compensate for a difference in characteristics of memory cells due to a difference in geometrical shapes, the above-described algorithm table ALG_TABLE1 may be modified. For example, whether to apply algorithms to the first block region REG1 may be changed the other way around.

Referring to FIG. 58 again, the basic operation controller 123d may control a basic operation such as a program operation, a read operation, or an erase operation on the memory cell array 110a, according to block regions, based on block region information and operation parameter information. For example, when a program command is received, the basic operation controller 123d may search block region information for a block corresponding to an address, search parameter information for an operation parameter corresponding to the block region, and control a program operation by using the operation parameter information corresponding to the block region.

The auxiliary operation controller 128 may control an auxiliary operation on the memory cell array 110a according to block regions, based on block region information and an algorithm table. For example, when an erase command is received, the auxiliary operation controller 128 may search the block region information for a block corresponding to an address, determine whether an algorithm corresponding to a block region is applied, based on the algorithm table, and selectively apply an auxiliary operation such as a pre-program operation or a post-program operation by using a selected algorithm.

Figure 60:
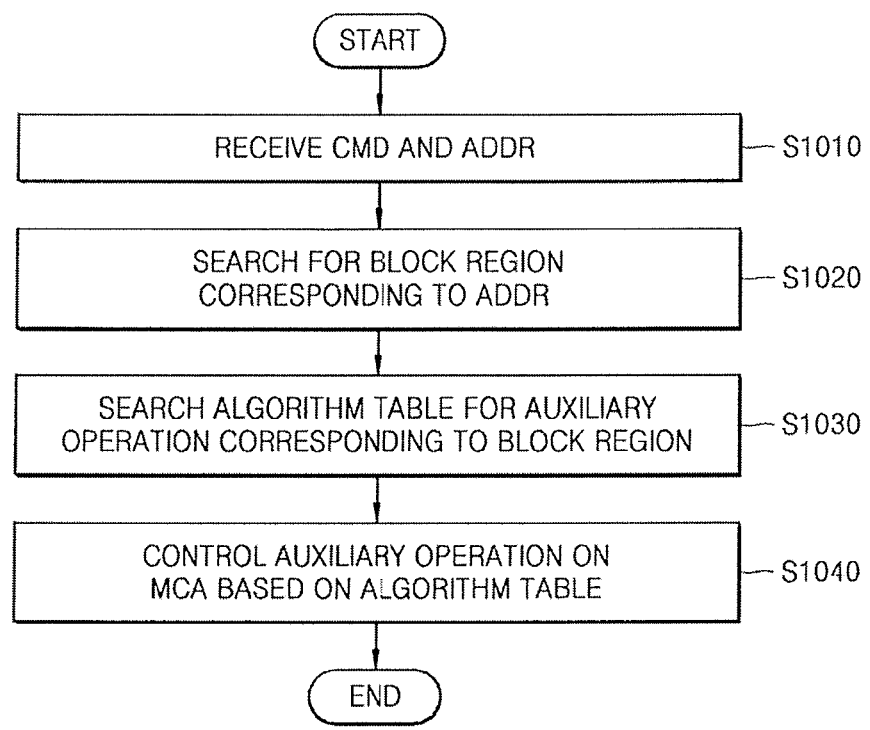
FIG. 60 is a flowchart of a method of operating a memory device according to an exemplary embodiment of the present inventive concept.

FIG. 60 is a flowchart of a method of operating a memory device according to an exemplary embodiment of the present inventive concept.

Referring to FIG. 60, the method of operating a memory device according to the present exemplary embodiment may include controlling an operation on a memory cell array performed in a control logic when a command and an address are received from a memory controller. The method may include, for example, operations that are sequentially performed in the control logic 120e of FIG. 58. The description provided with reference to FIGS. 58 and 59 may apply to the method of the present exemplary embodiment, and repeated description will be omitted.

In operation S1010, a command and an address are received from a memory controller. For example, the control logic 120d may receive a command and an address from the memory controller to thereby initiate an operation of the control logic 120d. In operation S1020, a block region corresponding to the received address is searched for. For example, the basic operation controller 123d and the auxiliary operation controller 128 may search the block region information storing unit 121 for the block region corresponding to the address.

In operation S1030, an algorithm table is searched for an auxiliary operation corresponding to the block region. For example, the auxiliary operation controller 128 may search the algorithm table storing unit 127 regarding whether algorithms are to be applied to block regions, and determine an auxiliary operation corresponding to the selected algorithms.

In operation S1040, an auxiliary operation on a memory cell array is controlled based on the algorithm table. For example, the auxiliary operation controller 128 may control the row decoder 140a and the page buffer 150a such that the row decoder 140a and the page buffer 150a perform an auxiliary operation corresponding to the selected algorithm on the memory cell array.

Figure 61:
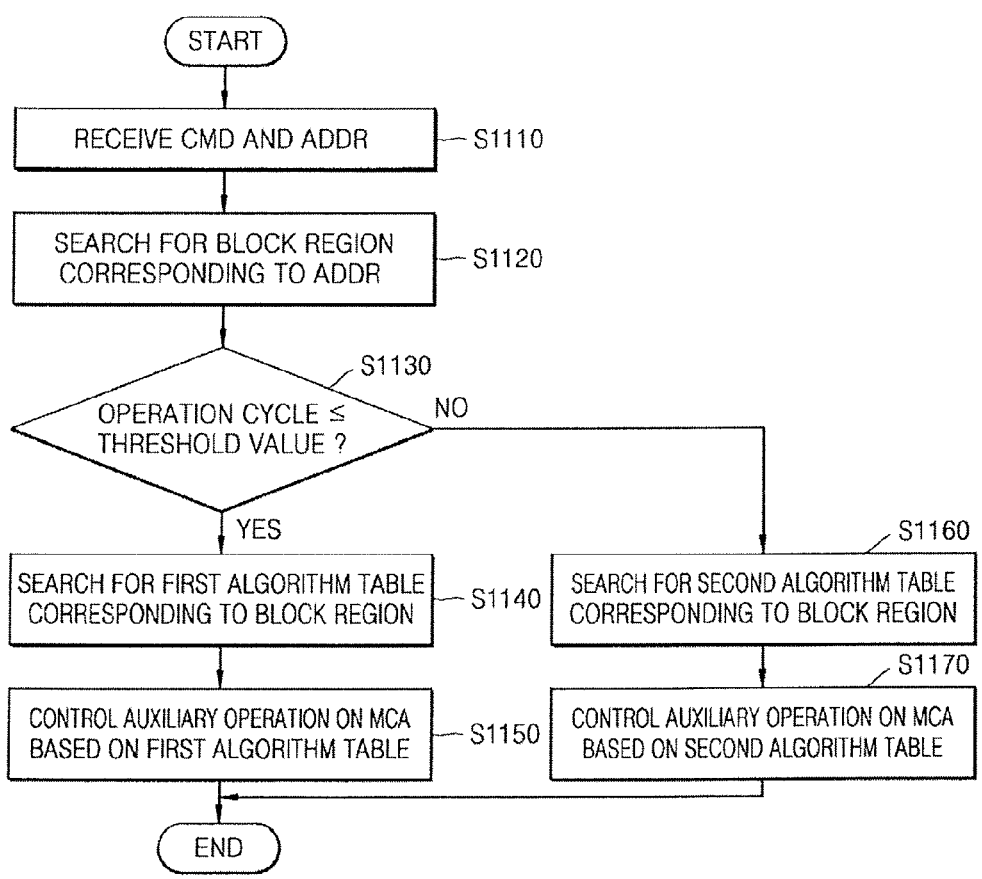
FIG. 61 is a flowchart of a method of operating a memory device according to an exemplary embodiment of the present inventive concept.

FIG. 61 is a flowchart of a method of operating a memory device according to an exemplary embodiment of the present inventive concept.

Referring to FIG. 61, the method of operating a memory device is a modified example of the method illustrated in FIG. 60, and description provided with reference to FIGS. 58 and 59 may also apply to the present exemplary embodiment, and repeated description will be omitted.

In operation S1110, a command and an address are received from a memory controller. In operation S1120, a block region corresponding to the received address is searched for. In operation S1130, whether an operation cycle is equal to or less than a threshold value is determined. In an exemplary embodiment, the operation cycle may be a P/E cycle count. In an exemplary embodiment, the operation cycle may be a read cycle count. As a result of determining, if the operation cycle is equal to or less than the threshold value, operation S1140 is performed, and otherwise, operation S1160 is performed. However, the present inventive concept is not limited thereto, and in an exemplary embodiment, whether an operation cycle is less than a threshold value may be determined in operation S1130. As a result of determining, if the operation cycle is less than the threshold value, operation S1140 may be performed, and otherwise, operation S1160 may be performed.

However, the present inventive concept is not limited thereto, and in an exemplary embodiment, different algorithm tables may be applied according to data retention periods. For example, whether a POS is equal to or less than a threshold value is determined, and if the POS is less than the threshold value as a result of determining, operation S1140 may be performed, and otherwise operation S1160 may be performed.

In operation S1140, a first algorithm table corresponding to a block region is searched for. For example, the auxiliary operation controller 128 searches the algorithm table storing unit 127 for the first algorithm table. The first algorithm table may correspond to a first algorithm table illustrated in FIG. 62. In operation S1150, an auxiliary operation on a memory cell array is controlled based on the first algorithm table.

In operation S1160, a second algorithm table corresponding to a block region is searched for. For example, the auxiliary operation controller 128 searches the algorithm table storing unit 127 for the second algorithm table. The second algorithm table may correspond to a second algorithm table illustrated in FIG. 62. In operation S1170, an auxiliary operation on a memory cell array is controlled based on the second algorithm table.

As a P/E cycle count increases, charges may unintentionally be trapped in a charge storage layer, which may result in an error in an erase verify operation. For example, an erase operation on a predetermined word line may be unsuccessful during a P/E cycle, and here, if an erase verify operation is performed by applying an erase verify voltage to each of all word lines at the same time, erase failure of a predetermined word line may be undetected. Thus, in addition to a method of applying an erase verify voltage to all word lines, a method of performing an erase verify operation by applying an erase verify voltage only to a predetermined word line may be additionally performed. Here, different algorithms for performing an erase verify operation on a predetermined word line may be applied according to block regions. Accordingly, when blocks having identical P/E cycles correspond to different block regions, algorithms applied to the blocks may be different.

However, the present inventive concept is not limited thereto, and in an exemplary embodiment, if an operation cycle is equal to or less than a threshold value, an auxiliary operation on a memory cell array may be controlled based on a reference algorithm table according to reference algorithm information. The reference algorithm information may be information that is commonly applied to block regions. If an operation cycle is greater than the threshold value, an auxiliary operation on a memory cell array may also be controlled based on algorithm tables according to block regions.

FIG. 62 illustrates an example of an algorithm table ALG_TABLE2 stored in the algorithm table storing unit 127 of FIG. 58.

Referring to FIG. 62, the algorithm table ALG_TABLE2 shows whether a plurality of algorithms is applied to the first block region REG1 and the Nth block region REG_N. The present inventive concept is not limited thereto, and in an exemplary embodiment, the table ALG_TABLE2 may further include information indicating whether algorithms are applied to other block regions. In an exemplary embodiment, the table ALG_TABLE2 may further include information indicating whether other algorithms are applied to the first block region REG1 and the Nth block region REG_N.

In an exemplary embodiment, the table ALG_TABLE2 may include first and second algorithm tables. The second algorithm table may be generated by modifying whether some of the algorithms included in the first algorithm table are to be applied or not. The first algorithm table may show whether a plurality of algorithms is to be applied to block regions. The first algorithm table of FIG. 62 is substantially the same as the algorithm table described above with reference to FIG. 59, and thus, detailed description thereof will be omitted.

The second algorithm table may show whether a plurality of algorithms is to be applied or not according to respective block regions. In an exemplary embodiment, the second algorithm table may be applied when a P/E cycle count is greater than a threshold value. In an exemplary embodiment, the second algorithm table may be applied when a read cycle count is greater than a threshold value. In an exemplary embodiment, the second algorithm table may be applied when a data retention period, that is, a POS, is greater than a threshold value.

In an exemplary embodiment, the second algorithm table may be generated by modifying whether some of the algorithms included in the first algorithm table are to be applied to the first block region REG1. In an exemplary embodiment, the second algorithm table may be generated by modifying whether some of the algorithms included in the first algorithm table are to be applied to the Nth block region REG_N. In an exemplary embodiment, the second algorithm table may be generated by modifying whether some of the algorithms included in the first algorithm table are to be applied to the first block region REG1 and the Nth block region REG_N.

As a P/E cycle count increases, a program speed with respect to memory cells included in the first block region REG1 having a first channel hole diameter may be further increased due to deterioration of the memory cells included in the first block region REG1. In addition, as a P/E cycle increases, due to deterioration of the memory cells included in the first block region REG1, charges may be trapped in a charge storage layer of the memory cells included in the first block region REG1, and accordingly, a threshold voltage of erased memory cells may be increased. In addition, as a P/E cycle count increases, a program speed with respect to memory cells included in the first block region REG1 are further increased so that upper levels of the program states P1, P2, and P3 are further increased. Meanwhile, as a P/E cycle count increases, an erase operation on memory cells included in the first block region REG1 having a first channel hole diameter may be improperly performed so that an upper level of the erase level E is also further increased.

Accordingly, if a P/E cycle count is greater than a threshold value, algorithms applied to the first block region REG1 and algorithms applied to the Nth block region REG_N may be modified as described below to thereby compensate for a difference in operating characteristics between block regions.

In an exemplary embodiment, a pre-program operation and a post-program operation may be applied to the first block region REG1 and the Nth block region REG_N. In an exemplary embodiment, a count pulse program operation, a soft program operation, and an off string search operation may be applied to the first block region REG1 and the Nth block region REG_N. However, the exemplary embodiments are not limited thereto, and various types of algorithms may be determined to be applied to the Nth block region REG_N.

Figure 63:
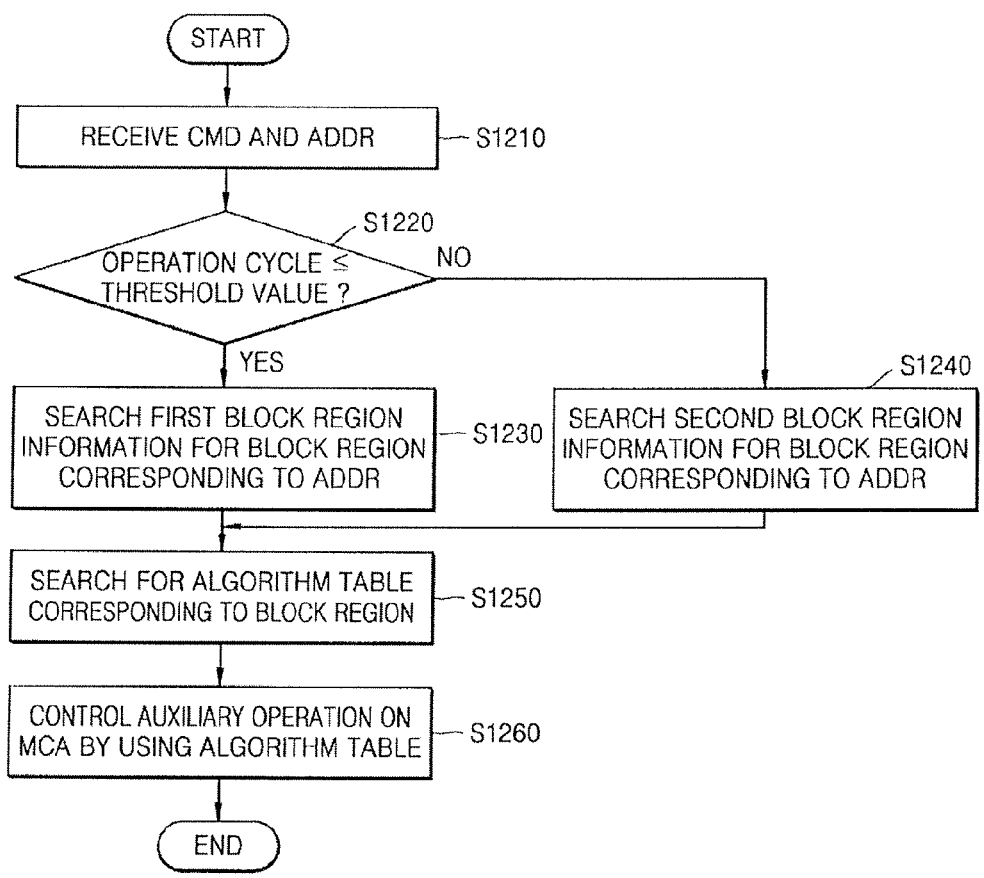
FIG. 63 is a flowchart of a method of operating a memory device according to an exemplary embodiment of the present inventive concept.

FIG. 63 is a flowchart of a method of operating a memory device according to an exemplary embodiment of the present inventive concept.

Referring to FIG. 63, the method of operating a memory device is a modified example of the method illustrated in FIG. 60, and description provided with reference to FIGS. 58 through 60 may also apply to the present exemplary embodiment, and repeated description will be omitted.

In operation S1210, a command and an address are received from a memory controller. In operation S1220, whether an operation cycle is equal to or less than a threshold value is determined. In an exemplary embodiment, the operation cycle may be a P/E cycle count. In an exemplary embodiment, the operation cycle may be a read cycle count. As a result of determining, if the operation cycle is equal to or less than the threshold value, operation S1230 is performed, and otherwise, operation S1240 is performed. However, the present inventive concept is not limited thereto, and in an exemplary embodiment, whether an operation cycle is less than a threshold value may be determined in operation S1220. As a result of determining, if the operation cycle is less than the threshold value, operation S1230 may be performed, and otherwise, operation S1240 may be performed.

However, the present inventive concept is not limited thereto, and in an exemplary embodiment, different algorithm tables may be applied according to data retention periods. For example, whether a POS is equal to or less than a threshold value may be determined, and if the POS is less than the threshold value as a result of determining, operation S1230 may be performed, and otherwise operation S1240 may be performed.

In operation S1230, first block region information is searched for a block corresponding to the address. The first block region information may be information indicating a plurality of blocks in a cell region CR1, divided into at least two block regions according to a first method of setting block regions. In an exemplary embodiment, the first block region information may be applied to an initial cycle stage of a program operation or a read operation. For example, the operation controller 123*d* may search the first block region information stored in the block region information storing unit 121 for a block corresponding to the address.

In operation S1240, second block region information is searched for a block corresponding to the address. The second block region information may be information indicating a plurality of blocks in the cell region CR1, divided into at least two block regions according to a second method of setting block regions. In an exemplary embodiment, the second block region information may be applied to operations after a predetermined cycle of a program operation or a read operation, that is, after a cycle corresponding to a threshold value. For example, the operation controller 123*d* may search the second block region information stored in the block region information storing unit 121 for a block corresponding to the address.

In operation S1250, an algorithm table corresponding to a block region is searched for. For example, the operation controller 123*d* searches the algorithm table storing unit 127 for an algorithm to be applied. In operation S1260, an auxiliary operation on a memory cell array is controlled based on the algorithm table.

As described above, different block regions may be set according to operation cycles. For example, according to the first block region information applied to operations prior to a P/E cycle corresponding to a threshold value, a third block BLK3 that is third most adjacent to the first edge EDG1 may correspond to the second block region REG2; according to the second block region information applied to operations after the P/E cycle corresponding to the threshold value, the third block BLK3 may correspond to the first block region REG1. Accordingly, an auxiliary operation may be performed on the third block BLK3 based on whether algorithms are to be applied, according to the second block region REG2 prior to the P/E cycle corresponding to the threshold value, and after the P/E cycle corresponding to the threshold value, an auxiliary operation may be performed on the third block BLK3 based on whether algorithms are to be applied, using operation parameters according to the first block region REG1.

Figure 64:
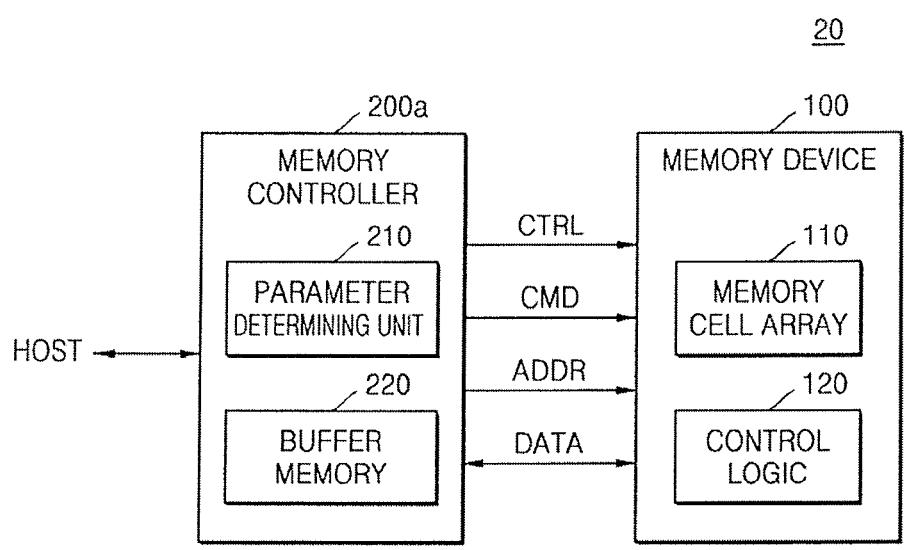
FIG. 64 is a schematic block diagram illustrating a memory system according to an exemplary embodiment of the present inventive concept.

FIG. 64 is a schematic block diagram illustrating a memory system 20 according to an exemplary embodiment of the present inventive concept.

Referring to FIG. 64, the memory system 20 may include a memory device 100 and a memory controller 200*a*. The memory device 100 may include a memory cell array 100 and a control logic 120. In an exemplary embodiment, the memory device 100 may be substantially similarly implemented as the memory device 100 of FIG. 1. Thus, description provided above with reference to FIGS. 1 through 63 may also apply to the present exemplary embodiment, and repeated description will be omitted.

The memory controller 200*a* may determine bias conditions of operation parameters for block regions included in a cell region of the memory cell array 110, and transmit the determined bias conditions of the operation parameters to the memory device 100. The memory controller 200*a* may transmit the bias conditions of the operation parameters to the memory device 100 via a command, an address or data.

For example, the memory controller 200*a* may include a parameter determining unit 210 and a buffer memory 220. The buffer memory 220 may temporarily store at least one of block region information, parameter information, cycle information, data retention period information, and chip information. The buffer memory 220 may receive data from the memory device 100 or obtain data via firmware from the outside.

The parameter determining unit 210 may determine bias conditions of operation parameters for block regions included in a cell region of the memory cell array 110. The parameter determining unit 210 may determine bias conditions of operation parameters such that program, erase, and read operations are performed by using the same bias conditions of the program operation parameter, the same erase operation parameter, and the same read operation parameter on different blocks assigned to the same block region.

In an exemplary embodiment, the parameter determining unit 210 may determine bias conditions of operation parameters according to an operation requested by a host and an address. In an exemplary embodiment, the parameter determining unit 210 may determine bias conditions of operation parameters based on block region information, parameter information, cycle information, data retention period information, or chip information.

In an exemplary embodiment, operation parameters may be modified based on operation cycle information or data retention period information. In an exemplary embodiment, the parameter determining unit 210 may determine reference operation parameters according to a reference bias condition that is commonly applied to block regions when a P/E cycle count or a POS is equal to or less than a threshold value, and determine bias conditions of operation parameters to be applied to block regions when a P/E cycle count or a POS is greater than the threshold value.

In an exemplary embodiment, the parameter determining unit 210 may determine bias conditions of operation parameters to be applied to block regions when a P/E cycle count or a POS is equal to or less than a threshold value, and determine modified bias conditions of operation parameters that are applied to block regions when a P/E cycle count or a POS is greater than the threshold value. In an exemplary embodiment, the parameter determining unit 210 may transmit modified bias conditions to the memory device 100 if an operation cycle count or a data retention period is greater than a threshold value.

In addition, some of the operations parameters determined by the parameter determining unit 210 may be stored in the memory controller 200a, and accordingly, a control operation may be performed using the memory controller 200a, and other operation parameters may be provided to the memory device 100 so that an operation may be performed in the memory device 100.

In an exemplary embodiment, cycle information and data retention period information or the like may be stored in the memory controller 200a, and the parameter determining unit 210 may determine an operation parameter according to an operation requested by a host and an address. The memory controller 200a may transmit an operation parameter to the memory controller 200a via a command, an address, or data. Accordingly, the memory device 100 may perform an operation according to an operation parameter based on the received command, address or data.

In an exemplary embodiment, bias conditions of operation parameters such as a program voltage and a program inhibit voltage or the like according to a P/E cycle count which is equal to or less than a threshold value may be stored in the memory device 100. Accordingly, the memory device 100 may perform an operation by using the bias conditions of the operation parameters. Meanwhile, operation parameters such as a program voltage and a program inhibit voltage or the like according to a modified bias condition corresponding to a P/E cycle count that is greater than the threshold value may be stored in the memory controller 200a. Accordingly, the memory controller 200a may transmit operation parameters corresponding to a modified bias condition to the memory device 100 via a command, an address or data.

In an exemplary embodiment, a channel hole diameter of blocks adjacent to edges of a cell region may be smaller than a channel hole diameter of blocks in a center of the cell region. Accordingly, operating characteristics of the blocks adjacent to the edges of the cell region may be different from operating characteristics of the blocks in the center of the cell region. To compensate for a difference in the operating characteristics of each block region due to the difference in the channel hole diameters, different bias conditions may be applied to each block regions according to the present exemplary embodiment.

In an exemplary embodiment, the parameter determining unit 210 may determine program operation parameters such that a program start voltage, a program duration, a program inhibit voltage, a program verify voltage, a time increment of a program duration of each loop, a program voltage increment of each loop, a verify skip loop or a maximum loop is reduced from a center to an edge of a cell region. For example, the program operation parameters may be determined as illustrated in FIGS. 29 through 35.

In an exemplary embodiment, the parameter determining unit 210 may determine erase operation parameters such that an erase voltage applied to a substrate and an erase duration are reduced and a word line erase voltage applied to a word line is increased from a center to an edge of a cell region. For example, the erase operation parameters may be determined as illustrated in FIGS. 36 through 38.

In an exemplary embodiment, the parameter determining unit 210 may be determined such that read operation parameters are determined such that a read determination voltage and a read voltage that are applied to a substrate are reduced from a center to an edge of a cell region. For example, the read operation parameters may be determined as illustrated in FIGS. 40 through 42.

In an exemplary embodiment, the memory controller 200a may further include an algorithm determining unit. The algorithm determining unit may generate algorithm information by determining algorithms that are applied to block regions. Accordingly, the memory device 100 may additionally perform an auxiliary operation according to the algorithms in respective operation modes with respect to the memory cell array 110. In an exemplary embodiment, the algorithm determining unit may modify some of pieces of algorithm information based on operation cycle information or data retention period information. In an exemplary embodiment, the algorithm determining unit may transmit algorithm information to the memory device 100 if an operation cycle count or data retention period is greater than a threshold value. In an exemplary embodiment, the algorithm determining unit may transmit algorithm information to the memory device 100 via a command, an address or data.

Figure 65:
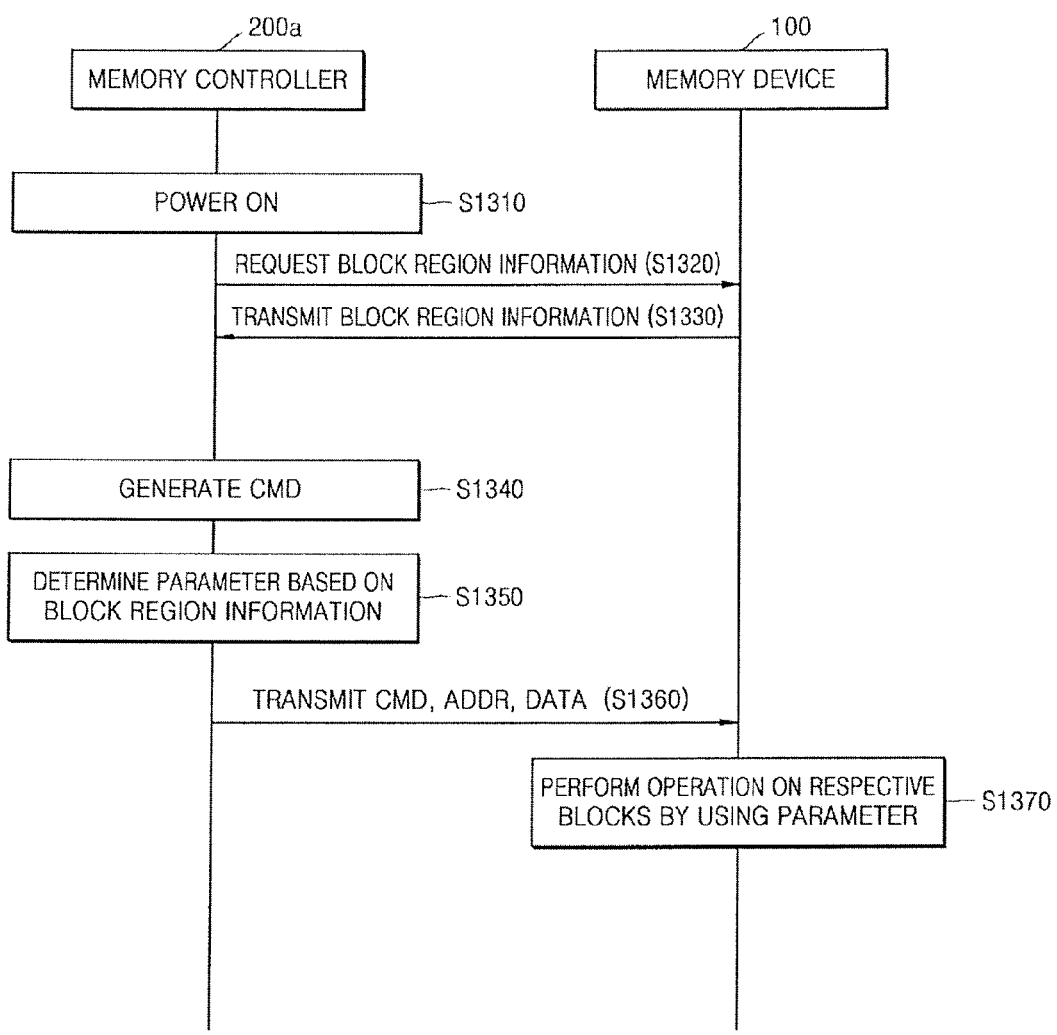
FIG. 65 is a flowchart of operations of a memory controller and a memory device according to an exemplary embodiment of the present inventive concept.

FIG. 65 is a flowchart of operations of a memory controller 200a and a memory device 100 according to an exemplary embodiment of the present inventive concept.

Referring to FIG. 65, in operation S1310, the memory controller 200a is turned on. In operation S1320, the memory controller 200a requests block region information from the memory device 100. In operation S1330, the memory device 100 transmits the block region information to the memory controller 200a. In an exemplary embodiment, the block region information may be stored in a partial region of a memory cell array 110, for example, in a meta region. The block region information transmitted by the memory device 100 may be loaded to a buffer memory of the memory controller 200a.

However, the present inventive concept is not limited thereto, and in an exemplary embodiment, the memory cell array 110 may further include parameter information, cycle information, data retention period information or chip information. The memory controller 200a may further request parameter information, cycle information, data retention period information or chip information from the memory device 100. The memory device 100 may further transmit parameter information, cycle information, data retention period information or chip information to the memory controller 200a.

In operation S1340, the memory controller 200a generates a command such as a program command, an erase command, or a read command. In operation S1350, the memory controller 200a determines operation parameters based on the block region information loaded to the buffer memory. In operation S1360, the memory controller 200a transmits the command, address or data to the memory device 100. The operation parameters may be transmitted to the memory device 100 via a command, address or data.

In operation S1370, the memory device 100 performs a basic operation such as a program operation, an erase operation or a read operation according to blocks by using the received operation parameters. In an exemplary embodiment, the memory device 100 may perform an auxiliary operation by applying different algorithms to blocks by using the received operation parameters.

Figure 66:
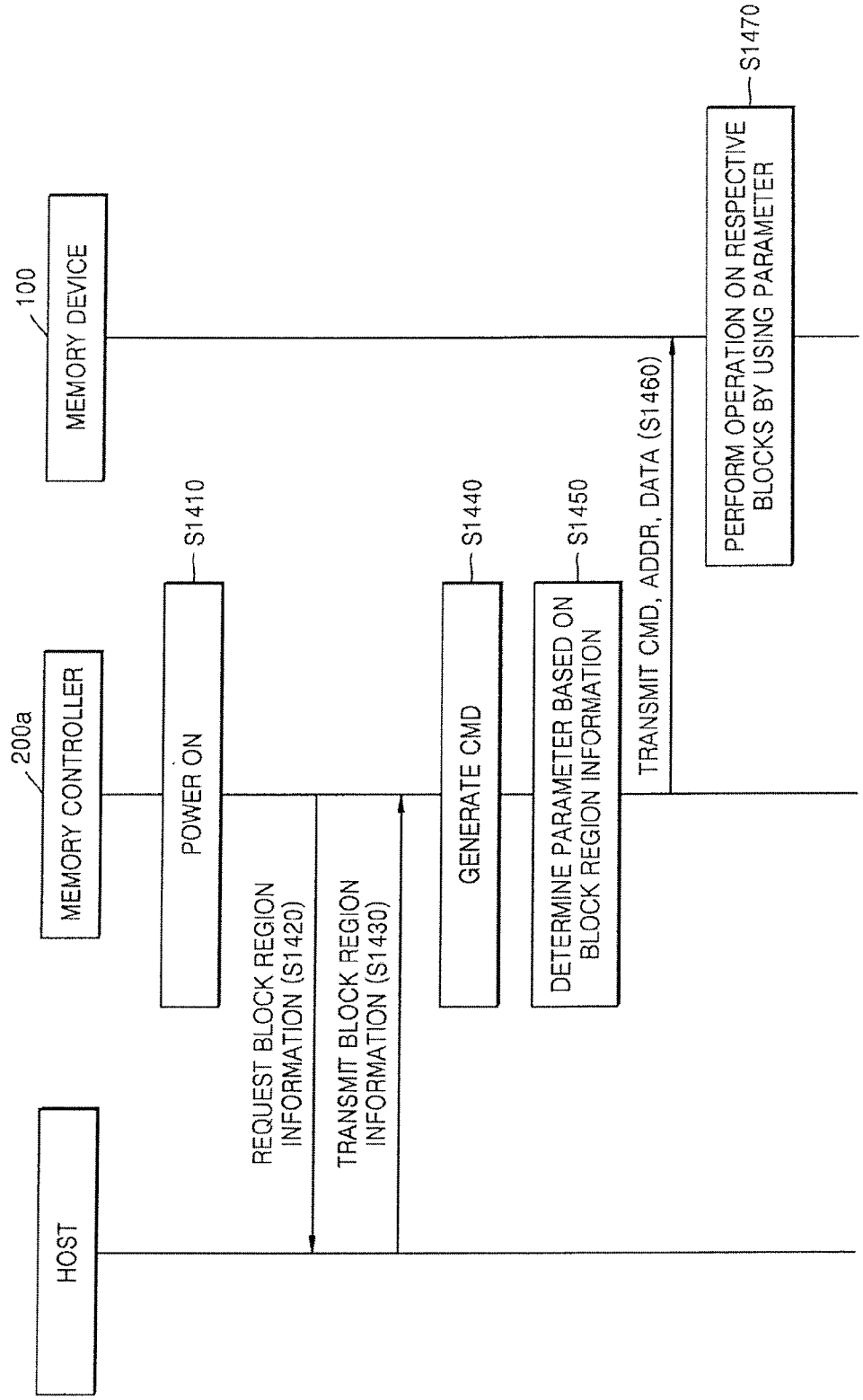
FIG. 66 is a flowchart of operations of a memory controller and a memory device according to an exemplary embodiment of the present inventive concept.

FIG. 66 is a flowchart of operations of a memory controller 200a and a memory device 100 according to an exemplary embodiment of the present inventive concept.

Referring to FIG. 66 in operation S1410, the memory controller 200a is turned on. In operation S1420, the memory controller 200a requests block region information from a host. However, the present inventive concept is not limited thereto, and in an exemplary embodiment, operation S1420 may be omitted. In operation S1430, the host transmits the block region information to the memory controller 200a. In an exemplary embodiment, the host may transmit a program, read or erase request together with the block region information. The block region information transmitted by the host may be loaded to a buffer memory of the memory controller 200a.

However, the present inventive concept is not limited thereto, and in an exemplary embodiment, the memory controller 200a may further request parameter information, cycle information, data retention period information or chip information from the memory device 100, and the host may further transmit parameter information, cycle information, data retention period information or chip information to the memory controller 200a.

In operation S1440, the memory controller 200a generates a command such as a program command, an erase command, or a read command. In operation S1450, the memory controller 200a determines (or set) operation parameters based on the block region information loaded to the buffer memory. In operation S1460, the memory controller 200a transmits the command, address or data to the memory device 100. The parameter may be transmitted to the memory device 100 via a command, address or data.

In operation S1470, the memory device 100 performs a basic operation such as a program operation, an erase operation or a read operation according to respective blocks by using the received parameter. In an exemplary embodiment, the memory device 100 may perform an auxiliary operation by applying different algorithms to respective blocks by using the received parameter.

Figure 67:
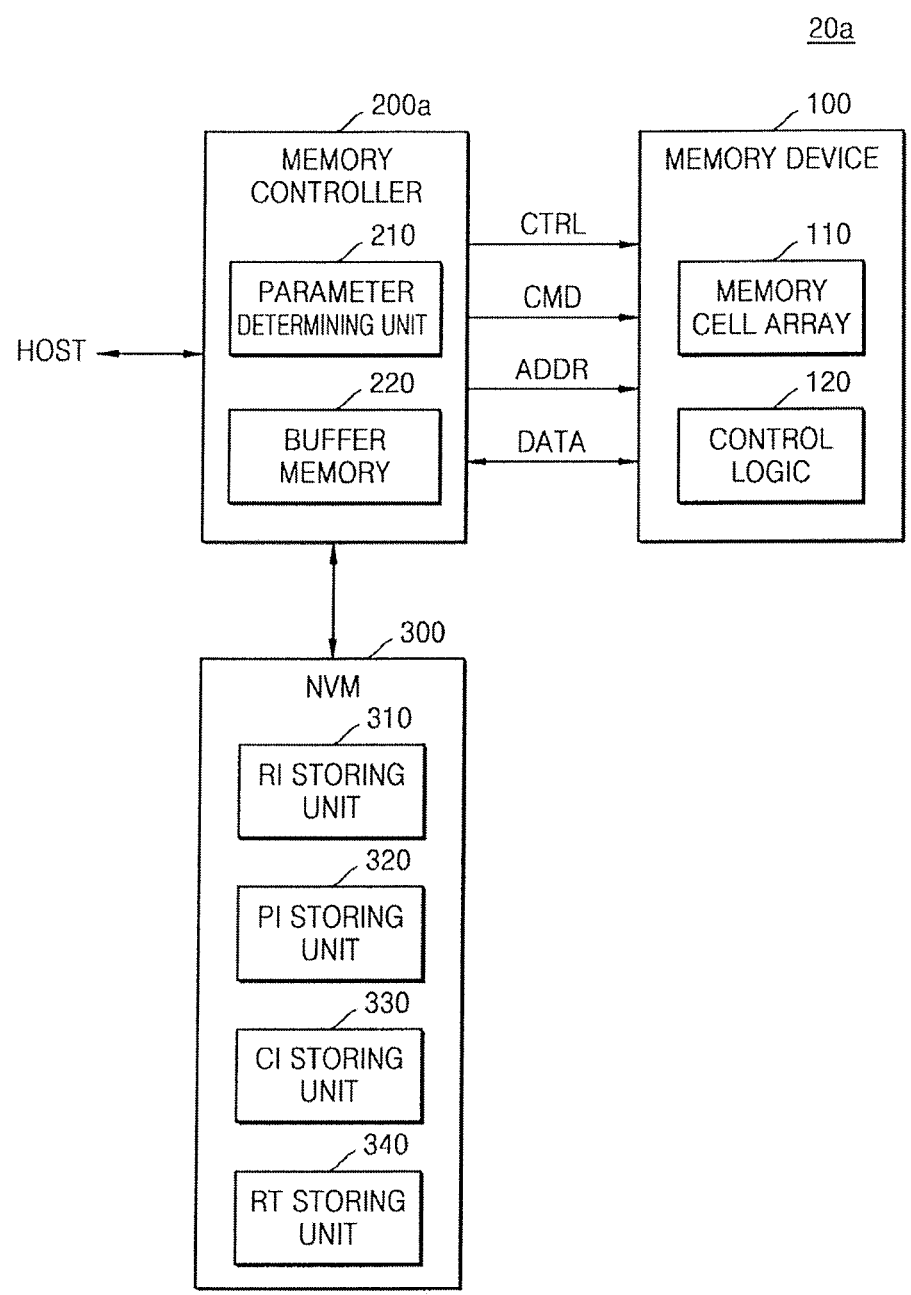
FIG. 67 is a block diagram illustrating a modified example of a memory system according to an exemplary embodiment of the present inventive concept.

FIG. 67 is a block diagram illustrating a memory system according to an exemplary embodiment of the present inventive concept.

Referring to FIG. 67, the memory system 20a may include a memory device 100, a memory controller 200a, and a non-volatile memory 300. The memory device 100 may include a memory cell array 100 and a control logic 120. The memory system 20a is a modified embodiment of the memory system 20 of FIG. 64, and description provided with reference to FIGS. 64 through 66 may also apply to the present exemplary embodiment.

The non-volatile memory 300 may include at least one of a block region information storing unit 310, a parameter information storing unit 320, a cycle information storing unit 330, and a data retention period storing unit 340. In an exemplary embodiment, a buffer memory 220 may temporarily store at least one of block region information, parameter information, cycle information, and data retention period information that is loaded from the non-volatile memory 300. In an exemplary embodiment, the buffer memory 220 may temporarily store at least one of block region information, parameter information, cycle information, and data retention period information that is loaded from the memory device 100. In an exemplary embodiment, the buffer memory 220 may temporarily store at least one of block region information, parameter information, cycle information, and data retention period information.

Figure 68:
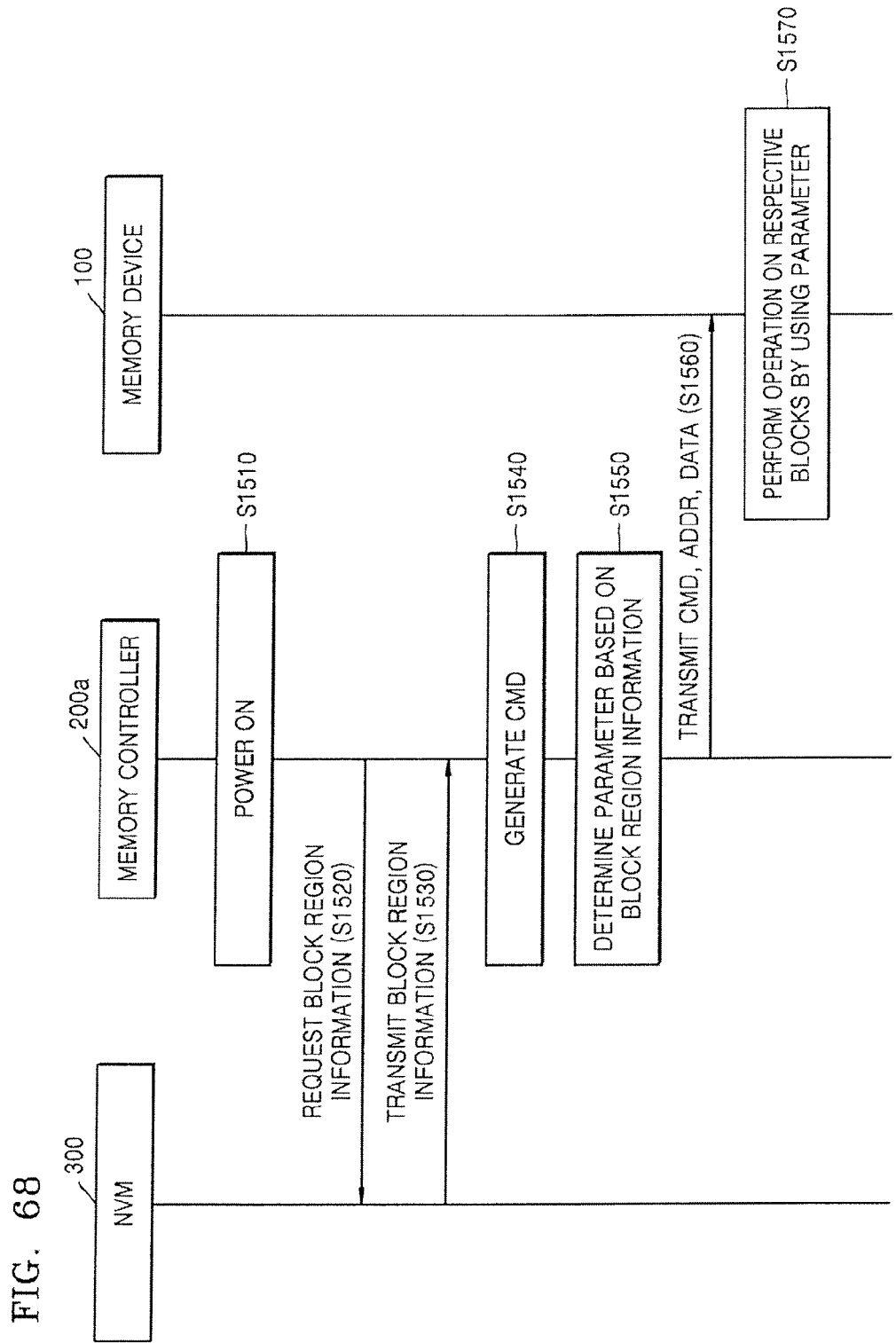
FIG. 68 is a flowchart of operations of a memory controller, a memory device, and a non-volatile memory according to an exemplary embodiment of the present inventive concept.

FIG. 68 is a flowchart of operations of a memory controller 200a, a memory device 100, and a non-volatile memory 300 according to an exemplary embodiment of the present inventive concept.

Referring to FIG. 68, in operation S1510, the memory controller 200a is turned on. In operation S1520, the memory controller 200a requests block region information from the non-volatile memory 300. In operation S1530, the non-volatile memory 300 transmits the block region information to the memory controller 200a.

However, the present inventive concept is not limited thereto, and in an exemplary embodiment, the memory controller 200a may further request parameter information, cycle information or data retention period information from the non-volatile memory 300, and the non-volatile memory 300 may further transmit parameter information, cycle information or data retention period information to the memory controller 200a.

In operation S1540, the memory controller 200a generates a command. In operation S1550, the memory controller 200a determines operating parameters based on block region information. In operation S1560, the memory controller 200a transmits a command, an address, and data to the memory device 100. The determined operation parameters may be transmitted to the memory device 100 via a command, an address or data. In operation S1570, the memory device 100 performs a basic operation such as a program operation, an erase operation, or a read operation on block regions. In an exemplary embodiment, the memory device 100 may perform an auxiliary operation by using different algorithms according to blocks by using the received operation parameters.

Figure 69:
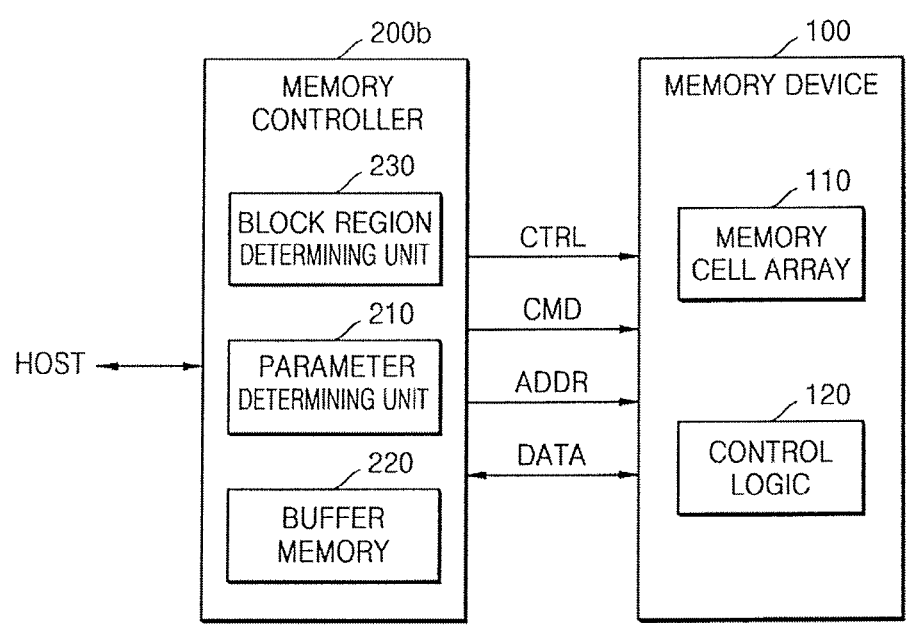
FIG. 69 is a schematic block diagram illustrating a memory system according to an exemplary embodiment of the present inventive concept.

FIG. 69 is a schematic block diagram illustrating a memory system 30 according to an exemplary embodiment of the present inventive concept.

Referring to FIG. 69, the memory system 30 may include a memory device 100 and a memory controller 200b. The memory device 100 may include a memory cell array 100 and a control logic 120. The memory device 100 may be substantially similarly implemented as the memory device 100 of FIG. 1. Thus, description provided above with reference to FIGS. 1 through 63 may also apply to the present exemplary embodiment, and repeated description will be omitted.

The memory controller 200b may include a block region determining unit 230, a parameter determining unit 210, and a buffer memory 220. The buffer memory 220 may temporarily store at least one of block region information, parameter information, cycle information, data retention period information, and chip information. The memory controller 200b according to the present exemplary embodiment is a modified embodiment of the memory controller 200a of FIG. 64, and thus description provided with reference to FIGS. 64 through 68 may also apply to the present exemplary embodiment, and repeated description will be omitted.

The block region determining unit 230 may determine block regions with respect to at least one cell region included in the memory cell array 110. If a plurality of cell regions are included in the memory cell array 110, the block region determining unit 230 may determine block regions with respect to each of the plurality of cell regions.

In an exemplary embodiment, block region information may be stored in the memory controller 200b, and the memory controller 200b may transmit the block region information to the memory device 100 via a command, an address or data. Accordingly, the memory device 100 may perform an operation on each of the block regions based on the received command, address or data.

In an exemplary embodiment, block region information corresponding to a P/E cycle count that is equal to or less than a threshold value may be stored in the memory device 100. Accordingly, the memory device 100 may perform an operation by using operation parameters according to respective block regions. Meanwhile, modified block region information corresponding to a P/E cycle count that is greater than the threshold value may be stored in the memory controller 200b. Accordingly, the memory controller 200b may transmit the modified block region information to the memory device 100 via a command, an address or data.

According to the present exemplary embodiment, the block region determining unit 230 may determine positions of block regions according to positions in a cell region. For example, the block region determining unit 230 may determine positions of the block regions based on distances with respect to first and second edges that are parallel to an extension direction of a word line from among edges of a cell region.

In an exemplary embodiment, the block region determining unit 230 may determine block regions based on an absolute distance with respect to the first and second edges. In an exemplary embodiment, the block region determining unit 230 may determine block regions based on a relative distance with respect to the first and second edges. For example, the block region determining unit 230 may determine positions of the block regions based on an order in which the block regions are arranged from the first and second edges.

In an exemplary embodiment, the block region determining unit 230 may determine positions of block regions based on a distance with respect to a relatively close edge among the first and second edges. Accordingly, a block adjacent to the first edge and a block adjacent to the second edge may be determined to be in the same block region. Operation parameters may be determined according to respective block regions, and thus, the same operation parameters may be applied to the same block region.

In an exemplary embodiment, the block region determining unit 230 may determine positions of block regions based on a distance with respect to one of the first and second edges. Thus, a block adjacent to the first edge and a block adjacent to the second edge may be determined to be in different block regions. Operation parameters may be determined based on a distance with respect to a relatively close edge among the first and second edges, and accordingly, the same operation parameters may be applied to the block adjacent to the first edge and the block adjacent to the second edge, which are determined to be in different block regions.

In an exemplary embodiment, the block region determining unit 230 may determine positions of block regions based on a distance with respect to a relatively close edge among the first and second edges and a distance with respect to a peripheral circuit. The peripheral circuit may be, for example, a page buffer or a row decoder connected to the memory cell array 110. Accordingly, a block adjacent to the first edge and a block adjacent to the second edge may be determined to be in different block regions. Operation parameters may be determined according to respective block regions, and thus, the same operation parameters may be applied to the same block region.

The block region determining unit 230 may divide a plurality of blocks into respective block regions according to different methods of setting block regions corresponding to respective operation modes and store block region information indicating the division as a table showing the block regions respectively corresponding to the blocks according to the respective operation modes. For example, the block region determining unit 230 may divide a plurality of blocks into block regions according to different methods of setting block regions according to a program operation, an erase operation, a read operation, and a read recovery operation. Accordingly, a single block may correspond to different block regions according to operation modes.

In an exemplary embodiment, when the memory cell array 110 includes a plurality of lower blocks disposed on a substrate and a plurality of upper blocks disposed on the lower blocks, the block region determining unit 230 may generate block region information by dividing a plurality of lower blocks and a plurality of upper blocks into block regions according to different methods of setting block regions. However, the exemplary embodiments are not limited thereto, and in an exemplary embodiment, the block region determining unit 230 may generate block region information by dividing a plurality of lower blocks and a plurality of upper blocks into block regions according to a single method of setting block regions.

The parameter determining unit 210 may determine operation parameters respectively corresponding to block regions included in a cell region of the memory cell array 110. For example, the parameter determining unit 210 may determine operation parameters such that program, erase and read operations are respectively performed on different blocks included in the same block region by using the same program operation parameter, the same erase operation parameter, and the same read operation parameter.

In the present exemplary embodiment, a channel hole diameter of blocks adjacent to edges of a cell region may be smaller than a channel hole diameter of blocks in a center of the cell region. Accordingly, operating characteristics of blocks adjacent to edges of the cell region may be different from operating characteristics of blocks in a center of the cell region. To compensate for a difference in the operating characteristics due to a difference in the channel hole diameter, different bias conditions may be determined to be assigned to each block region.

In an exemplary embodiment, the memory controller 200b may further include an algorithm determining unit. The algorithm determining unit may generate algorithm information by determining algorithms to be applied to respective block regions. Accordingly, the memory device 100 may additionally perform an auxiliary operation according to the algorithms in respective operation modes. In an exemplary embodiment, the algorithm determining unit may modify some of pieces of algorithm information based on operation cycle information or data retention period information. In an exemplary embodiment, the algorithm determining unit may transmit algorithm information to the memory device 100 if an operation cycle count or a data retention period is greater than a threshold value. In an exemplary embodiment, the algorithm determining unit may transmit algorithm information to the memory device 100 via a command, an address or data.

Figure 70:
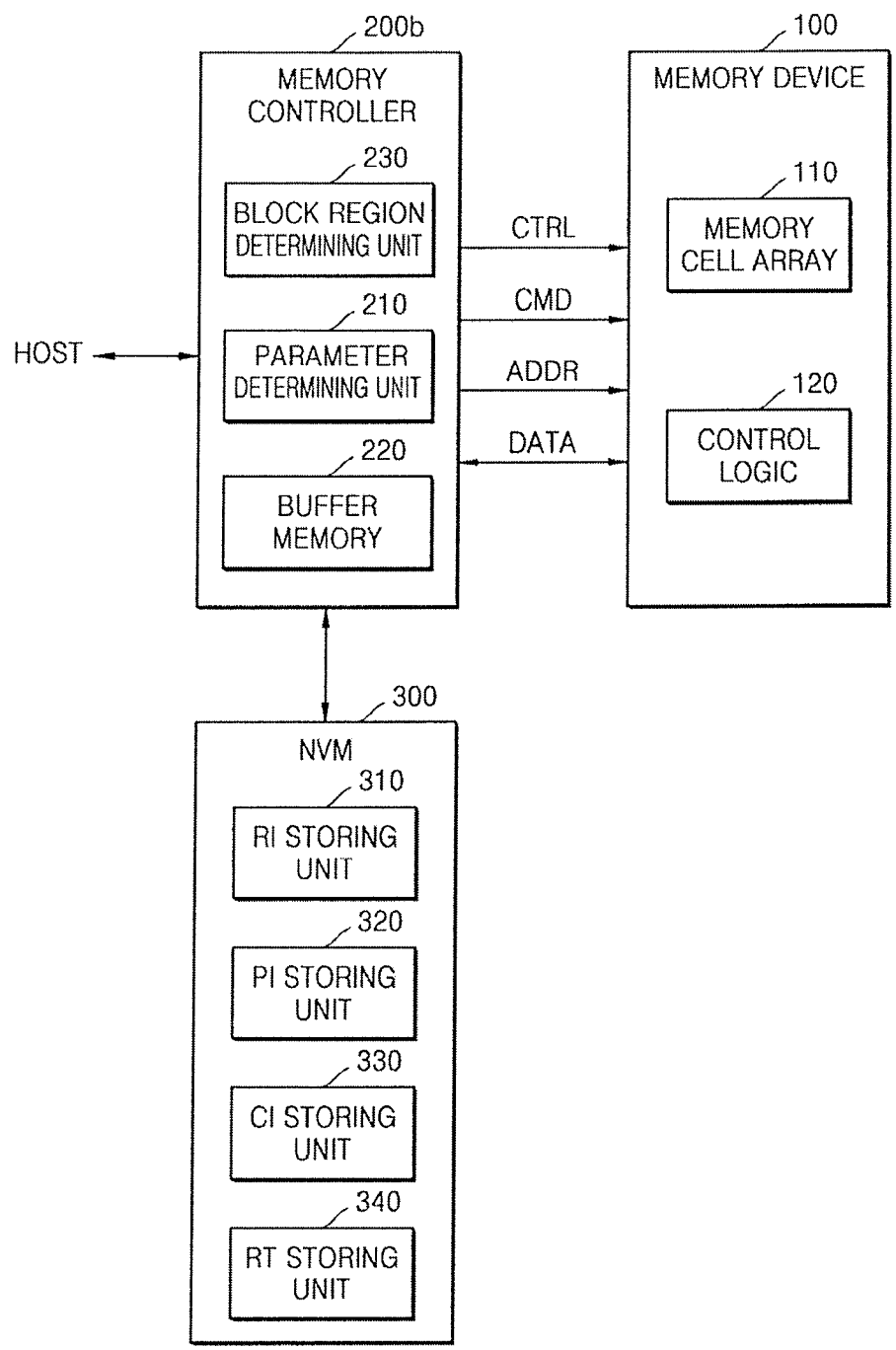
FIG. 70 is a block diagram illustrating a modified example of a memory system according to an exemplary embodiment of the present inventive concept.

FIG. 70 is a block diagram illustrating a memory system 30a which is a modified example of the memory system 30, according to an exemplary embodiment of the present inventive concept.

Referring to FIG. 70, the memory system 30a may include a memory device 100, a memory controller 200b, and a non-volatile memory 300, and the memory device 100 may include a memory cell array 110 and a control logic 120. The memory system 30a according to the present exemplary embodiment is a modified embodiment of the memory system 30 of FIG. 69, and description provided with reference to FIG. 69 may also be applied to the present exemplary embodiment.

According to the present exemplary embodiment, the non-volatile memory 300 may include at least one of a block region information storing unit 310, a parameter information storing unit 320, a cycle information storing unit 330, and a data retention period storing unit 340. In an exemplary embodiment, a buffer memory 220 may temporarily store at least one of block region information, parameter information, cycle information, and data retention information loaded from the non-volatile memory 300. In an exemplary embodiment, the buffer memory 220 may temporarily store at least one of block region information, parameter information, cycle information, and data retention information loaded from the memory device 100. In an exemplary embodiment, the buffer memory 220 may temporarily store at least one of block region information, parameter information, cycle information, and data retention information loaded from a host.

Figure 71:
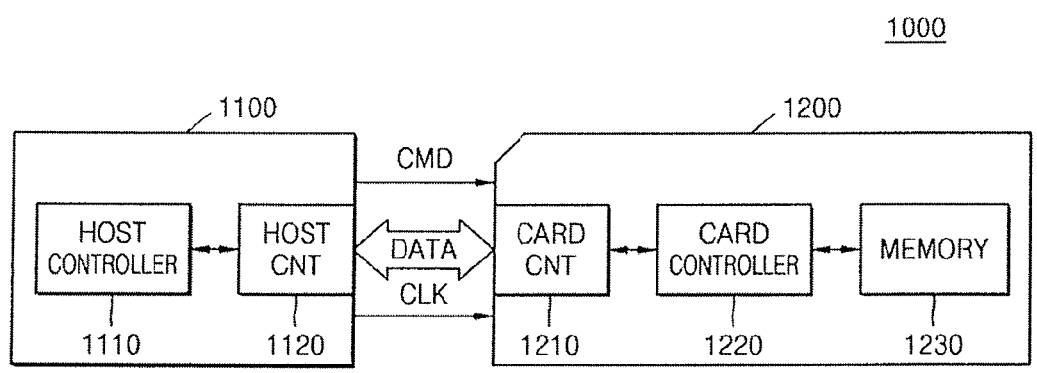
FIG. 71 is a block diagram illustrating a memory card system to which a memory device according to exemplary embodiments of the present inventive concept is applied.

FIG. 71 is a block diagram illustrating a memory card system 1000, to which a memory device according to exemplary embodiments of the present inventive concept is applied.

Referring to FIG. 71, the memory card system 1000 may include a host 1100 and a memory card 1200. The host 1100 may include a host controller 1110 and a host connector 1120. The memory card 1200 may include a card connector 1210, a card controller 1220, and a memory device 1220. In this case, the memory card 1200 may be embodied according to the exemplary embodiments shown in FIGS. 1 to 70. For example, the memory device 1220 may divide blocks included in a cell region into at least two block regions, and control operations according to respective block regions by using operation parameters respectively corresponding to the block regions.

The host 1100 may write data to the memory card 1200 or read data stored in the memory card 1200. The host controller 1110 may transmit a command CMD, a clock signal CLK generated by a clock generator (not shown) of the host 1100, and data DATA through the host connector 1120 to the memory card 1200.

In response to a command received through the card connector 1210, the card controller 1220 may be synchronized with a clock signal generated by a clock generator (not shown) of the card controller 1220 and store data in the memory device 1220. The memory device 1220 may store data transmitted from the host 1100.

The memory card 1220 may be embodied by a compact flash card (CFC), a microdrive, a smart media card (SMC), a multimedia card (MMC), a security digital card (SDC), a memory stick, or a universal serial bus (USB) flash memory driver.

Figure 72:
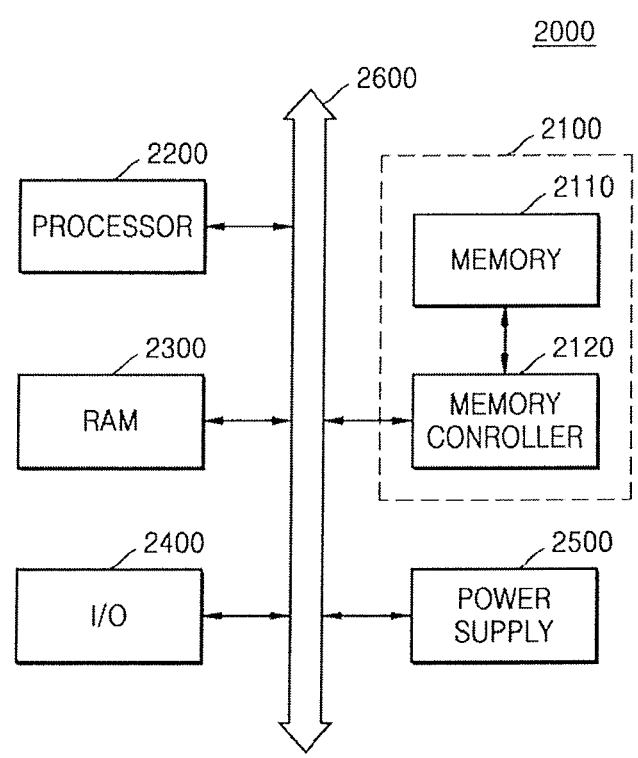
FIG. 72 is a block diagram illustrating a computing system including a memory device according to exemplary embodiments of the present inventive concept.

FIG. 72 is a block diagram illustrating a computing system 2000 including a memory device according to exemplary embodiments of the present inventive concept.

Referring to FIG. 72, the computing system 2000 may include a memory system 2100, a processor 2200, a random access memory (RAM) 2300, an input/output (I/O) device 2400, and a power supply 2500. Although not shown in FIG. 72, the computing system 2000 may further include ports, which may communicate with a video card, a sound card, a memory card, or a universal serial bus (USB) device or communicate with other electronic devices. The computing system 2000 may be embodied by a personal computer (PC) or a portable electronic device, such as a laptop computer, a portable phone, a personal digital assistant (PDA), and a camera.

The processor 2200 may perform specific calculations or tasks. According to an exemplary embodiment, the processor 2200 may be a microprocessor or a central processing unit (CPU). The processor 2200 may communicate with the RAM 2300, the I/O device 2400, and the memory system 2100 through a bus 2600, such as an address bus, a control bus, and a data bus. According to an exemplary embodiment, the processor 2200 may be also connected to an expansion bus, such as a peripheral component interconnect (PCI) bus.

The memory system 2100 may be implemented using the exemplary embodiments illustrated in FIGS. 1 through 71. For example, a memory device 2110 may divide blocks included in a cell region into at least two block regions, and control operations according to respective block regions by using operation parameters respectively corresponding to the block regions.

The RAM 2300 may store data required for an operation of the computing system 2000. For example, the RAM 2300 may be embodied by a dynamic random access memory (DRAM), a mobile DRAM, a static RAM (SRAM), a phase-change RAM (PRAM), a ferroelectric RAM (FRAM), a resistive RAM (RRAM), and/or a magnetic RAM (MRAM). The I/O device 2400 may include an input unit, such as a keyboard, a keypad, and a mouse, and an output unit, such as a printer and a display. The power supply 2500 may supply an operating voltage required for an operation of the computing system 2000.

Figure 73:
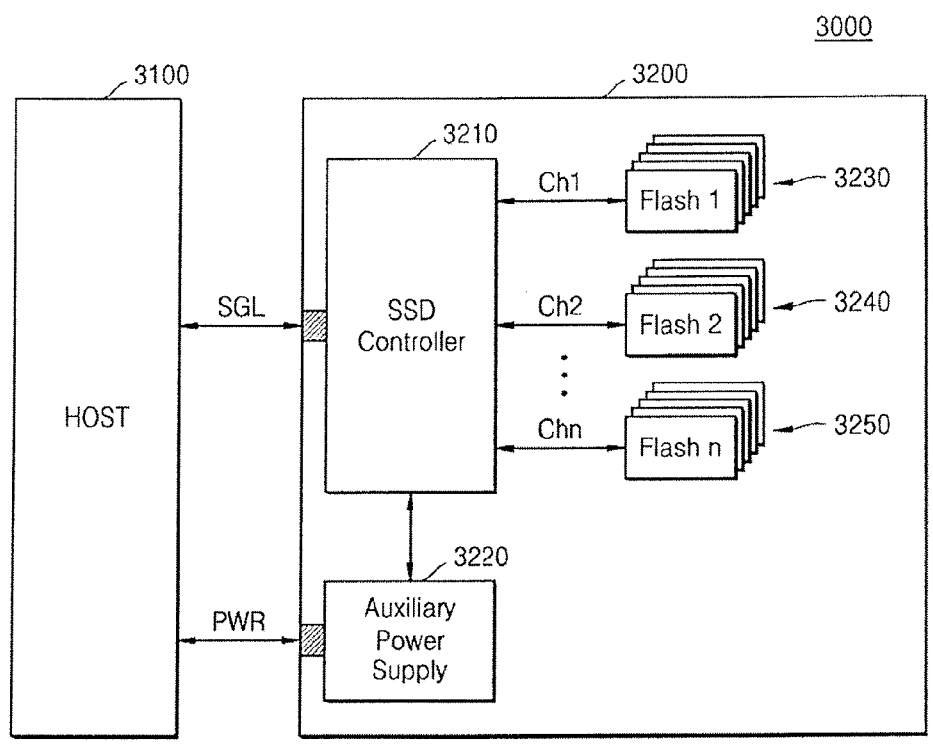
FIG. 73 is a block diagram illustrating a solid state disk (SSD) system to which a memory device according to exemplary embodiments of the present inventive concept is applied.

FIG. 73 is a block diagram illustrating a solid-state disk (SSD) system 3000 to which a memory device according to exemplary embodiments of the present inventive concept is applied.

Referring to FIG. 73, the SSD system 3000 may include a host 3100 and an SSD 3200. The SSD 3200 may exchange signals with the host 3100 through a signal connector and receive power through a power connector. The SSD 3200 may include an SSD controller 3210, an auxiliary power supply 3220, and a plurality of memory devices 3230, 3240, and 3250. In this case, the SSD 3200 may be embodied according to the exemplary embodiments shown in FIGS. 1 to 72. For example, the flash memories 3230 to 3250 may divide blocks included in a cell region into at least two block regions, and may control operations according to the respective block regions by using operation parameters respectively corresponding to the block regions.

Figure 74:
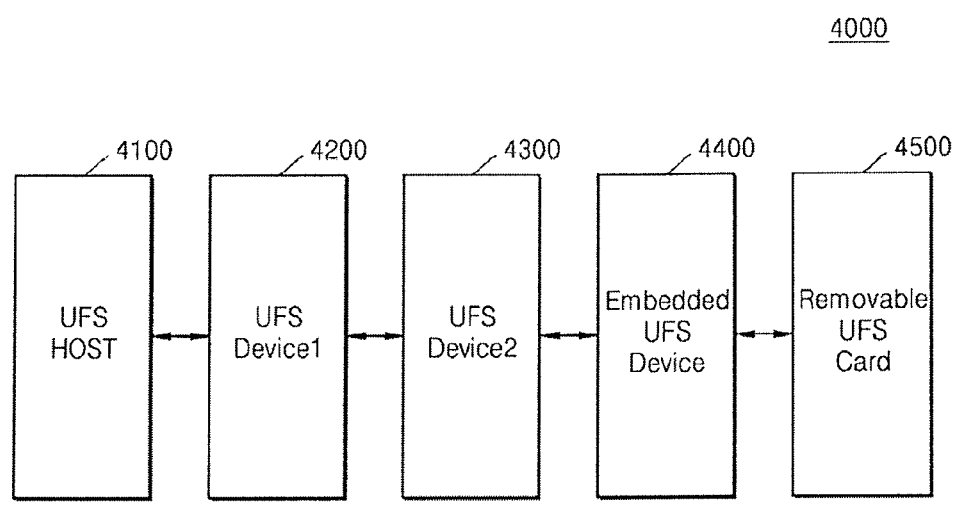
FIG. 74 is a block diagram illustrating a Universal Flash Storage (UFS) system to which a memory device according to exemplary embodiments of the present inventive concept is applied.

FIG. 74 is a block diagram illustrating a Universal Flash Storage (UFS) system 4000, to which a memory device according to exemplary embodiments of the present inventive concept is applied.

Referring to FIG. 74, the UFS system 4000 may include a UFS host 4100, UFS devices 4200 and 4300, an embedded UFS device 4400, and a removable UFS card 4500. The UFS host 4100 may be an application processor of a mobile device. The UFS host 4100, the UFS devices 4200 and 4300, the embedded UFS device 4400, and the removable UFS card 4500 may each perform communication with external devices according to the UFS protocol. At least one of the UFS devices 4200 and 4300, the embedded UFS device 4400, and the removable UFS card 4500 may include the memory device 100 illustrated in FIGS. 1 through 70.

Meanwhile, the embedded UFS device 4400 and the removable UFS card 4500 may perform communication according to other protocols that are different from the UFS protocol. The UFS host 5100 and the removable UFS card

4500 may perform communication according to various card protocols (e.g., UFDs, MMC, SD, mini SD, or Micro SD).

The memory card, the non-volatile memory device, the card controller according to the present inventive concept may be mounted using packages of various shapes. For example, the flash memory device and/or the memory controller according to the present inventive concept may be mounted using packages such as a Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), or Wafer-Level Processed Stack Package (WSP).

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A three-dimensional (3D) memory device including a memory cell array, the memory cell array including a plurality of memory blocks, each of the memory blocks including a plurality of memory cell strings, each of the memory cell strings including a pillar extending in a direction vertical to a substrate and a plurality of transistors stacked along the pillar,
   the memory device comprising:
   a first block region including at least one memory block and having a first distance from a center of the memory cell array;
   a second block region including at least one memory block and having a second distance from the center of the memory cell array; and
   a control logic configured to store a first algorithm and a second algorithm, the first algorithm and the second algorithm being associated with the first block region and the second block region respectively, and further configured to control a first operation on the first block region using the first algorithm and a second operation on the second block region using the second algorithm respectively,
   wherein the first algorithm and the second algorithm are different when the first distance and the second distance are different.

2. The memory device of claim 1, wherein the control logic further configured to store a block region information which represents a relationship between the block regions and the memory blocks, and one single algorithm is applied on all of the memory blocks in a block region.

3. The memory device of claim 2, wherein the block region information is modified according to an operation cycle count or a data retention period.

4. The memory device of claim 1, wherein the first operation and the second operation comprises basic operations and auxiliary operations respectively, the basic operations including at least one of program operation, erase operation, and read operation, and the auxiliary operations including at least one of a pre-program operation, a post-program operation, a sub-block dividing operation, a count pulse program operation, a soft program operation, an off-string search operation, a read recovery operation using retention pre-defined table (PDT), and a read recovery operation using endurance pre-defined table (PDT).

5. The memory device of claim 4, wherein the pre-program operation is not included in the first algorithm and is included in the second algorithm when the first distance is shorter than the second distance.

6. The memory device of claim 4, wherein the post-program operation is not included in the first algorithm and is included in the second algorithm when the first distance is shorter than the second distance.

7. The memory device of claim 4, wherein the sub-block dividing operation is included in the first algorithm and is not included in the second algorithm when the first distance is shorter than the second distance.

8. The memory device of claim 4, wherein the count pulse program operation is not included in the first algorithm and is included in the second algorithm when the first distance is shorter than the second distance.

9. The memory device of claim 4, wherein the soft program operation is not included in the first algorithm and is included in the second algorithm when the first distance is shorter than the second distance.

10. The memory device of claim 4, wherein the off-string search operation is not included in the first algorithm and is included in the second algorithm when the first distance is shorter than the second distance.

11. The memory device of claim 4, wherein the read recovery operation using retention pre-defined table (PDT) is not included in the first algorithm and is included in the second algorithm when the first distance is shorter than the second distance.

12. The memory device of claim 4, wherein the read recovery operation using endurance pre-defined table (PDT) is included in the first algorithm and is not included in the second algorithm when the first distance is shorter than the second distance.

13. The memory device of claim 4, wherein the control logic further configured to store a third algorithm and a fourth algorithm, and if an operation cycle count is equal to or less than a threshold value, the auxiliary operation is performed on the first and the second block regions using the first algorithm and the second algorithm respectively, and if the operation cycle count is greater than the threshold value, the auxiliary operation is performed on the first and the second block regions using a third algorithm and the fourth algorithm respectively,
   wherein the third algorithm and the fourth algorithm are determined to prevent a difference in operation speed of each block region caused from the increase of the operation cycle count.

14. The memory device of claim 1, wherein at least one of the first algorithm and the second algorithm is modified according to at least one of an operation cycle count or a data retention period.

15. A three-dimensional (3D) memory device including a memory cell array, the memory cell array including a plurality of memory blocks, each of the memory blocks including a plurality of memory cell strings, each of the memory cell strings including a pillar extending in a direction vertical to a substrate and a plurality of transistors stacked along the pillar,
   the memory device comprising:
   a first memory block having a first distance from a center of the memory cell array;
   a second memory block having a second distance from the center of the memory cell array; and a control logic configured to store a first algorithm and a second algorithm, the first algorithm and the second algorithm being associated with the first memory block and the second memory block respectively, and further configured to control a first operation on the first memory block using the first algorithm and a second operation on the second memory block using the second algorithm respectively, wherein the first algorithm and the second algorithm are different when the first distance and the second distance are different.

16. The memory device of claim 15, wherein the first operation and the second operation comprises basic operations and auxiliary operations respectively, the basic operations including at least one of a program operation, an erase operation, and a read operation, and the auxiliary operations including at least one of a pre-program operation, a post-program operation, a sub-block dividing operation, a count pulse program operation, a soft program operation, an off-string search operation, a read recovery operation using retention pre-defined table (PDT), and a read recovery operation using endurance pre-defined table (PDT).

17. The memory device of claim 16, wherein the pre-program operation is not included in the first algorithm and is included in the second algorithm when the first distance is shorter than the second distance.

18. The memory device of claim 16, wherein the post-program operation is not included in the first algorithm and is included in the second algorithm when the first distance is shorter than the second distance.

19. The memory device of claim 16, wherein the sub-block dividing operation is included in the first algorithm and is not included in the second algorithm when the first distance is shorter than the second distance.

20. The memory device of claim 16, wherein the count pulse program operation is not included in the first algorithm and is included in the second algorithm when the first distance is shorter than the second distance.

21. The memory device of claim 16, wherein the soft program operation is not included in the first algorithm and is included in the second algorithm when the first distance is shorter than the second distance.

22. The memory device of claim 16, wherein the off-string search operation is not included in the first algorithm and is included in the second algorithm when the first distance is shorter than the second distance.

23. The memory device of claim 16, wherein the read recovery operation using retention pre-defined table (PDT) is not included in the first algorithm and is included in the second algorithm when the first distance is shorter than the second distance.

24. The memory device of claim 16, wherein the read recovery operation using endurance pre-defined table (PDT) is included in the first algorithm and is not included in the second algorithm when the first distance is shorter than the second distance.

25. The memory device of claim 16, wherein the control logic further configured to store a third algorithm and a fourth algorithm, and if an operation cycle count is equal to or less than a threshold value, the auxiliary operation is performed on the first and the second memory blocks using the first algorithm and the second algorithm respectively, and if the operation cycle count is greater than the threshold value, the auxiliary operation is performed on the first memory block and the second memory block using the third algorithm and the fourth algorithm respectively, wherein the third algorithm and the fourth algorithm are determined to prevent a difference in operation speed of each memory block caused from the increase of the operation cycle count.

26. The memory device of claim 15, wherein at least one of the first algorithm and the second algorithm is modified according to at least one of an operation cycle count or a data retention period.

* * * * *